(12) United States Patent
Isobe et al.

(10) Patent No.: US 7,582,927 B2
(45) Date of Patent: Sep. 1, 2009

(54) FLASH EEPROM CELL AND METHOD OF FABRICATING THE SAME

(75) Inventors: Kazuaki Isobe, Yokohama (JP); Kanji Osari, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 226 days.

(21) Appl. No.: 11/553,251

(22) Filed: Oct. 26, 2006

(65) Prior Publication Data

US 2007/0097746 A1 May 3, 2007

(30) Foreign Application Priority Data

Oct. 27, 2005 (JP) .............................. 2005-313257

(51) Int. Cl.
*H01L 29/72* (2006.01)
(52) U.S. Cl. ...................... 257/314; 257/316; 257/369; 257/401
(58) Field of Classification Search ................. 257/314, 257/316, 369, 401
See application file for complete search history.

(56) References Cited

U.S. PATENT DOCUMENTS 5,404,038 A * 4/1995 Morihara .................... 257/329

2006/0278933 A1 * 12/2006 Endo .......................... 257/369

FOREIGN PATENT DOCUMENTS

| JP | 2001-15617 | * | 1/2001 |
| JP | 2002-176114 | * | 6/2002 |

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

A semiconductor device including a memory cell having a memory transistor and select gate transistor and a peripheral transistor is disclosed. The memory transistor has a stacked gate structure formed by sequentially stacking a gate insulating film, first gate electrode, inter-poly insulating film, and second gate electrode on a semiconductor substrate. The select gate transistor has a stacked gate structure identical to the memory transistor, and selects the memory transistor. The peripheral transistor forms a peripheral circuit of the memory cell, and has a gate electrode having a single-layer structure. A through hole reaching the first gate electrode is formed in the second gate electrode and inter-poly insulating film positioned on an element isolation film of the select gate transistor. A contact plug buried in this through hole electrically connects the second gate electrode and first gate electrode.

13 Claims, 41 Drawing Sheets

Memory transistor CT | Select gate transistor ST

Peripheral transistor PT

Memory transistor CT | Select gate transistor ST

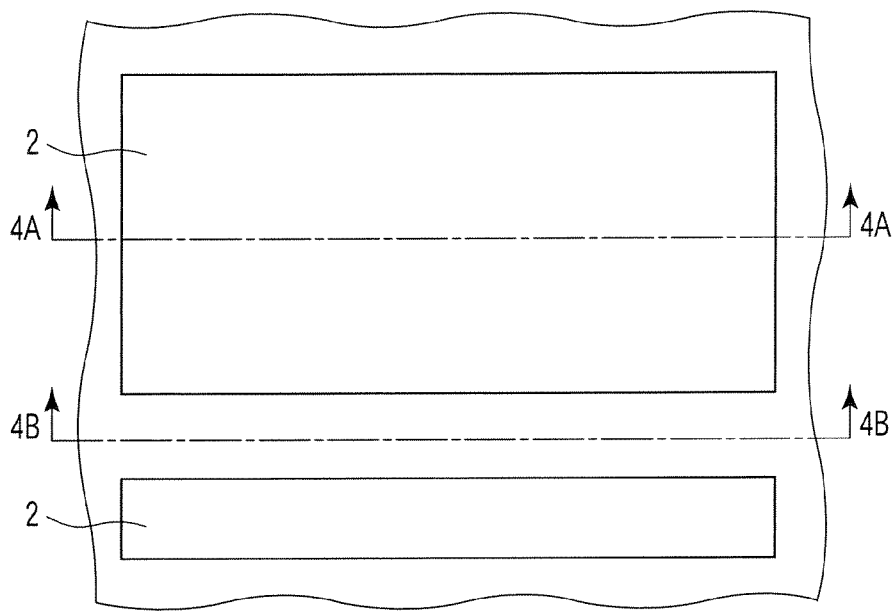
F I G. 3A
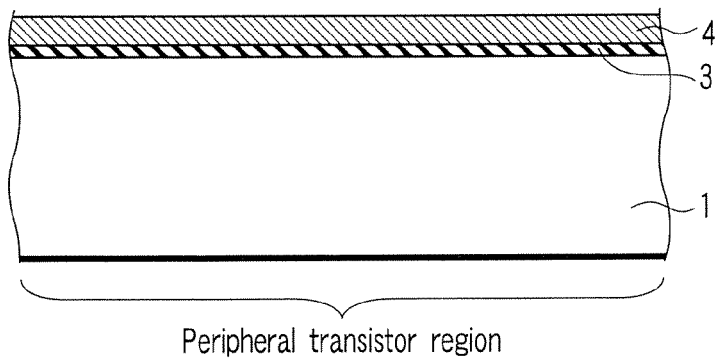
F I G. 3B
Peripheral transistor region
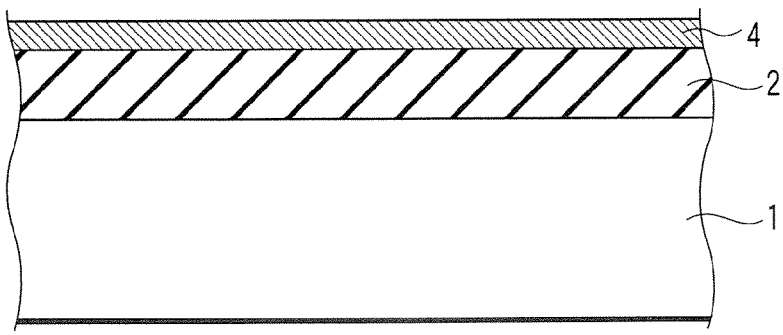
F I G. 4A
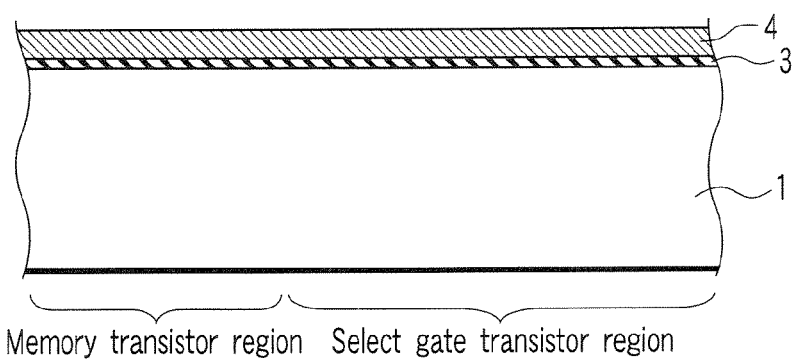
F I G. 4B
Memory transistor region | Select gate transistor region Peripheral transistor region Memory transistor region | Select gate transistor region Peripheral transistor region Memory transistor region   Select gate transistor region Peripheral transistor region Memory transistor region  Select gate transistor region

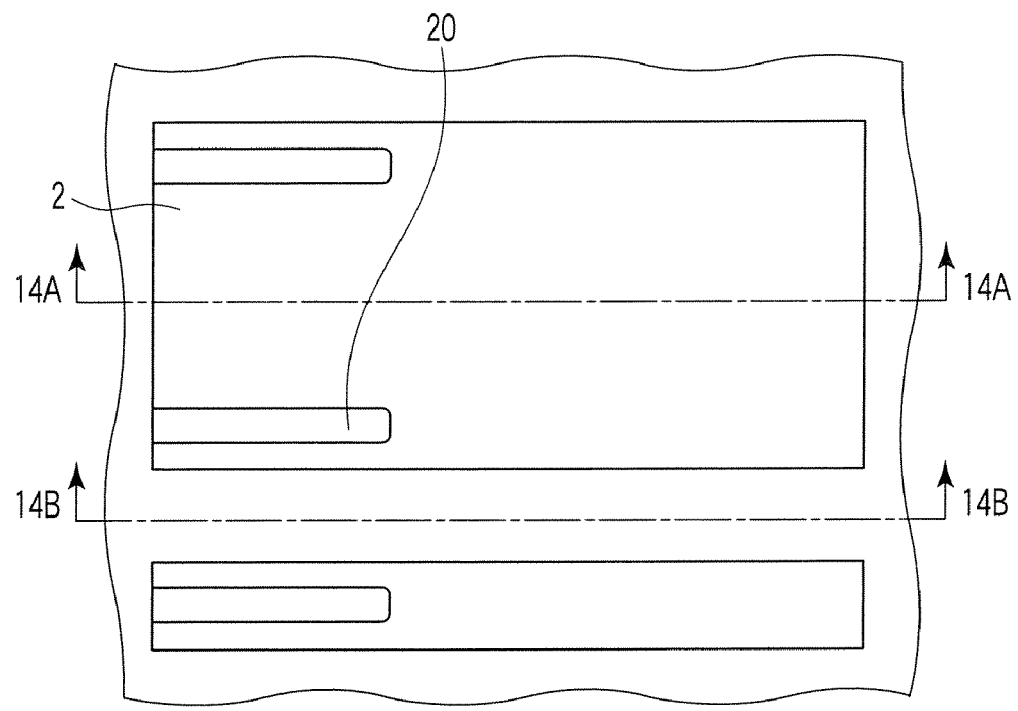
F I G. 13A
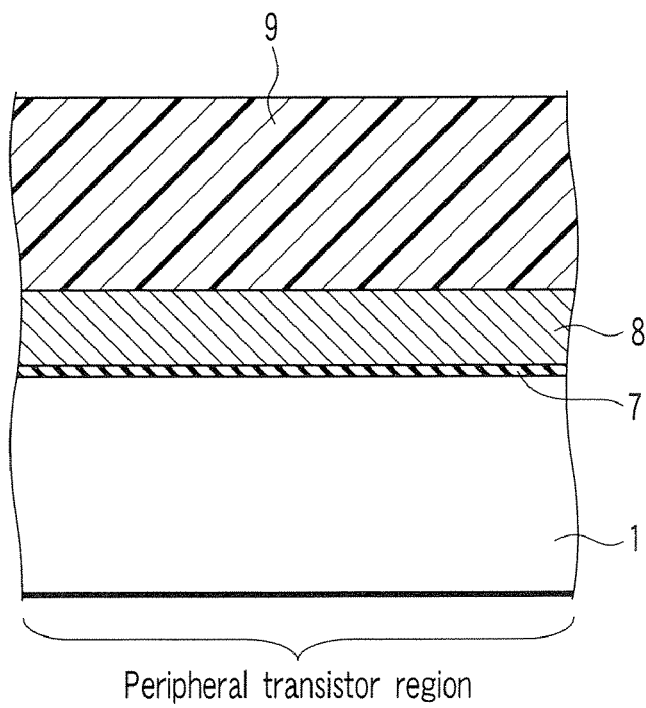
F I G. 13B

Memory transistor region   Select gate transistor region

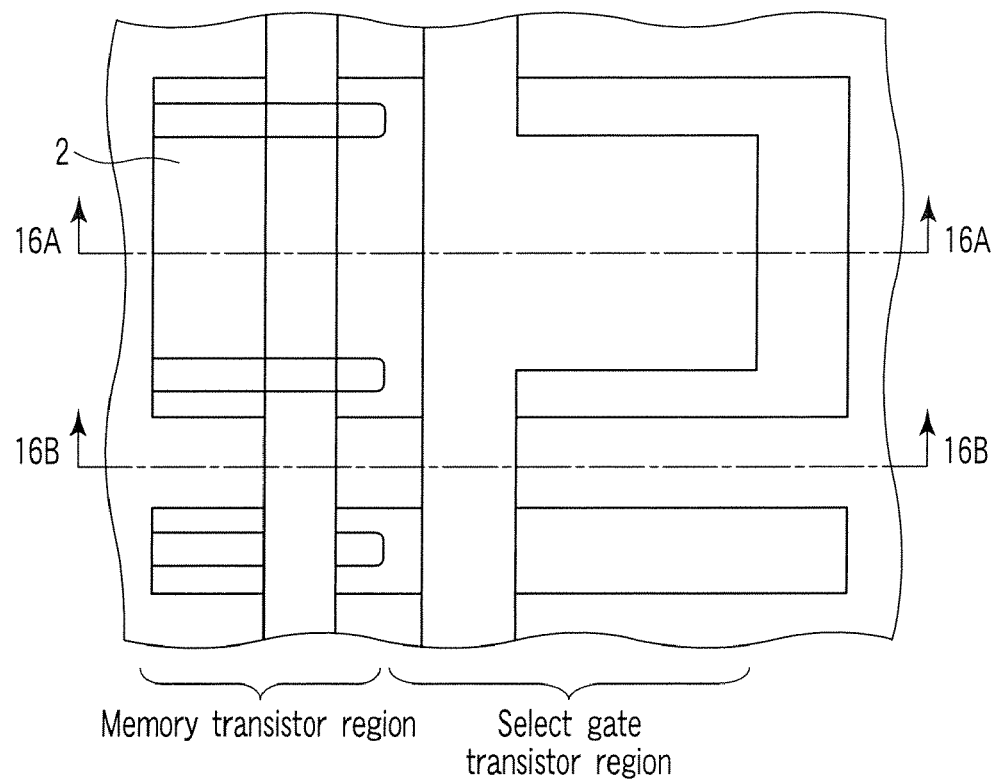
Memory transistor region | Select gate transistor region
F I G. 15A
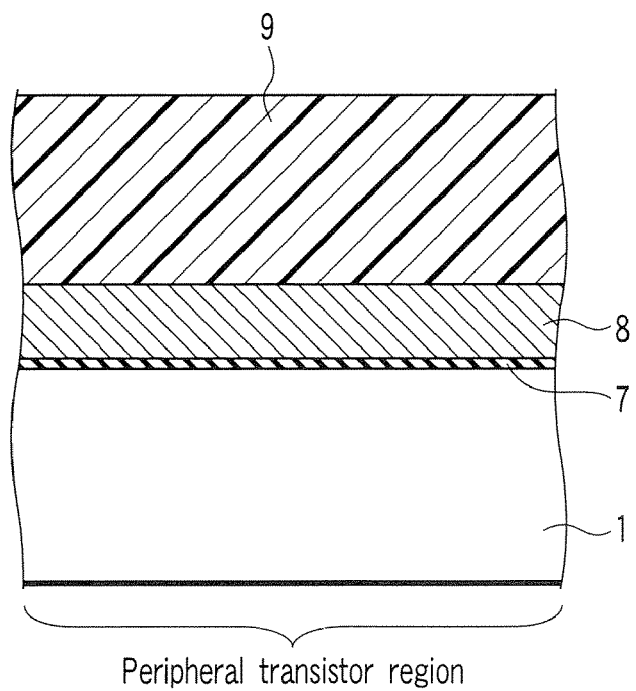
Peripheral transistor region
F I G. 15B Memory transistor region | Select gate transistor region Memory transistor region | Select gate transistor region

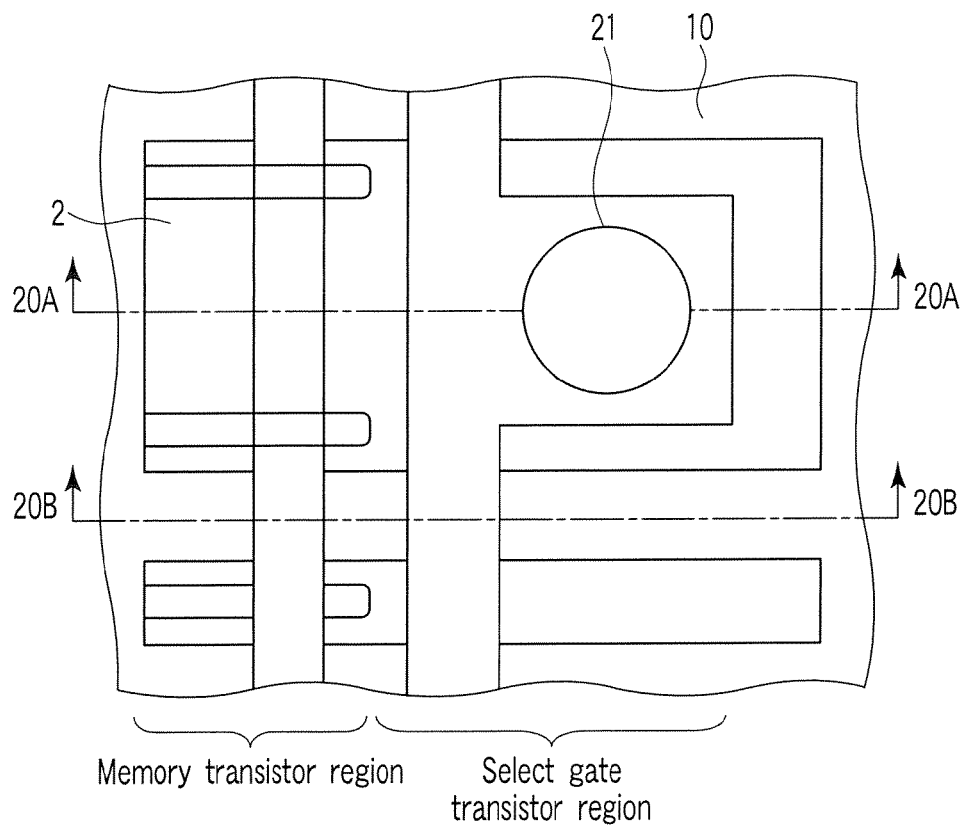
Memory transistor region | Select gate transistor region
F I G. 19A
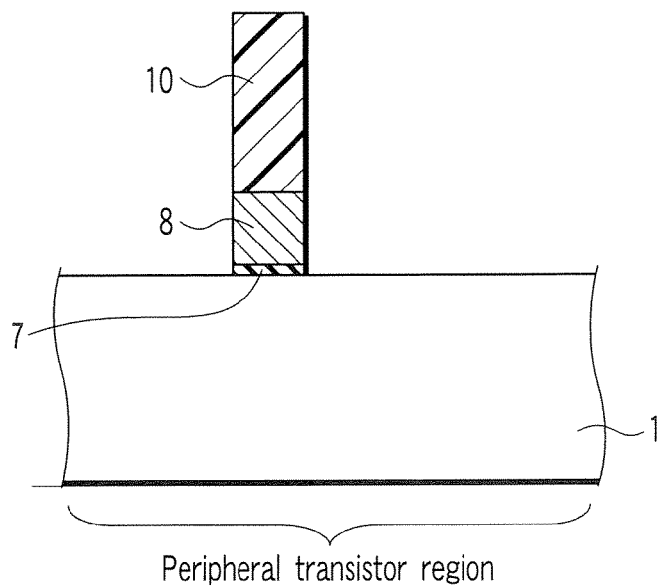
Peripheral transistor region
F I G. 19B

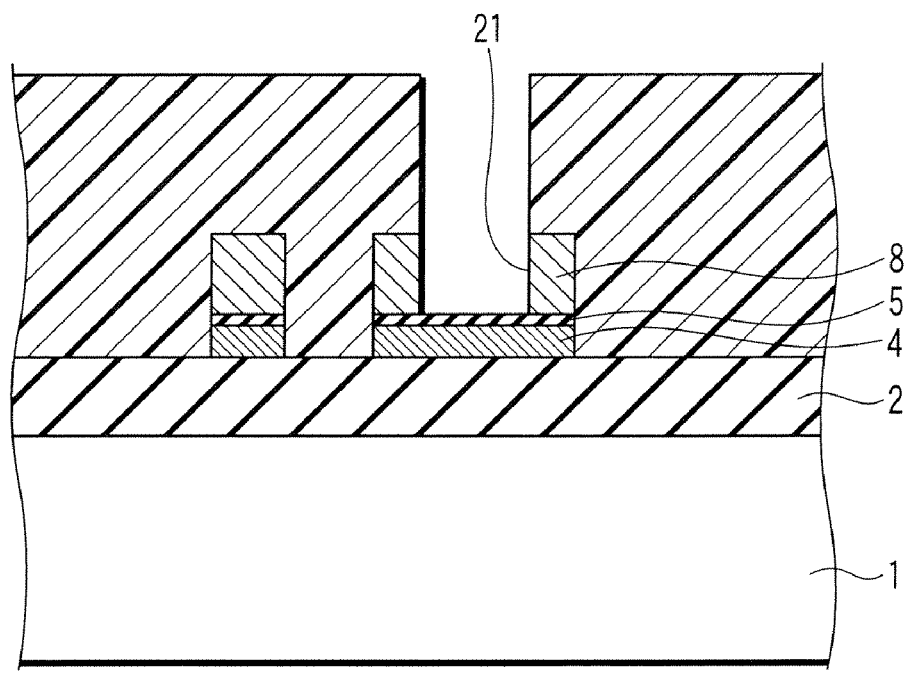
F I G. 20A
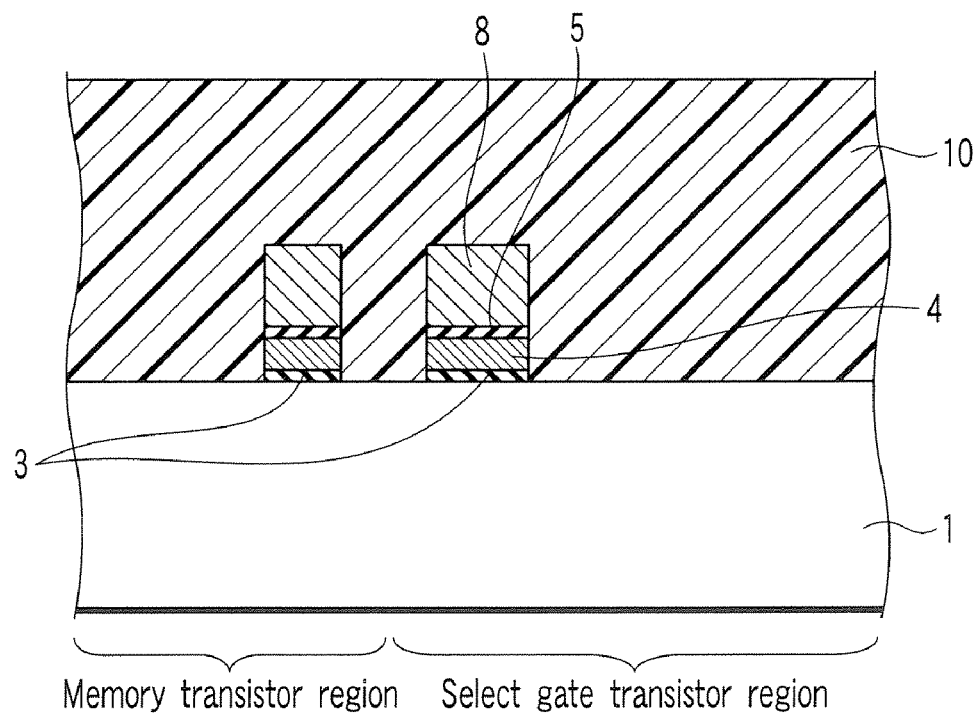
F I G. 20B

Memory transistor region | Select gate transistor region

Peripheral transistor region

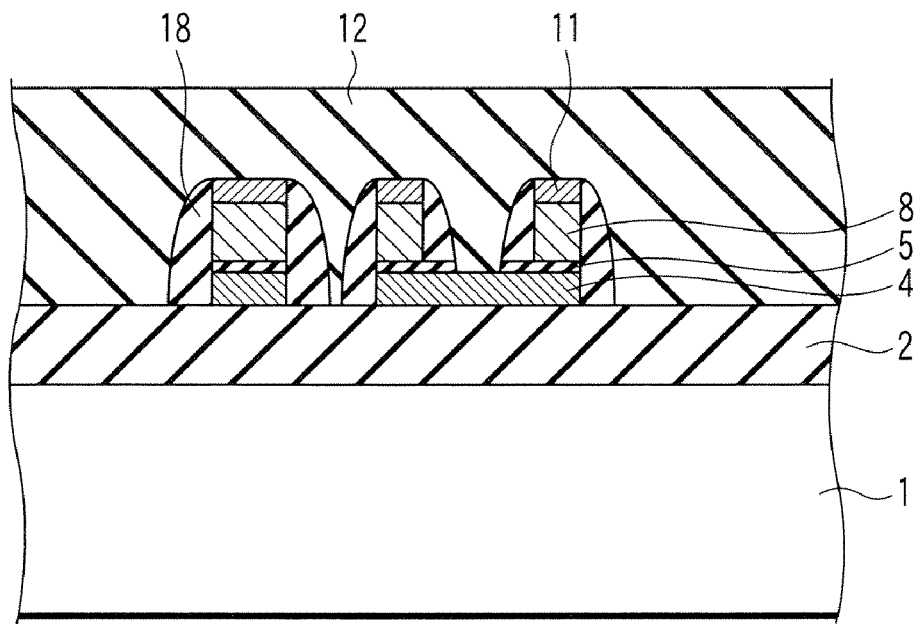
F I G. 22A
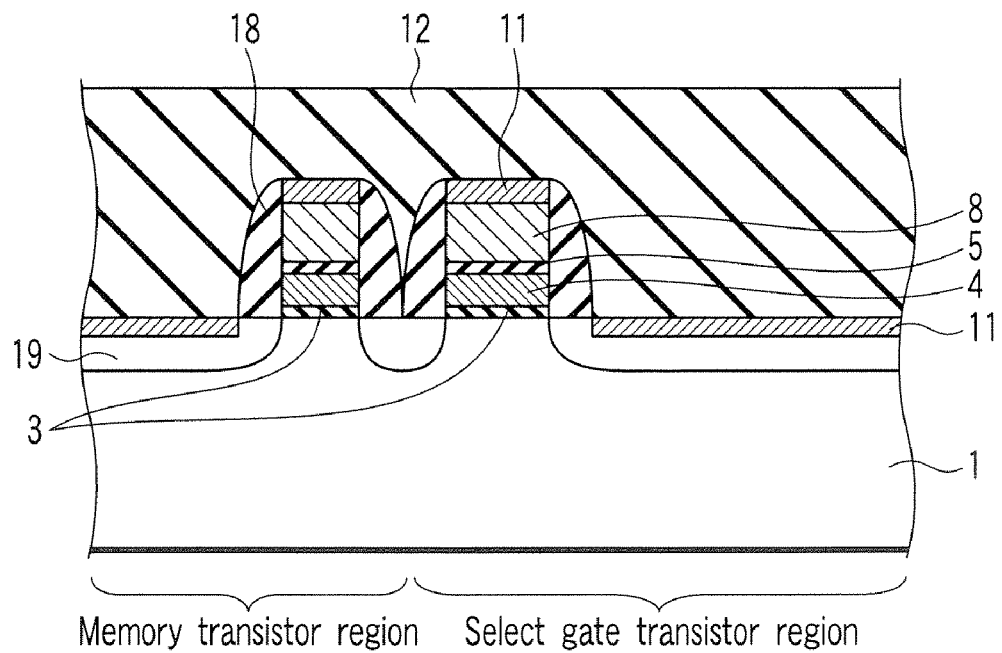
Memory transistor region  Select gate transistor region
F I G. 22B

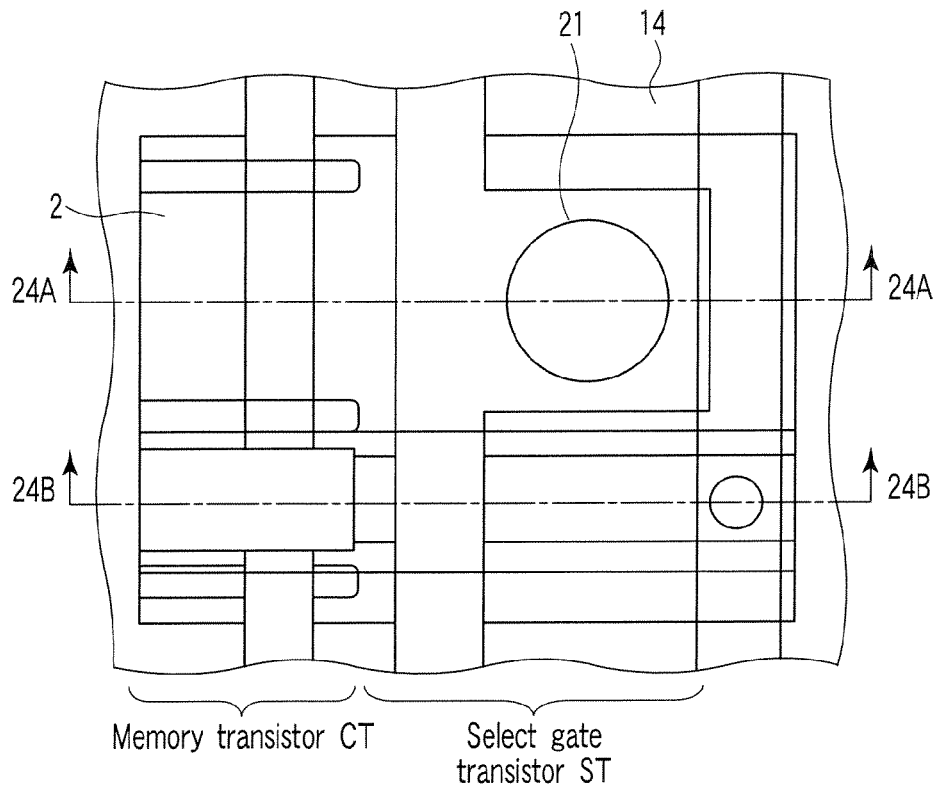
Memory transistor CT    Select gate transistor ST
F I G. 23A
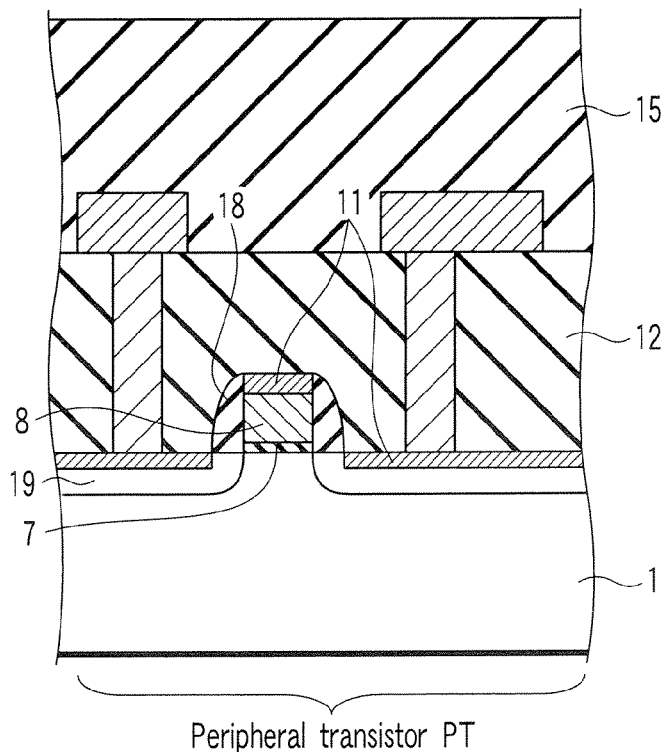
Peripheral transistor PT
F I G. 23B Memory transistor CT    Select gate transistor ST Peripheral transistor region Memory transistor region | Select gate transistor region

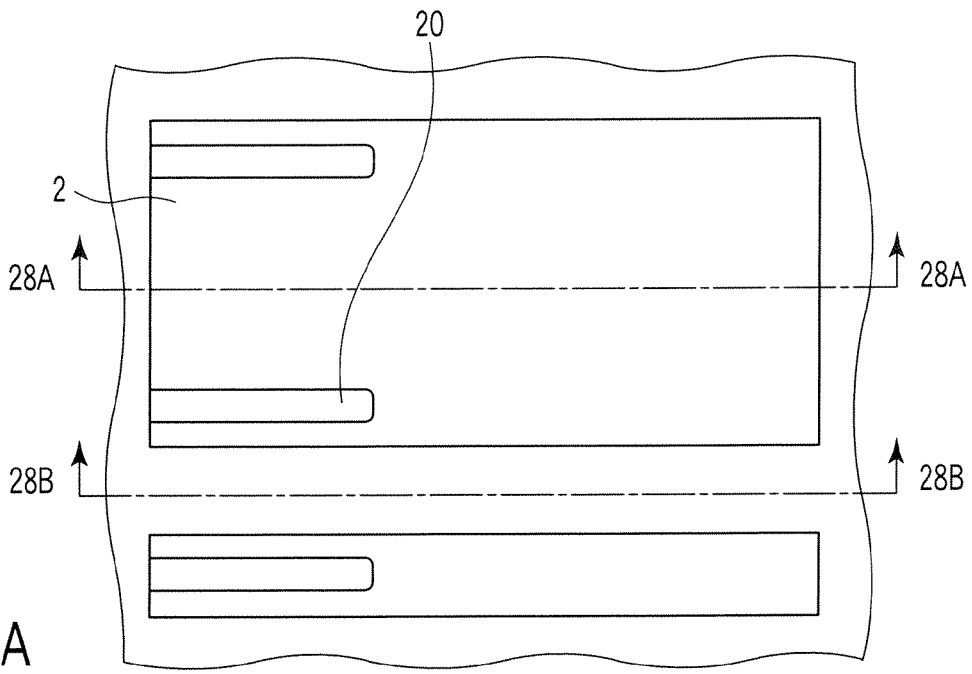
F I G. 27A
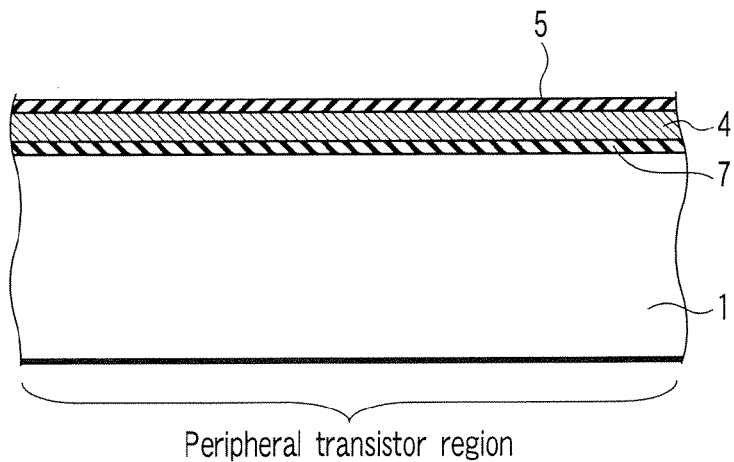
F I G. 27B
Peripheral transistor region
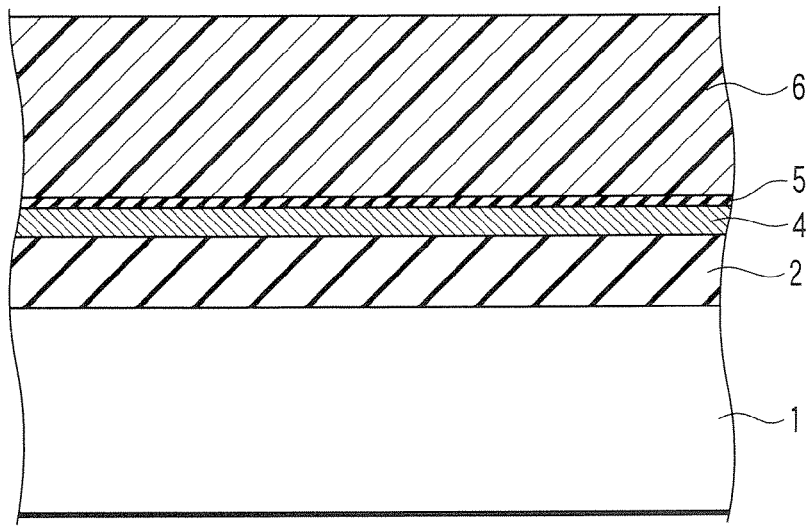
F I G. 28A Memory transistor region | Select gate transistor region Peripheral transistor region Memory transistor region   Select gate transistor region Peripheral transistor region Memory transistor region　Select gate transistor region Peripheral transistor region

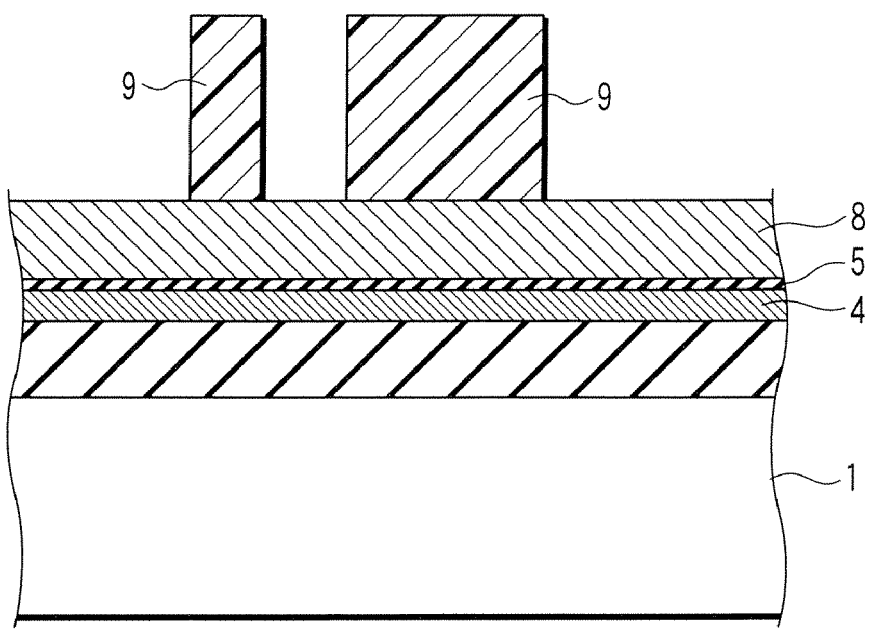
F I G. 36A
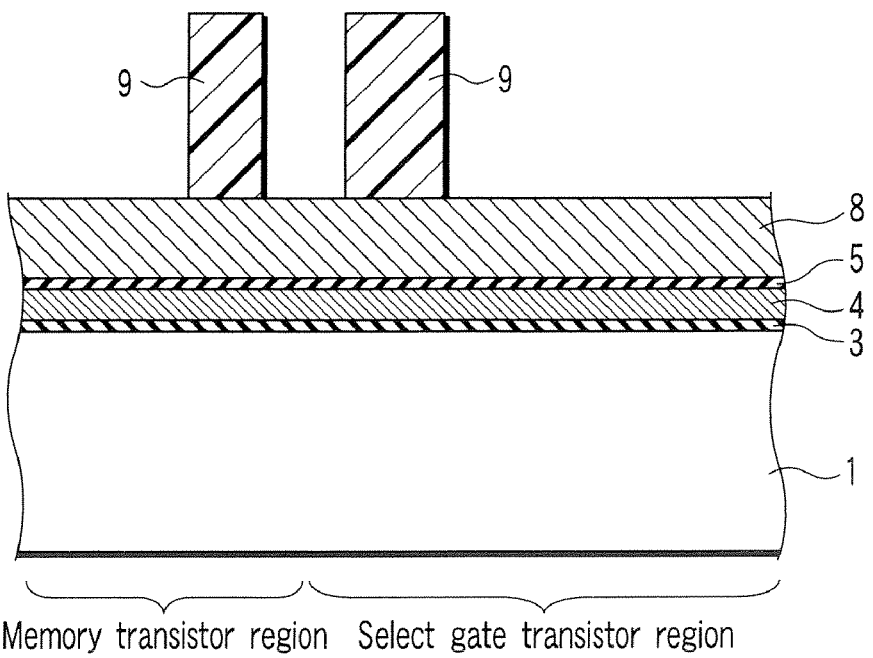
F I G. 36B

Memory transistor region | Select gate transistor region

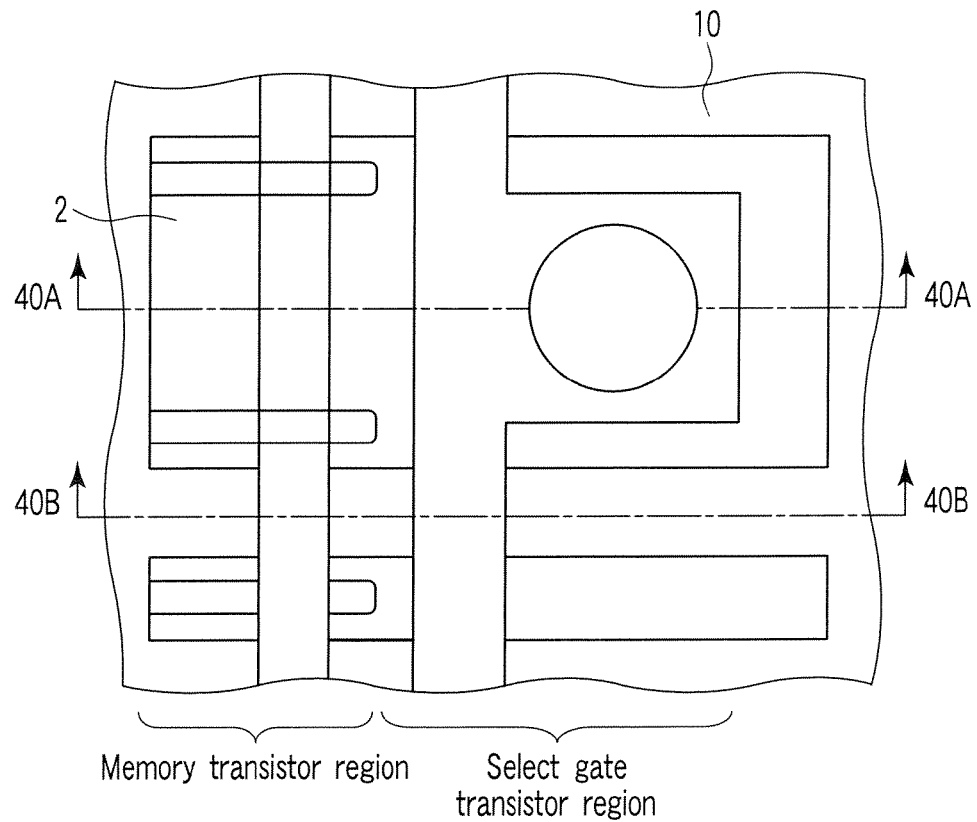
Memory transistor region | Select gate transistor region
F I G. 39A
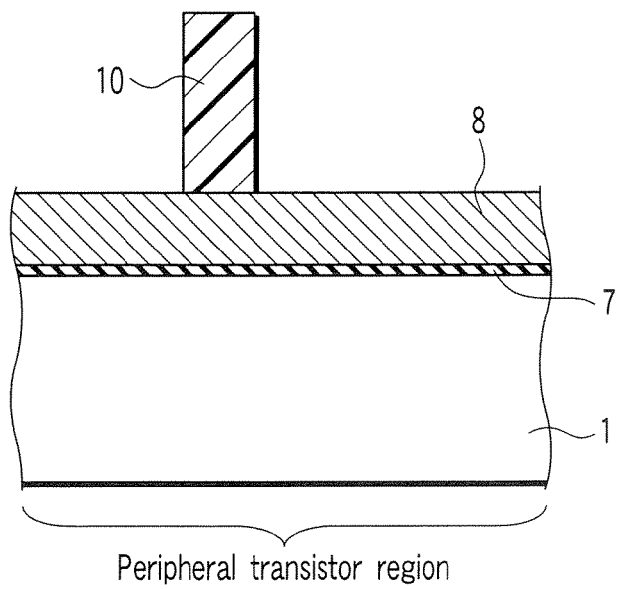
Peripheral transistor region
F I G. 39B

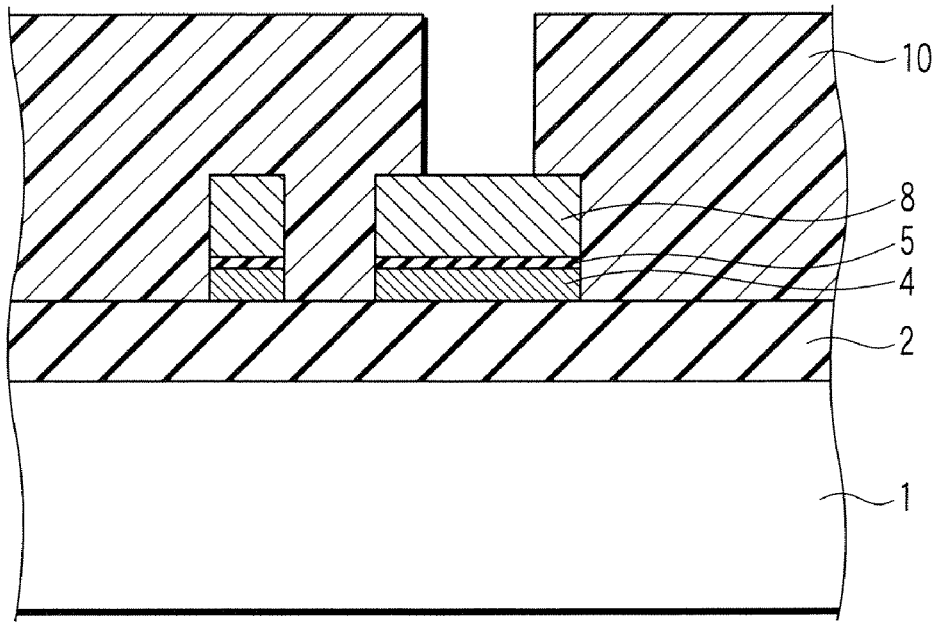
F I G. 40A
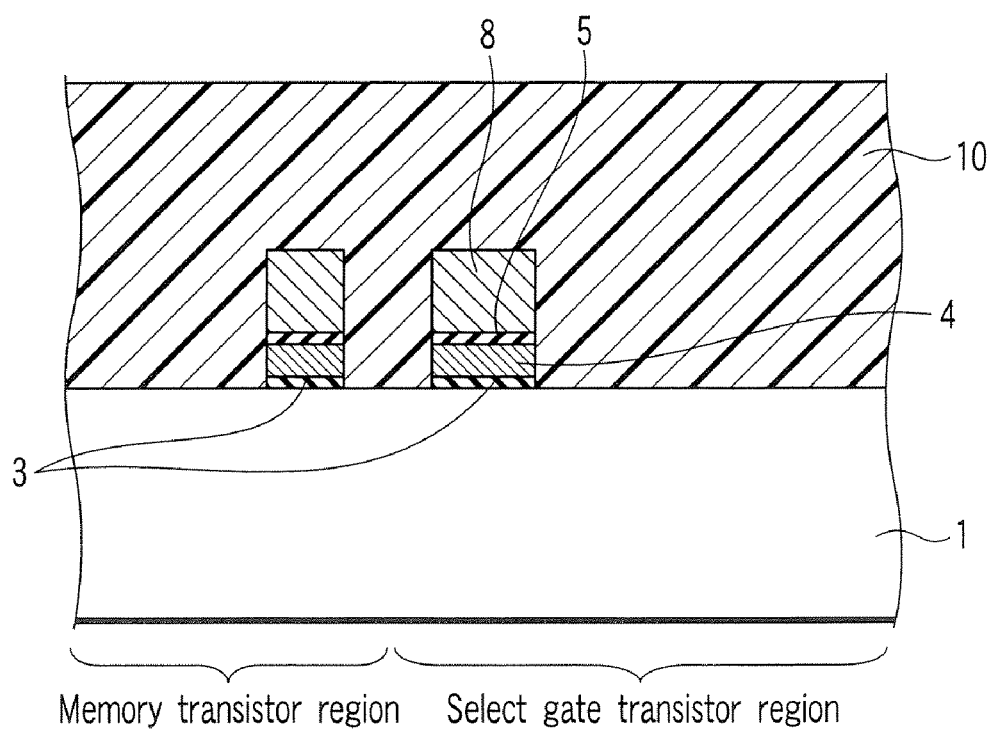
F I G. 40B

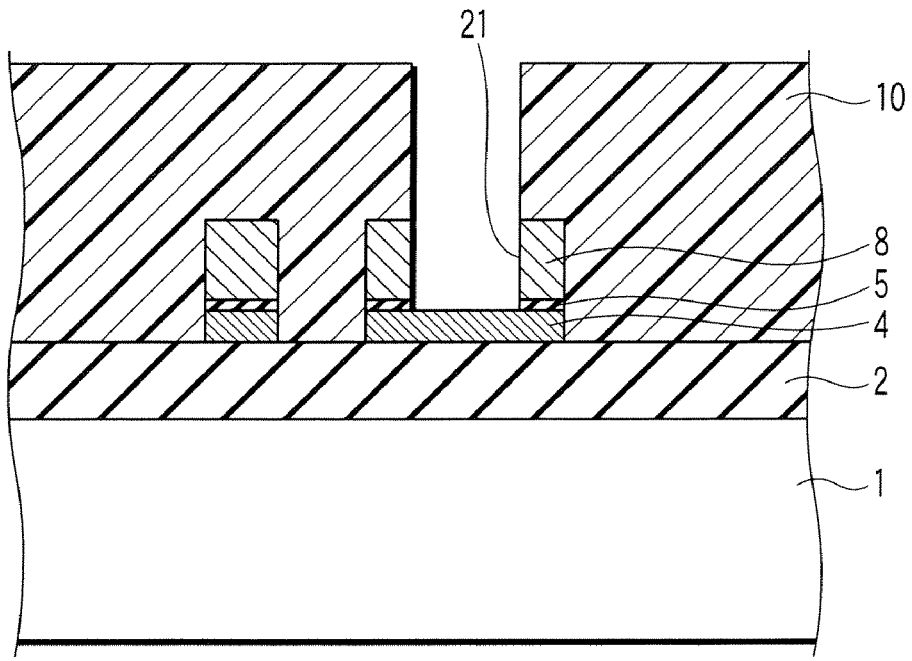
F I G. 42A
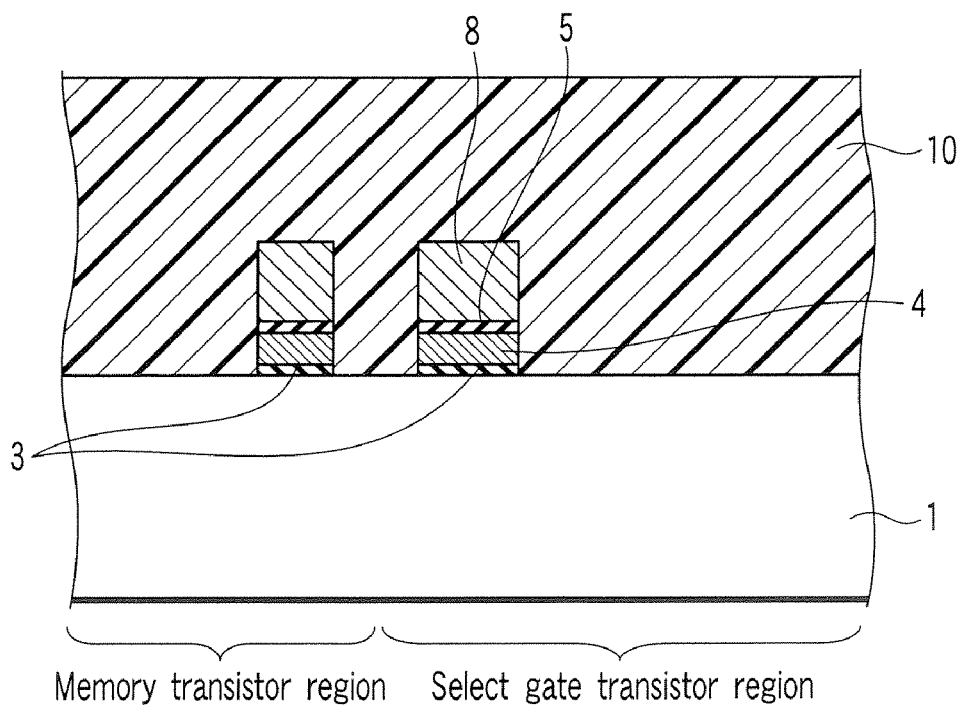
F I G. 42B

Memory transistor region    Select gate transistor region

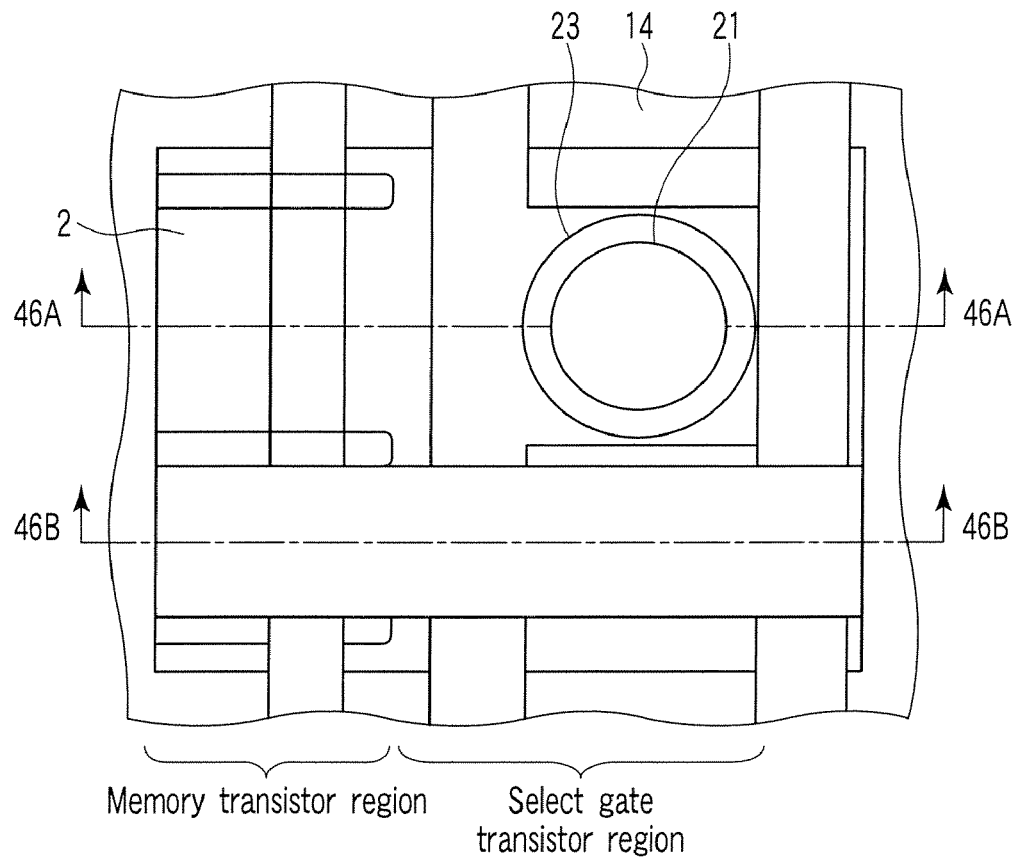
F I G. 45A
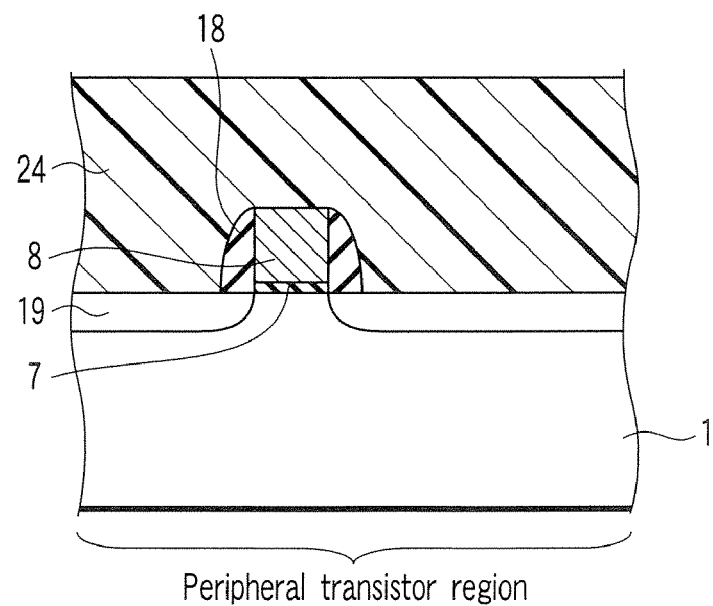
F I G. 45B

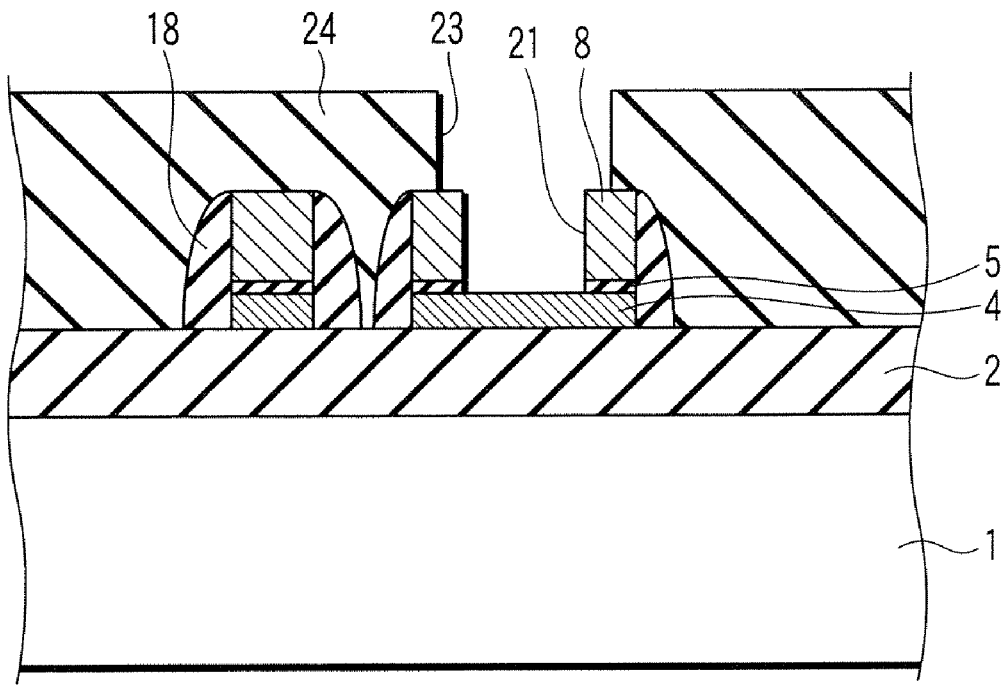
F I G. 46A
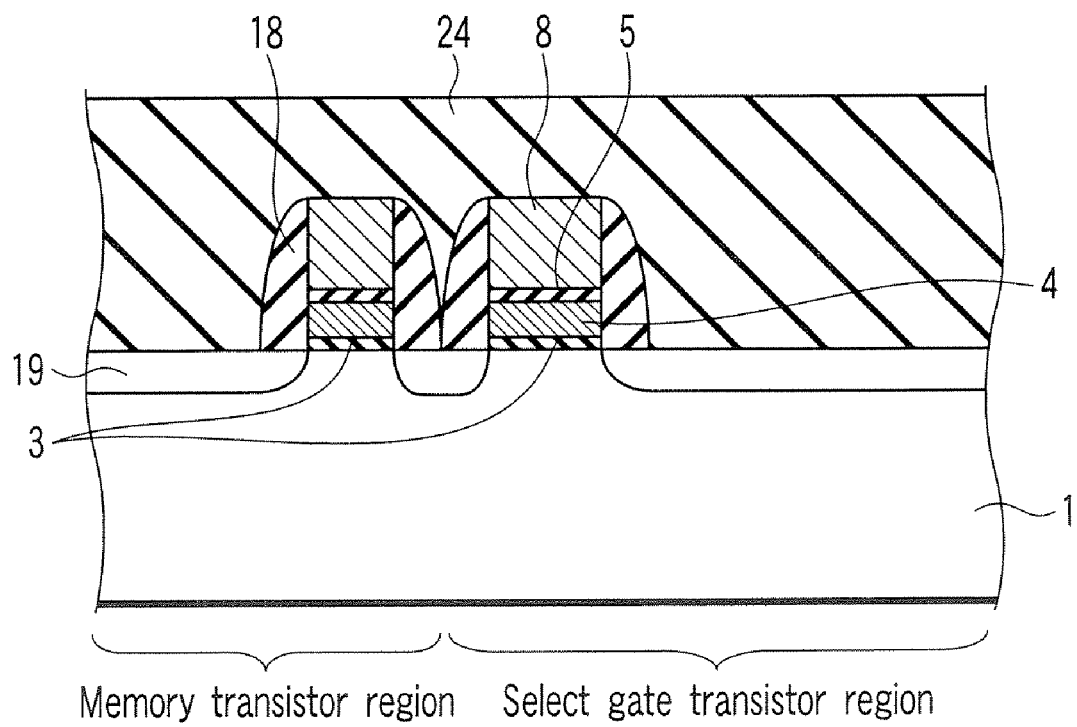
Memory transistor region | Select gate transistor region
F I G. 46B Memory transistor CT | Select gate transistor ST Peripheral transistor PT Memory transistor CT | Select gate transistor ST Memory transistor region | Select gate transistor region Peripheral transistor region

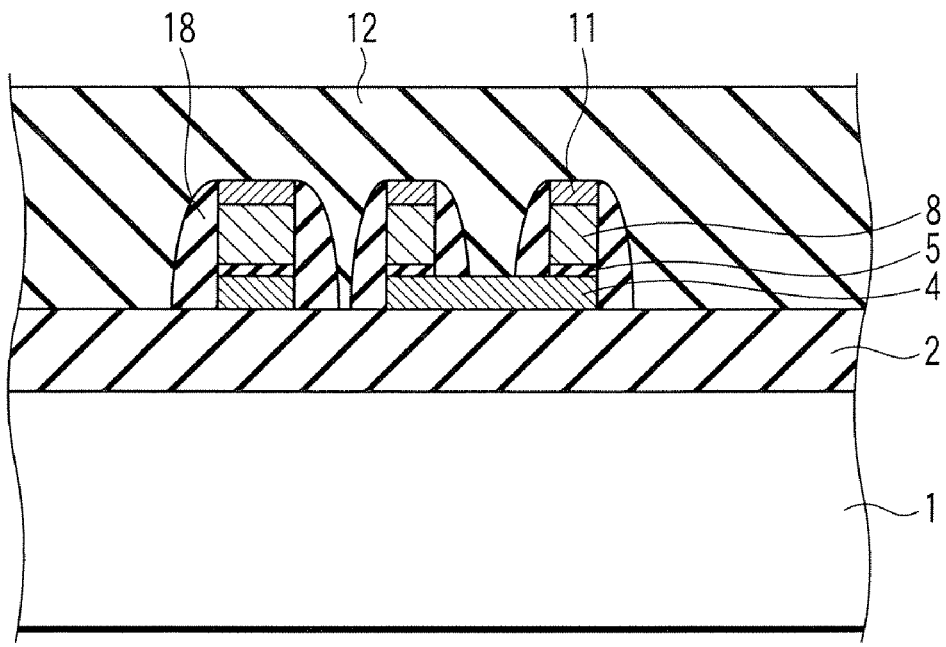
F I G. 50A
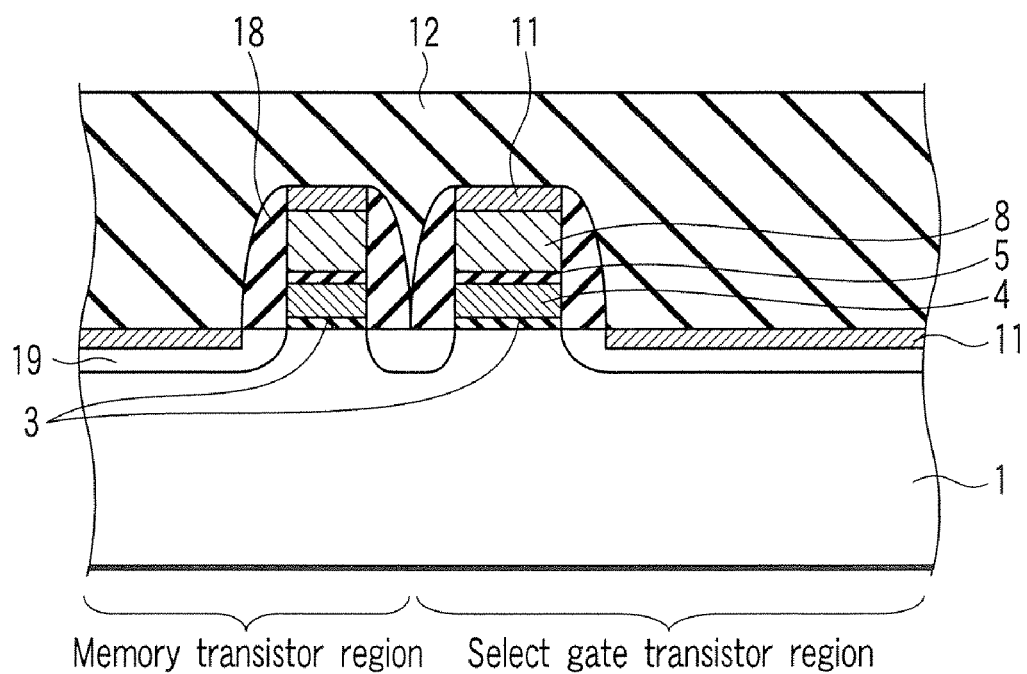
F I G. 50B

FLASH EEPROM CELL AND METHOD OF FABRICATING THE SAME

CROSS-REFERENCE TO RELATED APPLICATIONS

This application is based upon and claims the benefit of priority from prior Japanese Patent Application No. 2005-313257, filed Oct. 27, 2005, the entire contents of which are incorporated herein by reference.

BACKGROUND OF THE INVENTION

1. Field of the Invention

The present invention relates to a semiconductor device such as a nonvolatile memory represented by a flash EEPROM whose memory cell comprises a memory transistor and select gate transistor, or a nonvolatile memory embedded logic integrated circuit formed by integrating the nonvolatile memory and a logic circuit into one chip, and a method of fabricating the same.

2. Description of the Related Art

Jpn. Pat. Appln. KOKAI Publication No. 2002-176114 (patent reference 1) and Jpn. Pat. Appln. KOKAI Publication No. 2001-015617 (patent reference 2) describes a flash EEPROM whose memory cell comprises a memory transistor and select gate transistor. FIGS. 47(a) and 47(b) of patent reference 1 disclose an arrangement in which the gate electrode of each of a memory transistor (memory cell array region) and select gate transistor (select gate region) is formed by two polysilicon layers.

That is, each of the memory transistor and select gate transistor has a stacked gate structure formed by sequentially stacking a gate insulating film, first polysilicon layer, inter-poly insulating film, and second polysilicon layer on a semiconductor substrate. The first and second polysilicon layers of the memory transistor respectively function as a floating gate electrode and control gate electrode. A through hole is formed in the second polysilicon layer and inter-poly insulating film of the select gate transistor. An aluminum (Al) interconnection or the like formed on the second polysilicon layer connects to the first polysilicon layer through the through hole. To operate the memory transistor (to read, write, or erase data), a selection signal is applied to the gate electrode (first polysilicon layer) of the select gate transistor via the Al interconnection to turn on the select gate transistor, thereby selecting the memory transistor to be operated.

In the above arrangement, however, a space must be secured between the Al interconnection connected to the gate electrode of the select gate transistor and an Al interconnection which functions as a source line or bit line. Since this limits shrinking of memory cells, the area occupied by patterns increases, and this increases the cost.

Also, FIG. 3 of patent reference 1 and FIG. 2 of patent reference 2 disclose an arrangement in which the gate electrode of each of a memory transistor and select gate transistor is formed by two polysilicon layers, and a hole is formed in a inter-poly insulating film of the select gate transistor to form a contact between first and second polysilicon layers, thereby electrically connecting the first and second polysilicon layers. The gate electrodes of the memory transistor and select gate transistor are formed in the same fabrication steps. When forming the contact, therefore, after the second polysilicon layer is formed, the pattern of a contact hole is transferred by lithography onto that portion of a photoresist coated on the second polysilicon layer, which corresponds to the gate electrode of the select gate transistor, and the surface of the first polysilicon layer is exposed by sequentially etching the second polysilicon layer and inter-poly insulating film by RIE. After that, CVD is used to deposit polysilicon on the second polysilicon layer and on the first polysilicon layer exposed in the contact hole, thereby forming a contact portion which electrically connects the first and second polysilicon layers.

The arrangement and fabrication method as described above obviate the need for an Al interconnection or contact for backing the polysilicon layers, and can increase the degree of freedom of the layout of, e.g., source lines and bit lines, thereby shrinking memory cells.

Unfortunately, if another (third) polysilicon layer is deposited to form the contact portion for the first and second polysilicon layers as described above, the contact resistance between the polysilicon layers rises (to, e.g., about 400 Ω), and this increases the parasitic resistance of the gate electrode of the select gate transistor. In addition, the above fabrication method requires the lithography step of forming the hole in the inter-poly insulating film, and the step of additionally stacking the third polysilicon layer. This increases the fabrication cost by the cause different from the prior art described earlier.

BRIEF SUMMARY OF THE INVENTION

According to an aspect of the present invention, there is provided a semiconductor device comprising a memory transistor having a stacked gate structure formed by sequentially stacking a gate insulating film, a first gate electrode, a inter-poly insulating film, and a second gate electrode on a semiconductor substrate, a select gate transistor which has a stacked gate structure identical to the memory transistor, and selects the memory transistor, a first contact plug buried in a through hole and electrically connecting the second gate electrode and the first gate electrode, the through hole is formed in the second gate electrode and the inter-poly insulating film positioned on an element isolation film in the select gate transistor, and reaching the first gate electrode, and a peripheral transistor which forms a peripheral circuit of a memory cell including the memory transistor and the select gate transistor, and includes a gate electrode with a single-layer structure.

According to another aspect of the present invention, there is provided a semiconductor device comprising a memory transistor having a stacked gate structure formed by sequentially stacking a gate insulating film, a first gate electrode, a inter-poly insulating film, and a second gate electrode on a semiconductor substrate, a select gate transistor which has a stacked gate structure identical to the memory transistor, and selects the memory transistor, a first silicide layer formed on an upper surface of the second gate electrode, on sidewalls of a through hole, and on the first gate electrode positioned in a bottom portion of the through hole, and electrically connecting the second gate electrode and the first gate electrode, the through hole is formed in the second gate electrode and the inter-poly insulating film positioned on an element isolation film in the select gate transistor, and reaching the first gate electrode, and a peripheral transistor which forms a peripheral circuit of a memory cell comprising the memory transistor and the select gate transistor, and includes a gate electrode with a single-layer structure.

According to still another aspect of the present invention, there is provided a semiconductor device fabrication method comprising sequentially stacking a first insulating film, a first conductive layer, a second insulating film, and a second conductive layer on a major surface of a memory cell portion of a semiconductor substrate, and stacking a third insulating film and a third conductive layer on a major surface of a peripheral transistor region of the semiconductor substrate, patterning the first insulating film, the first conductive layer, the second insulating film, and the second conductive layer by masking the peripheral transistor region, thereby forming a gate insulating film, first gate electrode, inter-poly insulating film, and second gate electrode of each of a memory transistor and a select gate transistor, simultaneously etching the third conductive layer and third insulating film of the peripheral transistor, and the second gate electrode in a region positioned on an element isolation film of the select gate transistor, thereby forming a gate electrode and gate insulating film of the peripheral transistor, and forming a through hole reaching the first gate electrode in the select gate transistor, doping an impurity into a major surface region of the semiconductor substrate to form a source region and drain region of each of the memory transistor, the select gate transistor, and the peripheral transistor, forming sidewall spacers on side surfaces of a gate electrode of each of the memory transistor, the select gate transistor, and the peripheral transistor, and simultaneously etching the inter-poly insulating film in a region in which the through hole reaching the first gate electrode is formed in the select gate transistor, forming a contact plug in the through hole, forming a metal layer on an entire surface by sputtering, and selectively siliciding the metal layer on exposed surfaces of the gate electrode and the semiconductor substrate by annealing.

According to still another aspect of the present invention, there is provided a semiconductor device fabrication method comprising sequentially stacking a first insulating film, a first conductive layer, a second insulating film, and a second conductive layer on a major surface of a memory cell portion of a semiconductor substrate, and stacking a third insulating film and a third conductive layer on a major surface of a peripheral transistor region of the semiconductor substrate, patterning the first insulating film, the first conductive layer, the second insulating film, and the second conductive layer by masking the peripheral transistor region, thereby forming a gate insulating film, first gate electrode, inter-poly insulating film, and second gate electrode of each of a memory transistor and a select gate transistor, simultaneously etching the third conductive layer and third insulating film of the peripheral transistor, and the second gate electrode in a region positioned on an element isolation film of the select gate transistor, thereby forming a gate electrode and gate insulating film of the peripheral transistor, and forming a through hole reaching the first gate electrode in the select gate transistor, doping an impurity into a major surface region of the semiconductor substrate to form a source region and drain region of each of the memory transistor, the select gate transistor, and the peripheral transistor, forming sidewall spacers on side surfaces of a gate electrode of each of the memory transistor, the select gate transistor, and the peripheral transistor, and simultaneously etching the inter-poly insulating film in a region in which the through hole reaching the first gate electrode is formed in the select gate transistor, removing the sidewall spacers in the through hole and the inter-poly insulating film of the select gate transistor, forming a metal layer on an entire surface by sputtering, and selectively siliciding the metal layer on exposed surfaces of the gate electrode and the semiconductor substrate by annealing.

BRIEF DESCRIPTION OF THE SEVERAL VIEWS OF THE DRAWING

FIG. 3A is a plan view for explaining a semiconductor device fabrication method according to the first embodiment of the present invention, which shows the pattern of a memory cell portion in the first fabrication step by taking a flash EEPROM as an example;

FIG. 3B is a sectional view for explaining the semiconductor device fabrication method according to the first embodiment of the present invention, which shows a peripheral transistor region in the first fabrication step by taking a flash EEPROM as an example;

FIG. 4A is a sectional view for explaining the semiconductor device fabrication method according to the first embodiment of the present invention, which is taken along a line 4A-4A in FIG. 3A and shows the first fabrication step by taking a flash EEPROM as an example;

FIG. 4B is a sectional view for explaining the semiconductor device fabrication method according to the first embodiment of the present invention, which is taken along a line 4B-4B in FIG. 3A and shows the first fabrication step by taking a flash EEPROM as an example;

FIG. 13A is a plan view for explaining the semiconductor device fabrication method according to the first embodiment of the present invention, which shows the pattern of the memory cell portion in the sixth fabrication step by taking a flash EEPROM as an example;

FIG. 13B is a sectional view for explaining the semiconductor device fabrication method according to the first embodiment of the present invention, which shows the peripheral transistor region in the sixth fabrication step by taking a flash EEPROM as an example;

FIG. 15A is a plan view for explaining the semiconductor device fabrication method according to the first embodiment of the present invention, which shows the pattern of the memory cell portion in the seventh fabrication step by taking a flash EEPROM as an example;

FIG. 15B is a sectional view for explaining the semiconductor device fabrication method according to the first embodiment of the present invention, which shows the peripheral transistor region in the seventh fabrication step by taking a flash EEPROM as an example;

FIG. 19A is a plan view for explaining the semiconductor device fabrication method according to the first embodiment of the present invention, which shows the pattern of the memory cell portion in the ninth fabrication step by taking a flash EEPROM as an example;

FIG. 19B is a sectional view for explaining the semiconductor device fabrication method according to the first embodiment of the present invention, which shows the peripheral transistor region in the ninth fabrication step by taking a flash EEPROM as an example;

FIG. 20A is a sectional view for explaining the semiconductor device fabrication method according to the first embodiment of the present invention, which is taken along a line 20A-20A in FIG. 19A and shows the ninth fabrication step by taking a flash EEPROM as an example;

FIG. 20B is a sectional view for explaining the semiconductor device fabrication method according to the first embodiment of the present invention, which is taken along a line 20B-20B in FIG. 19A and shows the ninth fabrication step by taking a flash EEPROM as an example;

FIG. 22A is a sectional view for explaining the semiconductor device fabrication method according to the first embodiment of the present invention, which is taken along a line 22A-22A in FIG. 21A and shows the 10th fabrication step by taking a flash EEPROM as an example;

FIG. 22B is a sectional view for explaining the semiconductor device fabrication method according to the first embodiment of the present invention, which is taken along a line 22B-22B in FIG. 21A and shows the 10th fabrication step by taking a flash EEPROM as an example;

FIG. 23A is a plan view for explaining a semiconductor device according to the second embodiment of the present invention by taking a flash EEPROM as an example, which shows the pattern of a memory cell portion;

FIG. 23B is a sectional view for explaining the semiconductor device according to the second embodiment of the present invention by taking a flash EEPROM as an example, which shows a peripheral transistor;

FIG. 27A is a plan view for explaining the semiconductor device fabrication method according to the second embodiment of the present invention, which shows the pattern of the memory cell portion in the second fabrication step by taking a flash EEPROM as an example;

FIG. 27B is a sectional view for explaining the semiconductor device fabrication method according to the second embodiment of the present invention, which shows the peripheral transistor region in the second fabrication step by taking a flash EEPROM as an example;

FIG. 28A is a sectional view for explaining the semiconductor device fabrication method according to the second embodiment of the present invention, which is taken along a line 28A-28A in FIG. 27A and shows the second fabrication step by taking a flash EEPROM as an example;

FIG. 36A is a sectional view for explaining the semiconductor device fabrication method according to the second embodiment of the present invention, which is taken along a line 36A-36A in FIG. 35A and shows the sixth fabrication step by taking a flash EEPROM as an example;

FIG. 36B is a sectional view for explaining the semiconductor device fabrication method according to the second embodiment of the present invention, which is taken along a line 36B-36B in FIG. 35A and shows the sixth fabrication step by taking a flash EEPROM as an example;

FIG. 39A is a plan view for explaining the semiconductor device fabrication method according to the second embodiment of the present invention, which shows the pattern of the memory cell portion in the eighth fabrication step by taking a flash EEPROM as an example;

FIG. 39B is a sectional view for explaining the semiconductor device fabrication method according to the second embodiment of the present invention, which shows the peripheral transistor region in the eighth fabrication step by taking a flash EEPROM as an example;

FIG. 40A is a sectional view for explaining the semiconductor device fabrication method according to the second embodiment of the present invention, which is taken along a line 40A-40A in FIG. 39A and shows the eighth fabrication step by taking a flash EEPROM as an example;

FIG. 40B is a sectional view for explaining the semiconductor device fabrication method according to the second embodiment of the present invention, which is taken along a line 40B-40B in FIG. 39A and shows the eighth fabrication step by taking a flash EEPROM as an example;

FIG. 42A is a sectional view for explaining the semiconductor device fabrication method according to the second embodiment of the present invention, which is taken along a line 42A-42A in FIG. 41A and shows the ninth fabrication step by taking a flash EEPROM as an example;

FIG. 42B is a sectional view for explaining the semiconductor device fabrication method according to the second embodiment of the present invention, which is taken along a line 42B-42B in FIG. 41A and shows the ninth fabrication step by taking a flash EEPROM as an example;

FIG. 45A is a plan view for explaining the semiconductor device fabrication method according to the second embodiment of the present invention, which shows the pattern of the memory cell portion in the 11th fabrication step by taking a flash EEPROM as an example;

FIG. 45B is a sectional view for explaining the semiconductor device fabrication method according to the second embodiment of the present invention, which shows the peripheral transistor region in the 11th fabrication step by taking a flash EEPROM as an example;

FIG. 46A is a sectional view for explaining the semiconductor device fabrication method according to the second embodiment of the present invention, which is taken along a line 46A-46A in FIG. 45A and shows the 11th fabrication step by taking a flash EEPROM as an example;

FIG. 46B is a sectional view for explaining the semiconductor device fabrication method according to the second embodiment of the present invention, which is taken along a line 46B-46B in FIG. 45A and shows the 11th fabrication step by taking a flash EEPROM as an example;

FIG. 50A is a sectional view for explaining the semiconductor device fabrication method according to the second embodiment of the present invention, which is taken along a line 50A-50A in FIG. 49A and shows the 13th fabrication step by taking a flash EEPROM as an example; and FIG. 50B is a sectional view for explaining the semiconductor device fabrication method according to the second embodiment of the present invention, which is taken along a line 50B-50B in FIG. 49A and shows the 13th fabrication step by taking a flash EEPROM as an example.

DETAILED DESCRIPTION OF THE INVENTION

First Embodiment

Figure 1A:
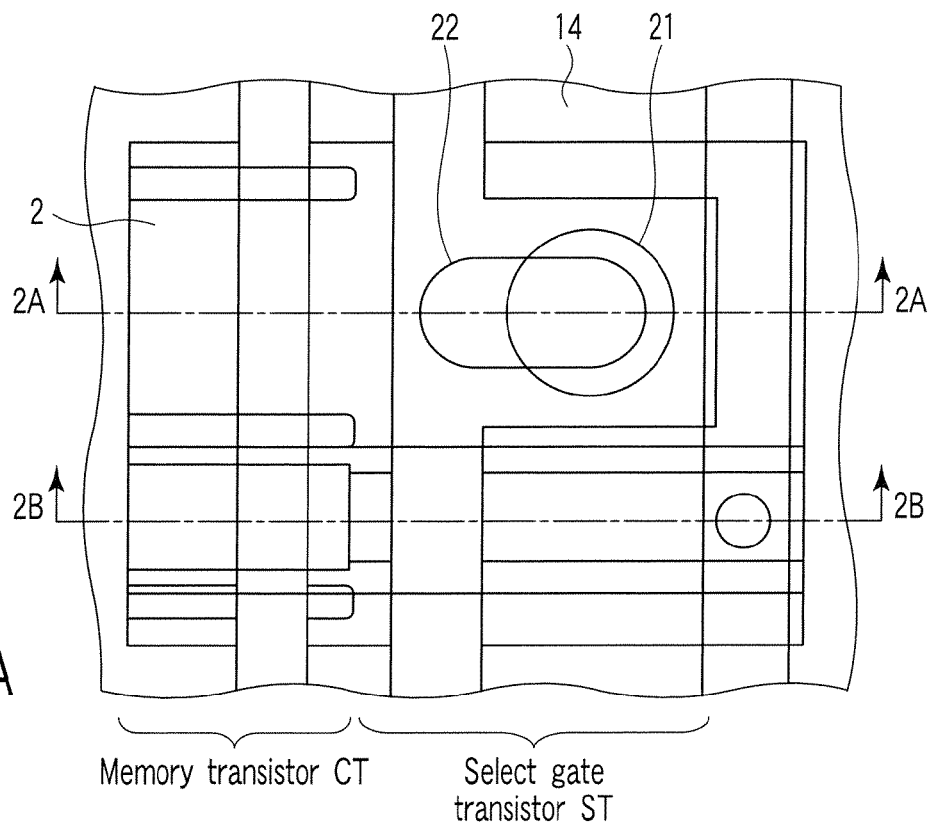
FIG. 1A is a plan view for explaining a semiconductor device according to the first embodiment of the present invention by taking a flash EEPROM as an example, which shows the pattern of a memory cell j
Figure 1B:
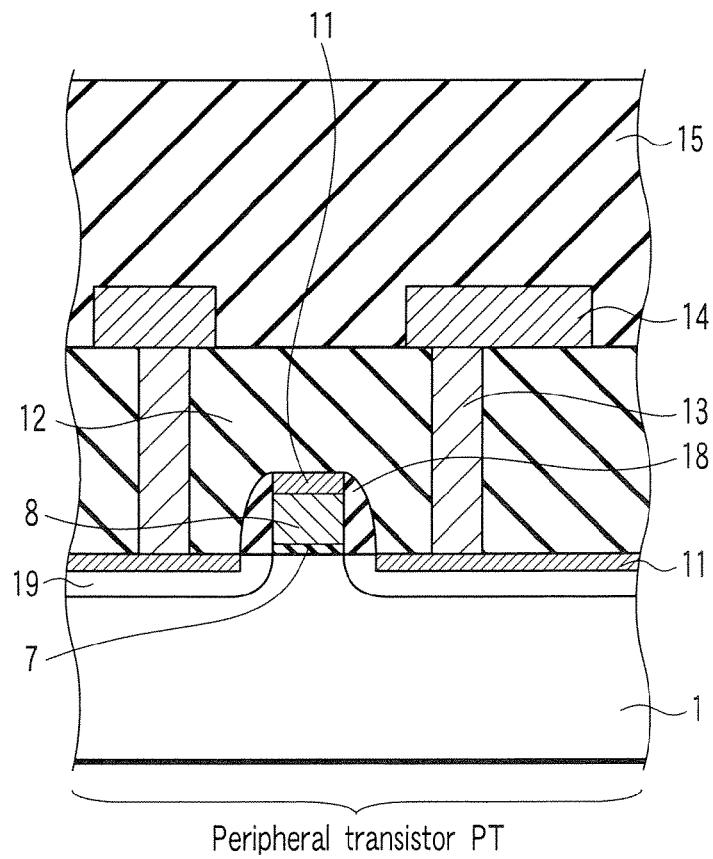
FIG. 1B is a sectional view for explaining the semiconductor device according to the first embodiment of the present invention by taking a flash EEPROM as an example, which shows a peripheral transistor.
Figure 2A:
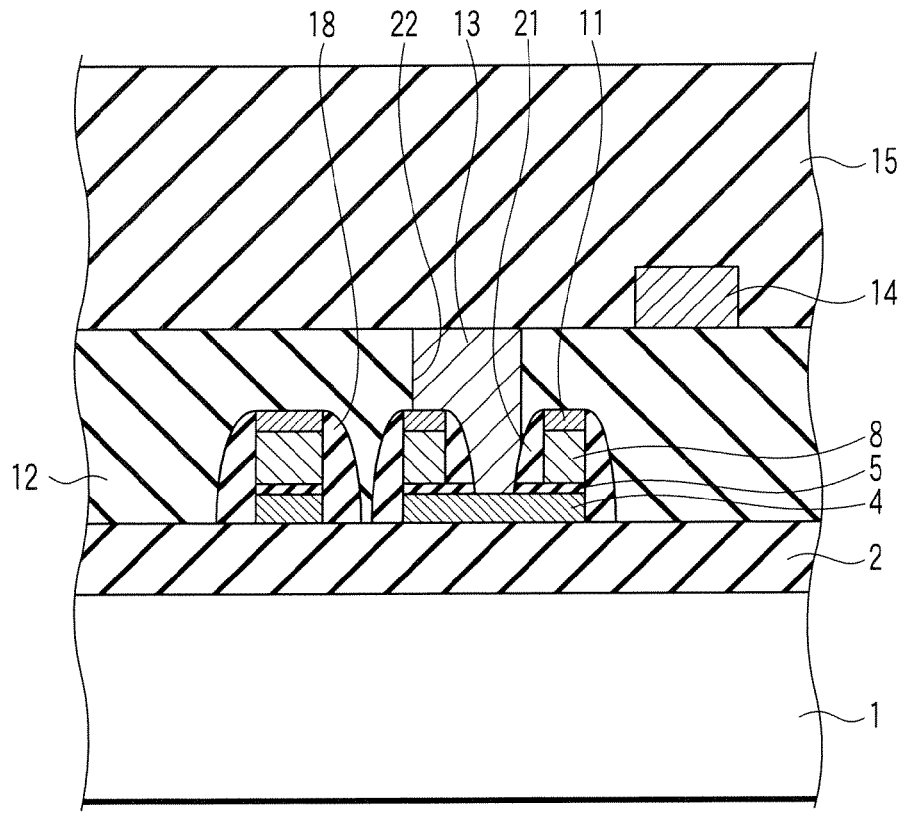
FIG. 2A is a sectional view for explaining the semiconductor device according to the first embodiment of the present invention by taking a flash EEPROM as an example, which is taken along a line 2A-2A in FIG. 1A.
Figure 2B:
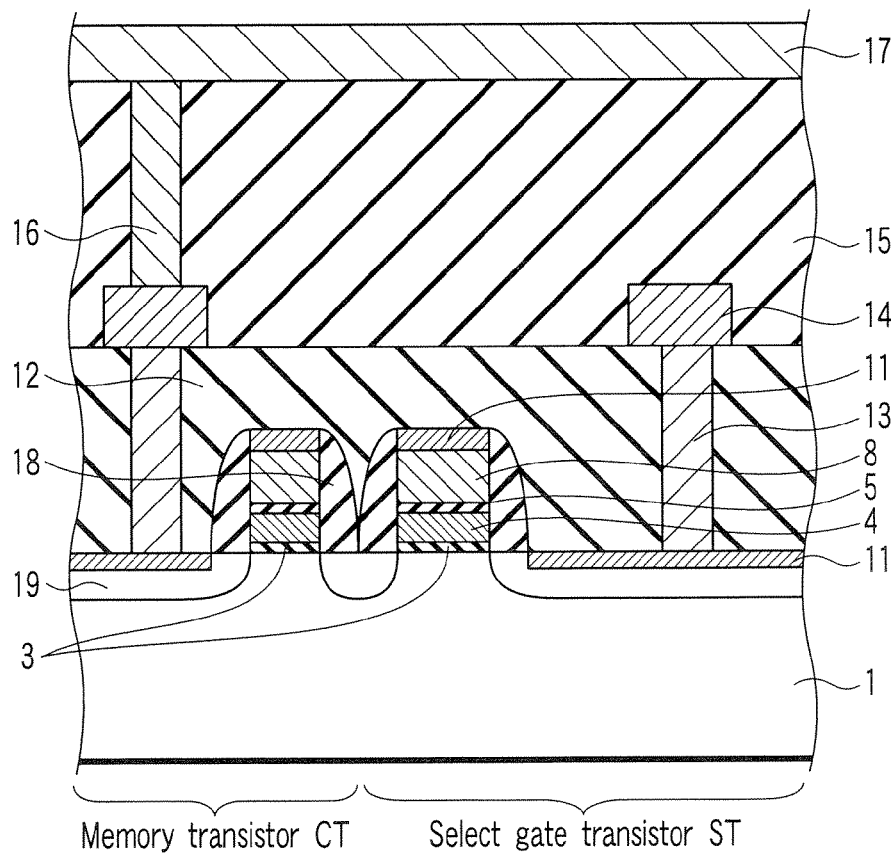
FIG. 2B is a sectional view for explaining the semiconductor device according to the first embodiment of the present invention by taking a flash EEPROM as an example, which is taken along a line 2B-2B in FIG. 1A.

A semiconductor device according to the first embodiment of the present invention will be explained below with reference to FIGS. 1A, 1B, 2A, and 2B by taking a flash EEPROM whose memory cell comprises a memory transistor and select gate transistor as an example. FIG. 1A is a plan view of the pattern of a memory cell portion. FIG. 1B is a sectional view of a peripheral transistor. FIG. 2A is a sectional view taken along a line 2A-2A in FIG. 1A. FIG. 2B is a sectional view taken along a line 2B-2B in FIG. 1A.

The memory cell portion has a memory transistor CT and select gate transistor ST. The memory transistor CT and select gate transistor ST are formed in an element region defined by an element isolation film (e.g., a silicon oxide film) 2 formed on the major surface of a silicon substrate (semiconductor substrate) 1. The gate electrode of each of the memory transistor CT and select gate transistor ST has a two-layer structure, i.e., a so-called stacked gate structure. A gate electrode 4 as a lower layer (first layer) in the memory transistor CT is a floating gate electrode, and a gate electrode 8 as an upper layer (second layer) in the memory transistor CT is a control gate electrode. Each of the floating gate electrode 4 and control gate electrode 8 is made of, e.g., a polysilicon layer. The floating gate electrode 4 is formed on a gate insulating film 3 made of a silicon oxide film or the like formed on the major surface of the silicon substrate 1. An ONO film 5 serving as a inter-poly insulating film is interposed between the floating gate electrode 4 and control gate electrode 8. The ONO film 5 is an insulating film formed by stacking a silicon oxide film, silicon nitride film, and silicon oxide film.

Silicide layers 11 are formed on the control gate electrode 8 of the memory transistor CT, an upper gate electrode 8 of the select gate transistor ST, and a gate electrode 8 of a peripheral transistor PT. Also, sidewall spacers 18 made of a silicon nitride film or the like are formed on the sidewalls of each stacked gate structure. In addition, a silicide layer 11 similar to that formed on the gate electrode 8 is formed on a source or drain region 19 of each of the memory transistor CT, select gate transistor ST, and peripheral transistor PT.

As shown in FIG. 2A, a through hole 21 reaching the surface of the lower gate electrode 4 is formed in the silicide layer 11, upper gate electrode 8, and ONO film 5 in a region positioned above the element isolation film 2 in the select gate transistor ST. Sidewall spacers 18 are formed on the inner sidewalls of the through hole 21 as well.

A first interlayer dielectric 12 made of, e.g., a BPSG (Boron doped Phospho-Silicate Glass) film or PSG (Phospho-Silicate Glass) film covers the stacked gates of the memory transistor CT and select gate transistor ST and the gate of the peripheral transistor PT. A through hole (opening) 22 is formed in that position of the interlayer dielectric 12, which corresponds to the through hole 21. The width in the short-side direction of the through hole 22 is the same as that of contact holes formed in positions corresponding to the source and drain regions of the peripheral transistor PT. The width in the long-side direction of the through hole 22 is larger than that in the short-side direction. That is, the through hole 22 has, e.g., the shape of an ellipse. A contact plug 13 made of tungsten (W) or the like is buried in the through hole 22. The contact plug 13 electrically connects the lower gate electrode (polysilicon layer) 4 and the silicide layer 11 formed on the surface of the upper gate electrode (polysilicon layer) 8.

Contact holes are formed on the source region (or drain region) 19 of the memory transistor CT and on the drain region (or source region) 19 of the select gate transistor ST. Contact plugs 13 are buried in these contact holes. The contact plug 13 connects the drain or source region 19 of each transistor to an Al interconnection (interconnection layer) 14 on the interlayer dielectric 12.

A second interlayer dielectric 15 made of a silicon oxide film or the like is formed on the interlayer dielectric 12 and Al interconnections 14. An Al interconnection (interconnection layer) 17 serving as a source line (or bit line) is formed on the interlayer dielectric 15. The Al interconnection 17 connects to the Al interconnection 14 via a contact plug 16 in a via hole formed in the interlayer dielectric 15. Accordingly, the source region of the memory transistor CT electrically connects to the source line (or bit line) via the silicide layer 11, contact plug 13, Al interconnection 14, and contact plug 16. The drain region of the select gate transistor ST electrically connects to the bit line (or source line) via the silicide layer 11, contact plug 13, and Al interconnection 14.

The gate electrode of the peripheral transistor PT has a single-layer structure. The peripheral transistor PT forms a peripheral circuit such as a decoder of the memory. In a nonvolatile memory embedded logic integrated circuit, the peripheral transistor PT forms a logic circuit or the like.

The gate electrode 8 of the peripheral transistor PT is made of, e.g., the same second polysilicon layer as the control gate electrode described above. The gate electrode 8 is formed on a gate insulating film 7 made of a silicon oxide film or the like formed on the major surface of the silicon substrate 1. The silicide layer 11 is formed on the gate electrode 8. The sidewall spacers 18 are formed on the sidewalls of this gate structure as well.

As described above, the first interlayer dielectric 12 covers the gate structure of the peripheral transistor PT, and the contact plugs 13 are buried in the contact holes formed in those positions of the interlayer dielectric 12, which correspond to the source and drain regions. The contact plugs 13 connect the source and drain regions 19 of the peripheral transistor PT to the Al interconnections 14 on the interlayer dielectric 12. The second interlayer dielectric 15 is formed on the interlayer dielectric 12 and Al interconnections 14.

In the arrangement as described above, the contact plug 13 connects the first polysilicon layer 4 and second polysilicon layer 8 of the select gate transistor ST. Since this makes an Al interconnection unnecessary, it is possible to shrink the memory cell and reduce the cost.

Also, there is no contact between the polysilicon layers. The contact resistance between the contact plug 13 and polysilicon layer 4 is about 100 Ω, the contact resistance between the contact plug 13 and polysilicon layer 8 is about 10 Ω, and the resistance of the contact plug 13 is about a few Ω, so the sum of the resistance values is about 110 to 120 Ω. This makes it possible to reduce the resistance value to ½ to ¼ that when the polysilicon layers are in direct contact with each other.

Accordingly, the arrangement of the first embodiment of the present invention can reduce the parasitic resistance of the gate electrode of the select gate transistor ST.

A method of fabricating the flash EEPROM shown in FIGS. 1A, 1B, 2A, and 2B will be explained below with reference to FIGS. 3A and 3B to 22A and 22B. FIGS. 3A, 5A, 7A, 9A, 11A, 13A, 15A, 17A, 19A, and 21A are plan views sequentially showing the fabrication steps of the flash EEPROM, each of which shows the pattern of a memory cell portion. These fabrication steps correspond to FIG. 1A. FIGS. 3B, 5B, 7B, 9B, 11B, 13B, 15B, 17B, 19B, and 21B are sectional views sequentially showing the fabrication steps of a peripheral transistor region. These fabrication steps correspond to FIG. 1B. Also, FIGS. 4A, 6A, 8A, 10A, 12A, 14A, 16A, 18A, 20A, and 22A are sectional views sequentially showing the fabrication steps of the memory cell portion, and respectively taken along a line 4A-4A in FIG. 3A, a line 6A-6A in FIG. 5A, a line 8A-8A in FIG. 7A, a line 10A-10A in FIG. 9A, a line 12A-12A in FIG. 11A, a line 14A-14A in FIG. 13A, a line 16A-16A in FIG. 15A, a line 18A-18A in FIG. 17A, a line 20A-20A in FIG. 19A, and a line 22A-22A in FIG. 21A. These fabrication steps correspond to FIG. 2A. In addition, FIGS. 4B, 6B, 8B, 10B, 12B, 14B, 16B, 18B, 20B, and 22B are sectional views sequentially showing the fabrication steps of the memory cell portion, and respectively taken along a line 4B-4B in FIG. 3A, a line 6B-6B in FIG. 5A, a line 8B-8B in FIG. 7A, a line 10B-10B in FIG. 9A, a line 12B-12B in FIG. 11A, a line 14B-14B in FIG. 13A, a line 16B-16B in FIG. 15A, a line 18B-18B in FIG. 17A, a line 20B-20B in FIG. 19A, and a line 22B-22B in FIG. 21A. These fabrication steps correspond to FIG. 2B.

First, as shown in FIGS. 3A and 4A, element isolation films 2 are selectively formed on the major surface of a silicon substrate 1. An impurity is ion-implanted (channel ion implantation) into an element region electrically isolated by the element isolation films 2 such that each transistor has a desired threshold voltage. After that, as shown in FIGS. 3B and 4B, a silicon oxide film (gate insulating film) 3 is formed by thermal oxidation on the major surface of the substrate 1 in the element region, and a polysilicon layer 4 is formed on the silicon oxide film 3 by CVD (Chemical Vapor Deposition). The polysilicon layer 4 is also formed on the element isolation films 2. In this step, an impurity such as phosphorus (P) is doped into the polysilicon layer 4 to decrease the sheet resistance of polysilicon to 100 to 200 Ω/□, thereby reducing the parasitic resistance.

Figure 5A:
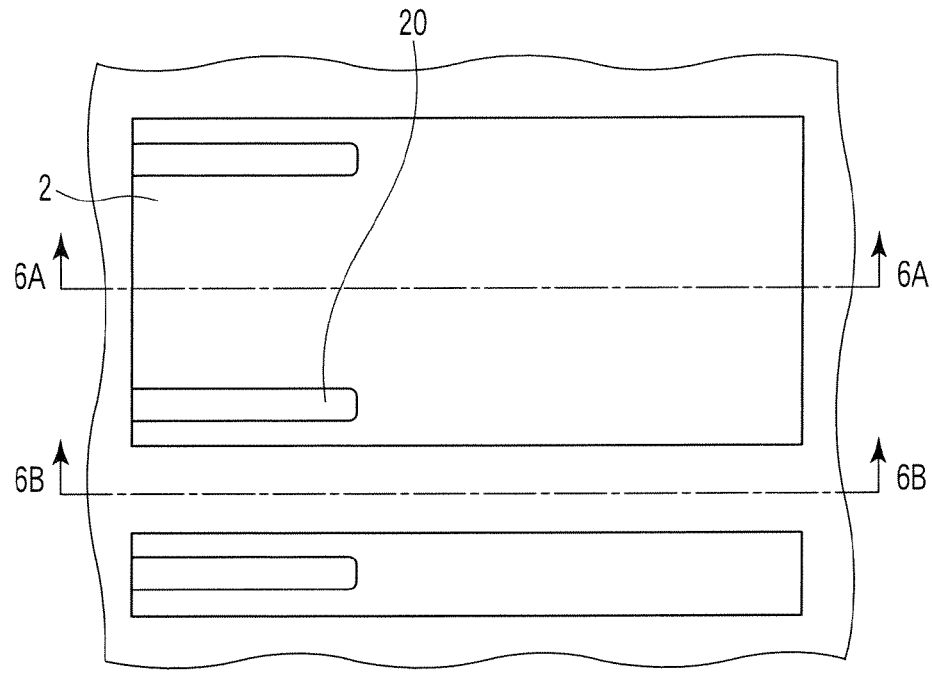
FIG. 5A is a plan view for explaining the semiconductor device fabrication method according to the first embodiment of the present invention, which shows the pattern of the memory cell portion in the second fabrication step by taking a flash EEPROM as an example.
Figure 5B:
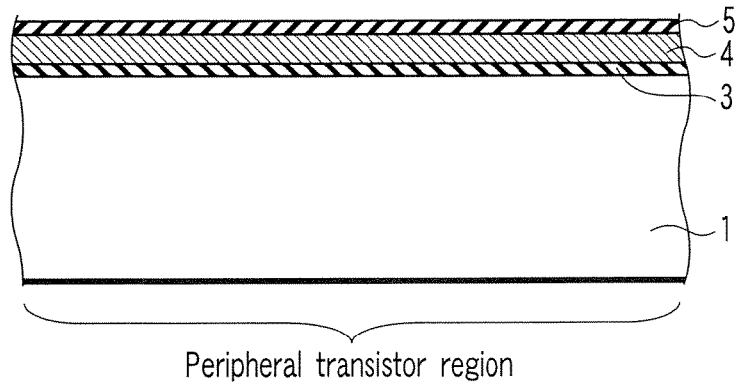
FIG. 5B is a sectional view for explaining the semiconductor device fabrication method according to the first embodiment of the present invention, which shows the peripheral transistor region in the second fabrication step by taking a flash EEPROM as an example.
Figure 6A:
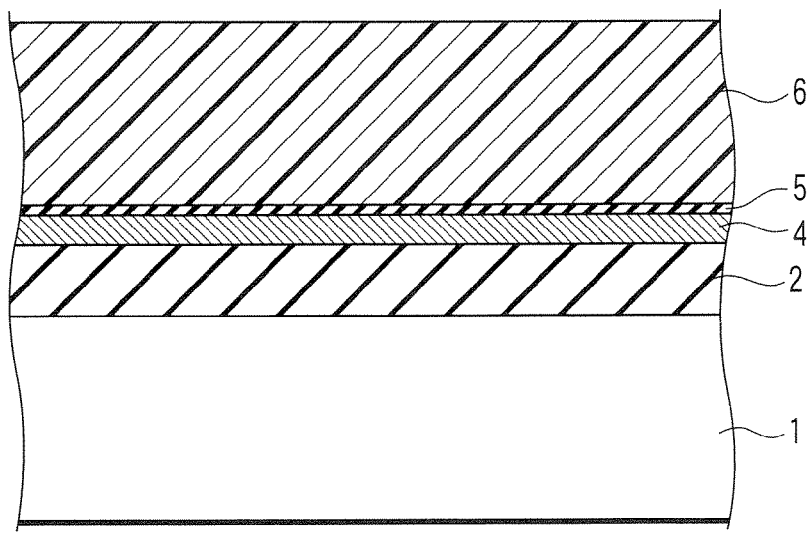
FIG. 6A is a sectional view for explaining the semiconductor device fabrication method according to the first embodiment of the present invention, which is taken along a line 6A-6A in FIG. 5A and shows the second fabrication step by taking a flash EEPROM as an example.
Figure 6B:
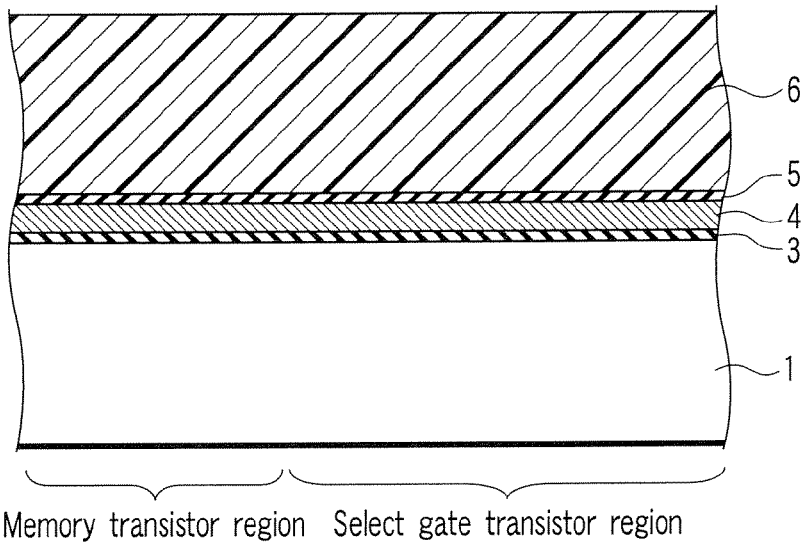
FIG. 6B is a sectional view for explaining the semiconductor device fabrication method according to the first embodiment of the present invention, which is taken along a line 6B-6B in FIG. 5A and shows the second fabrication step by taking a flash EEPROM as an example.
Figure 7A:
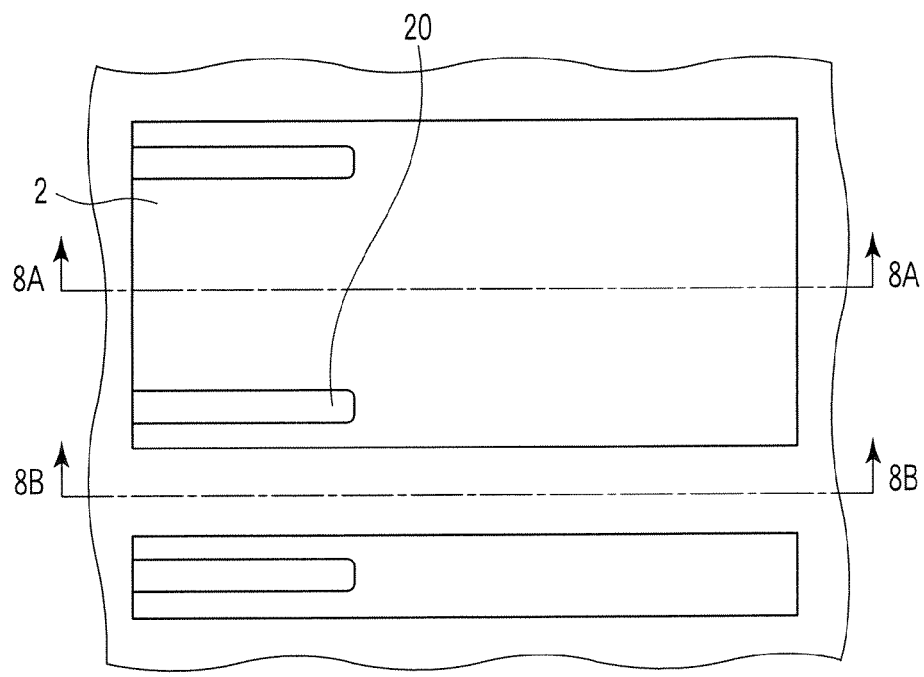
FIG. 7A is a plan view for explaining the semiconductor device fabrication method according to the first embodiment of the present invention, which shows the pattern of the memory cell portion in the third fabrication step by taking a flash EEPROM as an example.
Figure 7B:
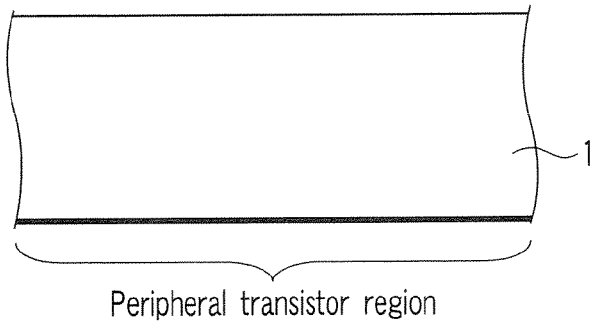
FIG. 7B is a sectional view for explaining the semiconductor device fabrication method according to the first embodiment of the present invention, which shows the peripheral transistor region in the third fabrication step by taking a flash EEPROM as an example.
Figure 8A:
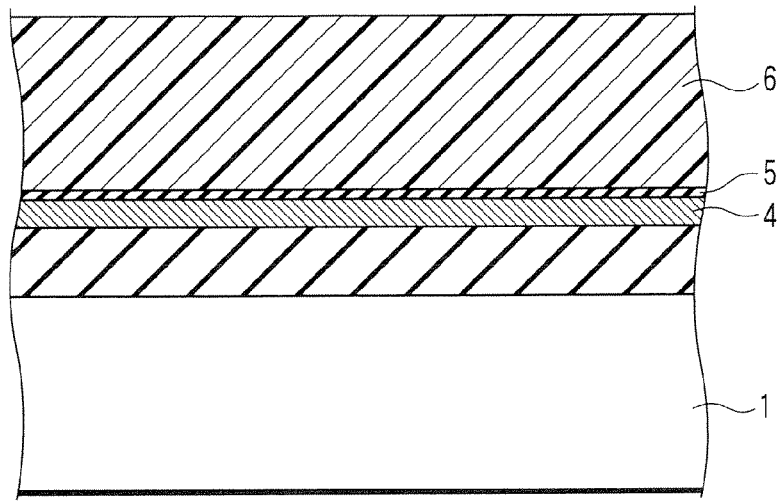
FIG. 8A is a sectional view for explaining the semiconductor device fabrication method according to the first embodiment of the present invention, which is taken along a line 8A-8A in FIG. 7A and shows the third fabrication step by taking a flash EEPROM as an example.
Figure 8B:
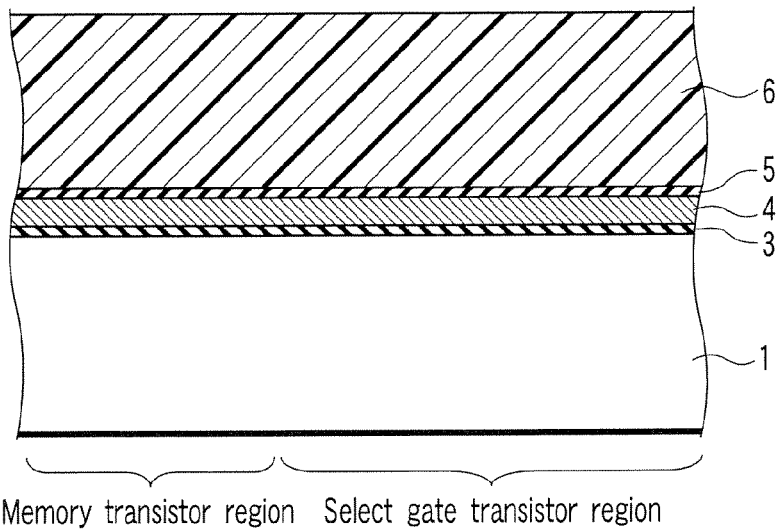
FIG. 8B is a sectional view for explaining the semiconductor device fabrication method according to the first embodiment of the present invention, which is taken along a line 8B-8B in FIG. 7A and shows the third fabrication step by taking a flash EEPROM as an example.
Figure 9A:
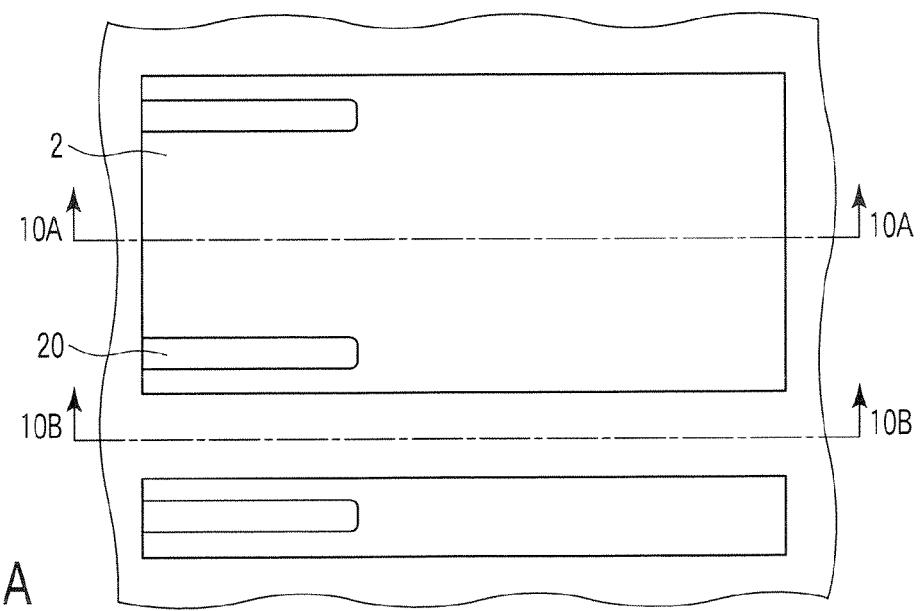
FIG. 9A is a plan view for explaining the semiconductor device fabrication method according to the first embodiment of the present invention, which shows the pattern of the memory cell portion in the fourth fabrication step by taking a flash EEPROM as an example.
Figure 9B:
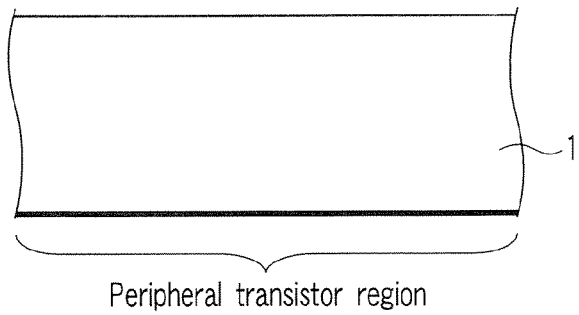
FIG. 9B is a sectional view for explaining the semiconductor device fabrication method according to the first embodiment of the present invention, which shows the peripheral transistor region in the fourth fabrication step by taking a flash EEPROM as an example.
Figure 10A:
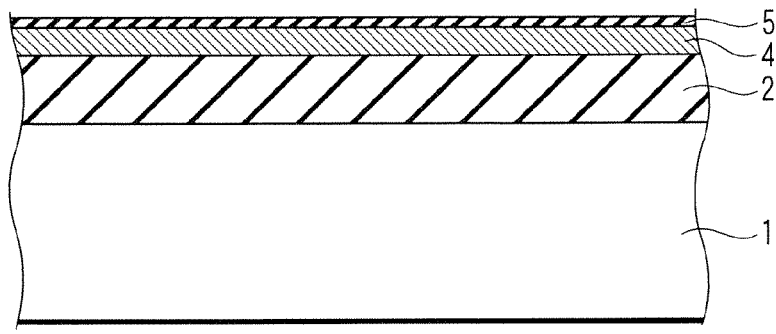
FIG. 10A is a sectional view for explaining the semiconductor device fabrication method according to the first embodiment of the present invention, which is taken along a line 10A-10A in FIG. 9A and shows the fourth fabrication step by taking a flash EEPROM as an example.
Figure 10B:
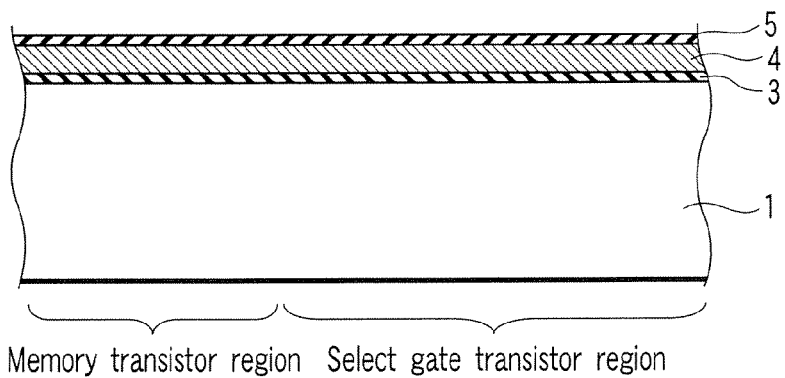
FIG. 10B is a sectional view for explaining the semiconductor device fabrication method according to the first embodiment of the present invention, which is taken along a line 10B-10B in FIG. 9A and shows the fourth fabrication step by taking a flash EEPROM as an example.
Figure 11A:
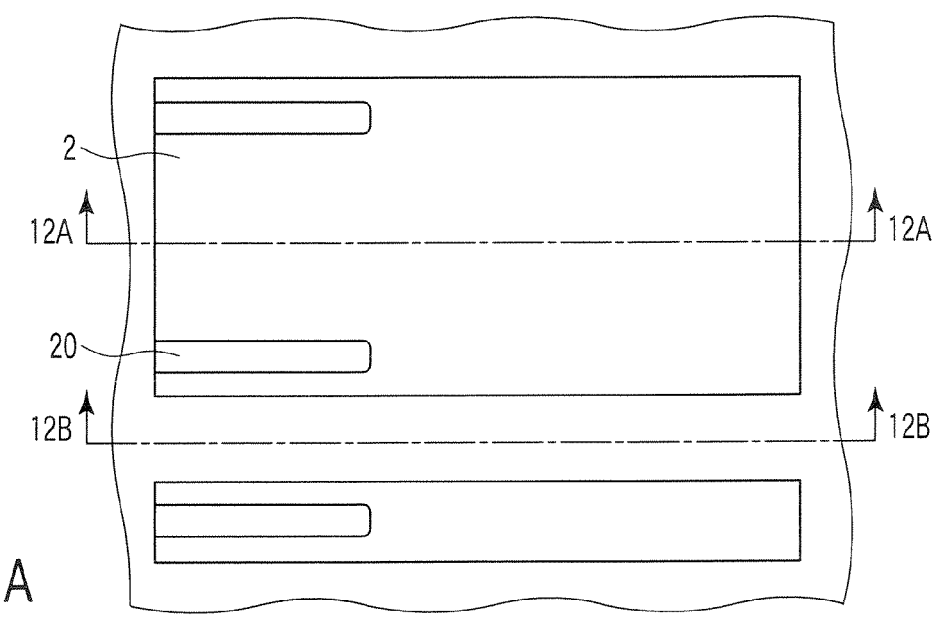
FIG. 11A is a plan view for explaining the semiconductor device fabrication method according to the first embodiment of the present invention, which shows the pattern of the memory cell portion in the fifth fabrication step by taking a flash EEPROM as an example.
Figure 11B:
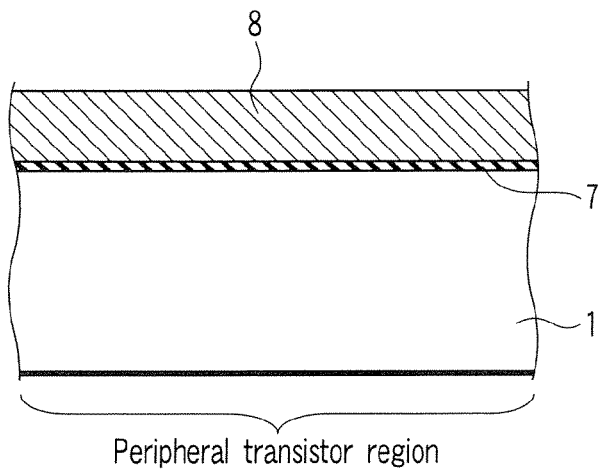
FIG. 11B is a sectional view for explaining the semiconductor device fabrication method according to the first embodiment of the present invention, which shows the peripheral transistor region in the fifth fabrication step by taking a flash EEPROM as an example.
Figure 12A:
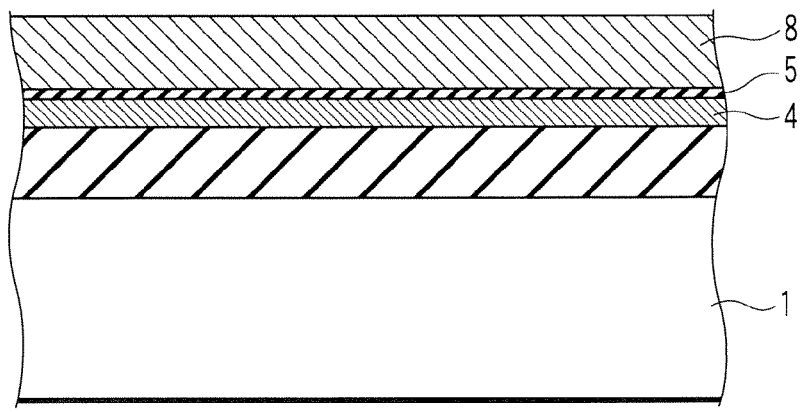
FIG. 12A is a sectional view for explaining the semiconductor device fabrication method according to the first embodiment of the present invention, which is taken along a line 12A-12A in FIG. 11A and shows the fifth fabrication step by taking a flash EEPROM as an example.
Figure 12B:
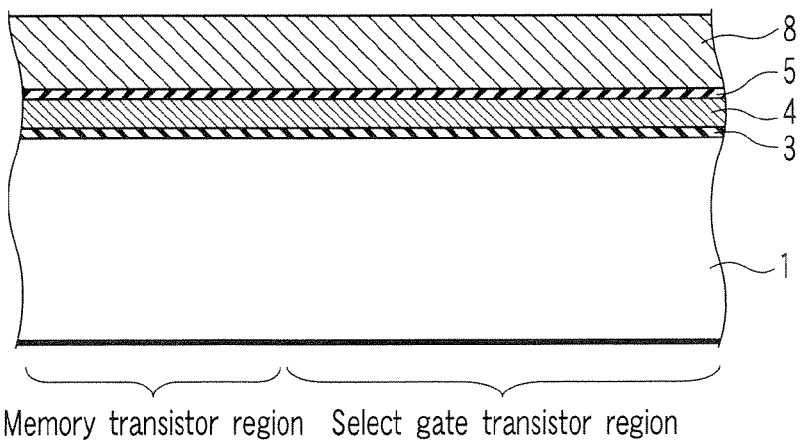
FIG. 12B is a sectional view for explaining the semiconductor device fabrication method according to the first embodiment of the present invention, which is taken along a line 12B-12B in FIG. 11A and shows the fifth fabrication step by taking a flash EEPROM as an example.
Figure 14A:
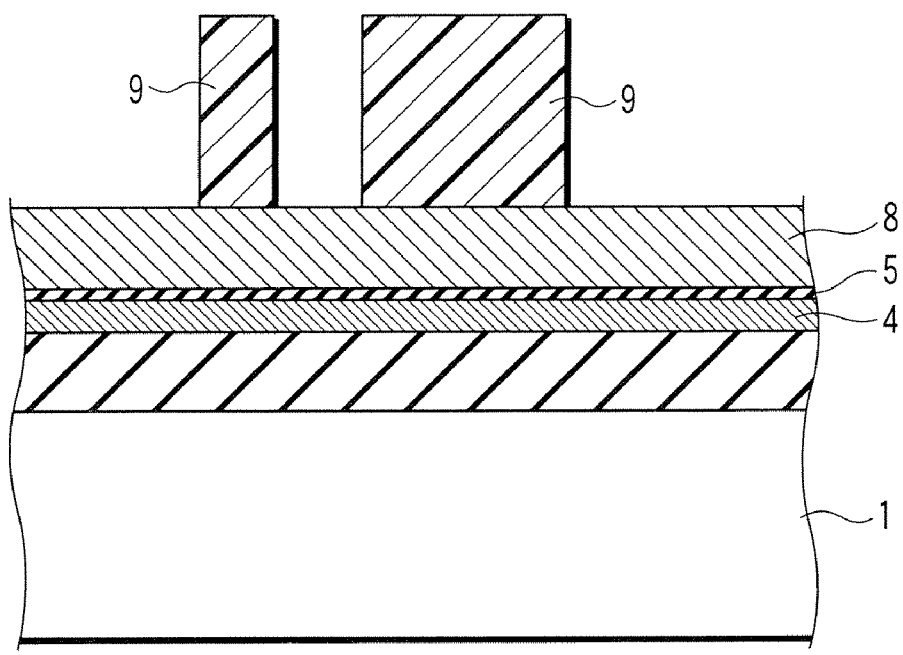
FIG. 14A is a sectional view for explaining the semiconductor device fabrication method according to the first embodiment of the present invention, which is taken along a line 14A-14A in FIG. 13A and shows the sixth fabrication step by taking a flash EEPROM as an example.
Figure 14B:
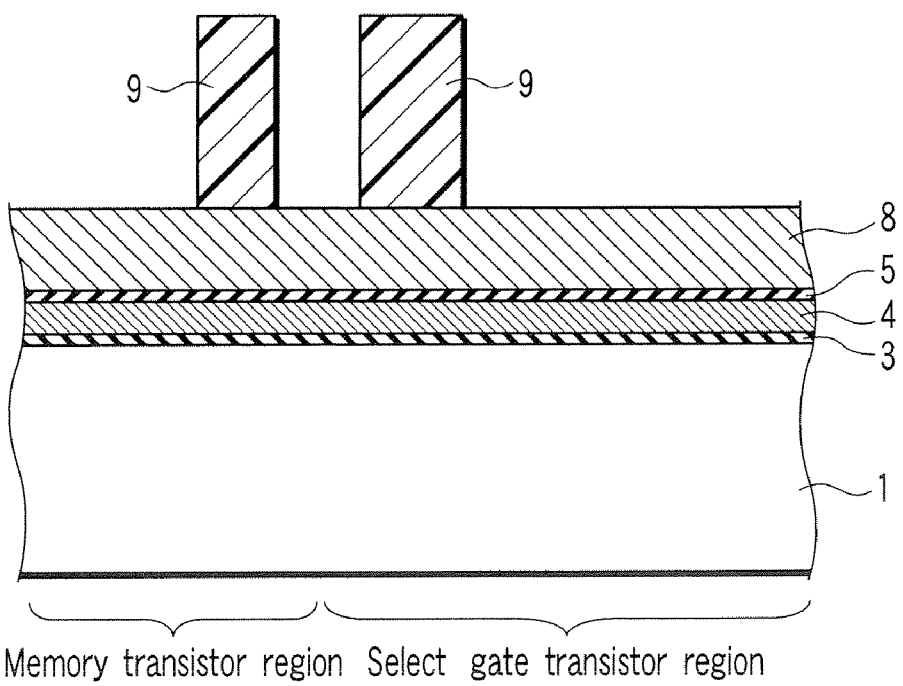
FIG. 14B is a sectional view for explaining the semiconductor device fabrication method according to the first embodiment of the present invention, which is taken along a line 14B-14B in FIG. 13A and shows the sixth fabrication step by taking a flash EEPROM as an example.
Figure 16A:
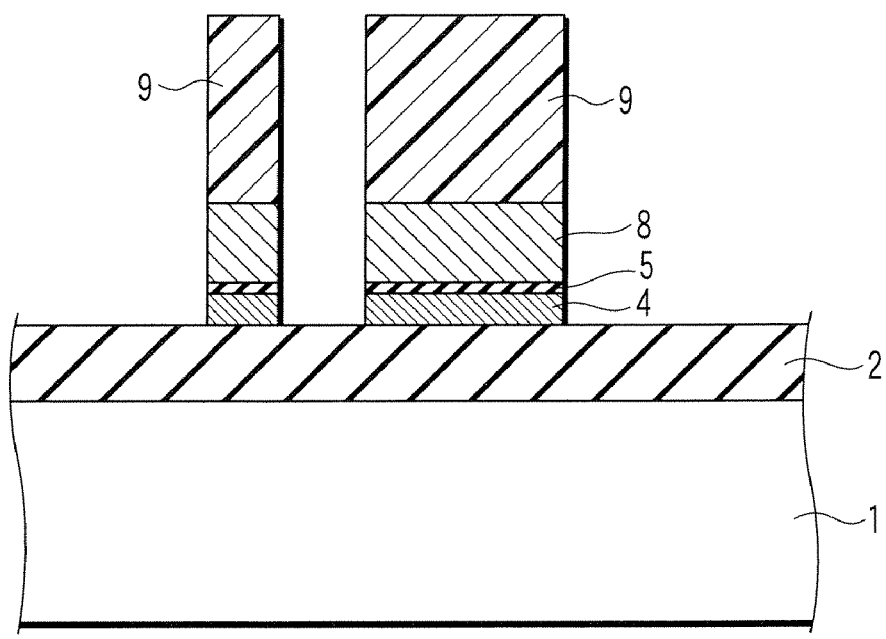
FIG. 16A is a sectional view for explaining the semiconductor device fabrication method according to the first embodiment of the present invention, which is taken along a line 16A-16A in FIG. 15A and shows the seventh fabrication step by taking a flash EEPROM as an example.
Figure 16B:
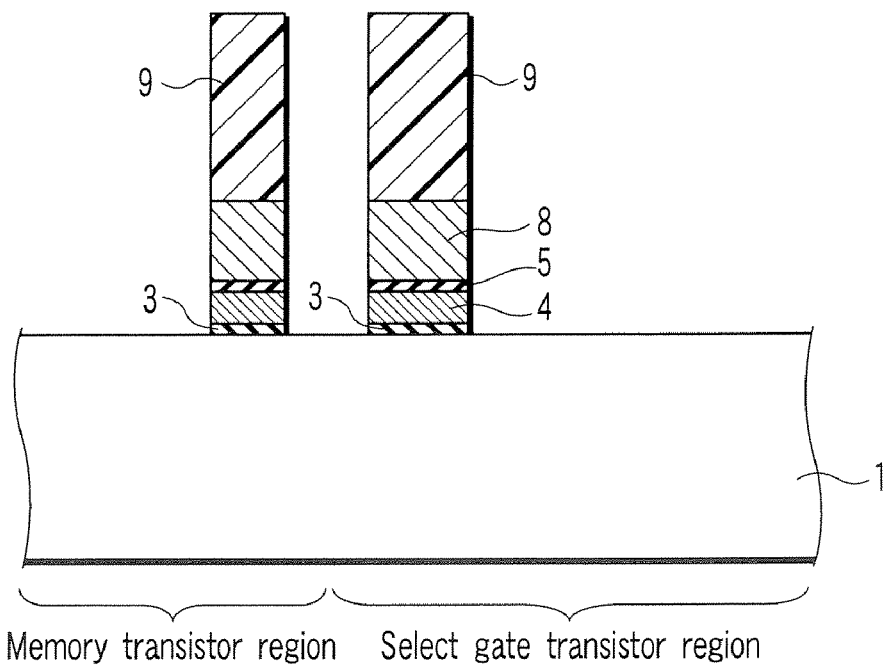
FIG. 16B is a sectional view for explaining the semiconductor device fabrication method according to the first embodiment of the present invention, which is taken along a line 16B-16B in FIG. 15A and shows the seventh fabrication step by taking a flash EEPROM as an example.

Then, to separate a first gate electrode (floating gate electrode) of a memory transistor CT into cells, a pattern is transferred to a photoresist (not shown) by lithography, and anisotropic etching is performed by RIE (Reactive Ion Etching). Consequently, as shown in FIG. 5A, holes or slit-like openings 20 for separating the polysilicon layer 4 are transferred to the polysilicon layer 4. After that, the photoresist is removed.

Next, as shown in FIGS. 5A, 5B, 6A, and 6B, a silicon oxide film, silicon nitride film, and silicon oxide film are sequentially deposited on the polysilicon layer 4 by CVD or the like, thereby forming an insulating film (ONO film) 5 having a stacked structure. The ONO film 5 functions as an insulating film between polysilicon layers, i.e., as a so-called inter-poly insulating film. Subsequently, a photoresist 6 is formed by coating to perform selective etching for removing the silicon oxide film 3, polysilicon layer 4, and ONO film 5 formed in a peripheral transistor region (a region where the gate electrode has a single-layer structure), and a pattern is transferred by lithography. In this state, the photoresist 6 covers the memory cell portion, and the ONO film 5 in the peripheral transistor region is exposed.

Then, as shown in FIGS. 7A, 7B, 8A, and 8B, the photoresist 6 is used as a mask to remove the ONO film 5 in the peripheral transistor region by RIE, remove the polysilicon layer 4 by isotropic etching performed by CDE (Chemical Dry Etching), and remove the silicon oxide film 3 by wet etching using, e.g., NH$_4$F. This exposes the major surface of the silicon substrate 1 in the peripheral transistor region. Removing the photoresist 6 after that forms a structure as shown in FIGS. 9A, 9B, 10A, and 10B.

After that, as shown in FIGS. 11A, 11B, 12A, and 12B, a silicon oxide film (third gate insulating film) 7 is formed on the major surface of the silicon substrate 1 in the peripheral transistor region, and a polysilicon layer 8 is formed on the silicon oxide film 7 and ONO film 5 by CVD.

The fabrication steps up to this point forms a region (memory cell portion) having a two-layer polysilicon structure and a region (peripheral transistor region) having a single-layer polysilicon structure on the silicon substrate 1.

Next, as shown in FIGS. 13A, 13B, 14A, and 14B, the pattern of the gate electrodes of a memory transistor CT and select gate transistor ST each having a two-layer polysilicon structure is transferred to a photoresist 9 by lithography. In this step, the photoresist 9 masks the entire surface of the peripheral transistor region having a single-layer polysilicon structure.

Subsequently, as shown in FIGS. 15A, 15B, 16A, and 16B, the photoresist 9 is used as a mask to sequentially anisotropically etch the polysilicon layer 8, ONO film 5, polysilicon layer 4, and gate insulating film 3 by RIE, thereby forming the gate electrodes of the memory transistor CT and select gate transistor ST.

Figure 17A:
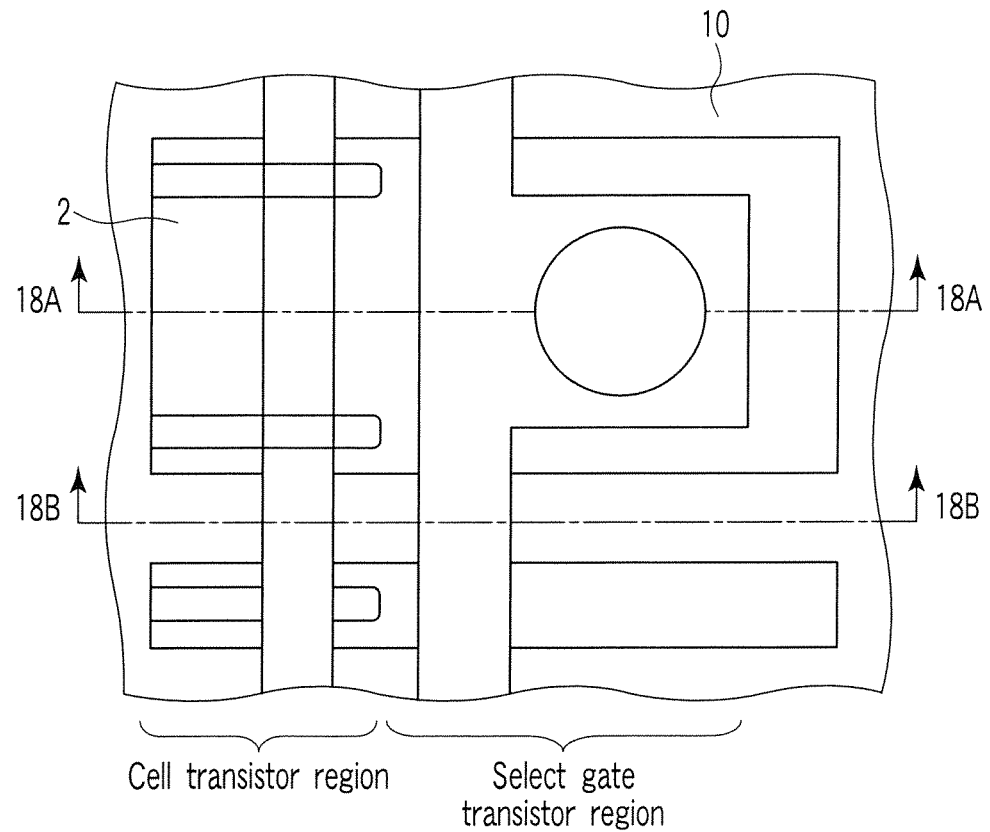
FIG. 17A is a plan view for explaining the semiconductor device fabrication method according to the first embodiment of the present invention, which shows the pattern of the memory cell portion in the eighth fabrication step by taking a flash EEPROM as an example.
Figure 17B:
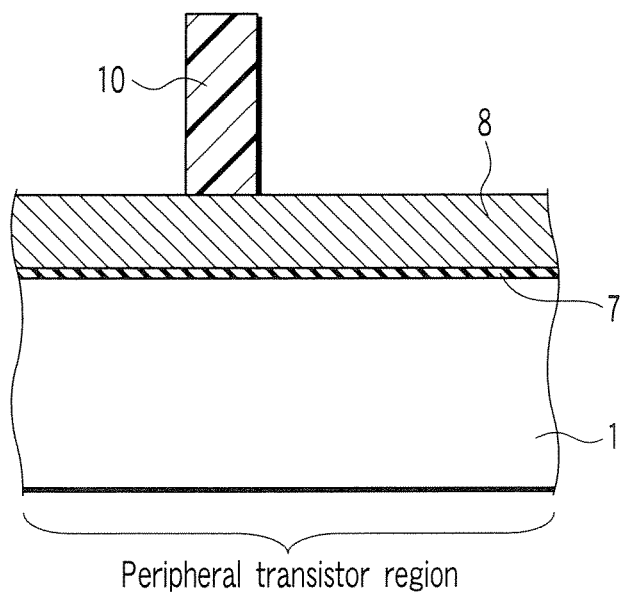
FIG. 17B is a sectional view for explaining the semiconductor device fabrication method according to the first embodiment of the present invention, which shows the peripheral transistor region in the eighth fabrication step by taking a flash EEPROM as an example.
Figure 18A:
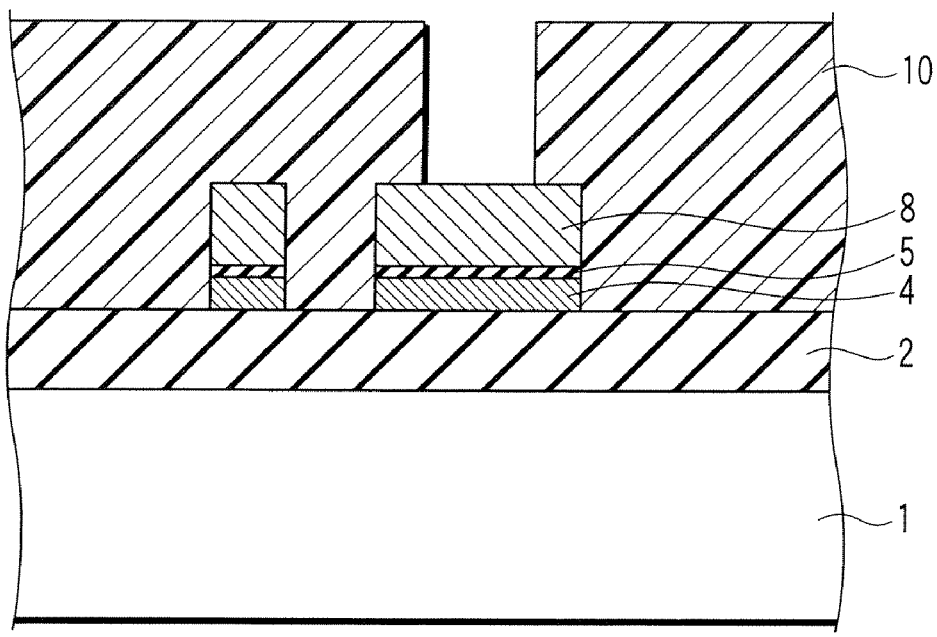
FIG. 18A is a sectional view for explaining the semiconductor device fabrication method according to the first embodiment of the present invention, which is taken along a line 18A-18A in FIG. 17A and shows the eighth fabrication step by taking a flash EEPROM as an example.
Figure 18B:
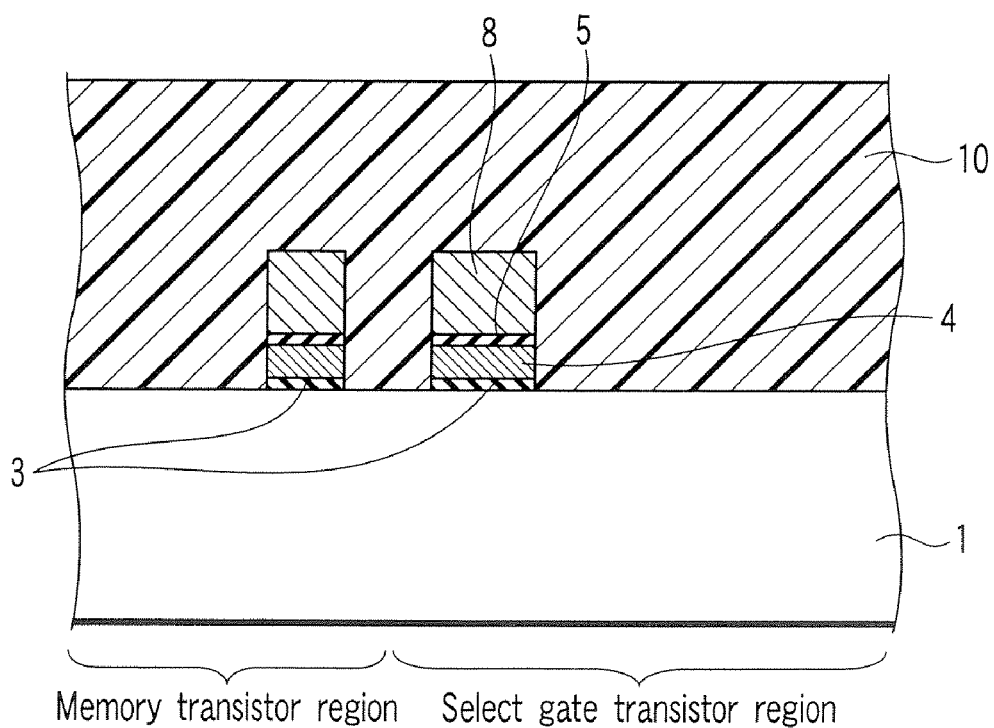
FIG. 18B is a sectional view for explaining the semiconductor device fabrication method according to the first embodiment of the present invention, which is taken along a line 18B-18B in FIG. 17A and shows the eighth fabrication step by taking a flash EEPROM as an example.
Figure 21A:
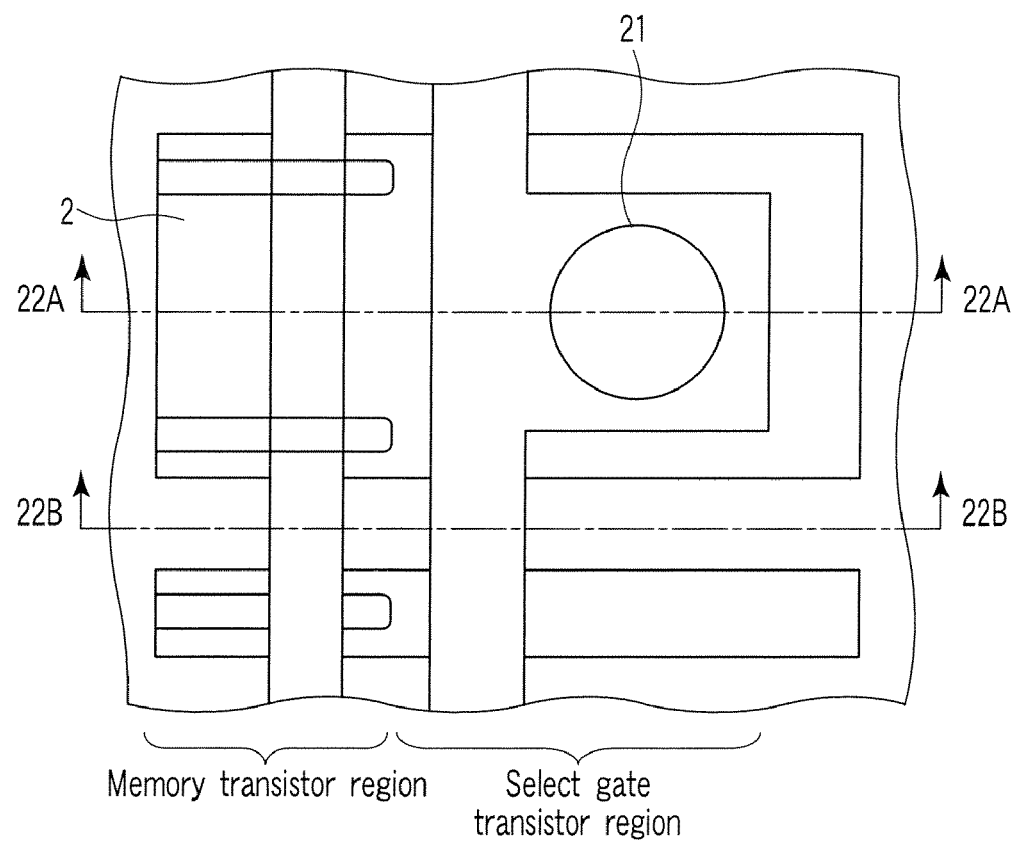
FIG. 21A is a plan view for explaining the semiconductor device fabrication method according to the first embodiment of the present invention, which shows the pattern of the memory cell portion in the 10th fabrication step by taking a flash EEPROM as an example.
Figure 21B:
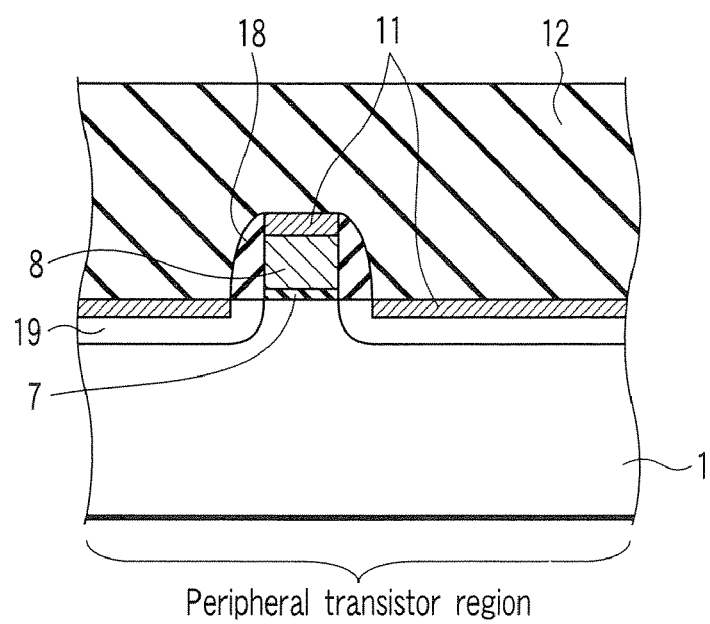
FIG. 21B is a sectional view for explaining the semiconductor device fabrication method according to the first embodiment of the present invention, which shows the peripheral transistor region in the 10th fabrication step by taking a flash EEPROM as an example.

After that, as shown in FIGS. 17A, 17B, 18A, and 18B, the pattern of the gate electrode of the peripheral transistor region having a single-layer polysilicon structure is transferred to a photoresist 10 by lithography. In this step, the photoresist 10 masks the regions having a two-layer polysilicon structure. However, to form a contact portion for extracting the first gate electrode 4 of the select gate transistor, a hole is formed in a prospective contact region of the photoresist 10 as shown in FIGS. 17A and 18A.

Subsequently, the photoresist 10 is used as a mask to anisotropically etch the polysilicon layer 8, pattern the gate electrode of the peripheral transistor region, and simultaneously form a through hole 21 for forming the contact portion for extracting the first gate electrode 4 of the select gate transistor (FIGS. 19A, 19B, 20A, and 20B).

Then, the photoresist 10 is removed. As shown in FIGS. 21A, 21B, 22A, and 22B, a diffusion layer is formed by selectively doping an impurity into the major surface region of the silicon substrate 1, in order to form a source or drain region 19 of each transistor in the memory cell portion and peripheral transistor region. After that, a silicon nitride film or the like is formed by CVD and etched back by anisotropic etching such as RIE, thereby forming sidewall spacers 18 on the side surfaces of each gate electrode structure. At the same time, a contact portion for extracting the gate electrode 4 is formed by removing the ONO film 5 in the through hole 21 of the select gate transistor by anisotropic etching such as RIE.

After that, a metal film (e.g., Co) is formed on the silicon substrate 1 by sputtering. The silicon substrate 1 is then annealed to cause a silicidation reaction in a portion where silicon and the metal film are in contact with each other. Normally, the silicide layer formed in this stage is left behind, and the unreacted metal film is removed by etching. This step forms silicide layers 11 on the control gate electrode 8 and the source or drain region 19 of the memory transistor CT, on the exposed surface of the gate electrode and the drain or source region 19 of the select gate transistor ST, and on the gate electrode and the source and drain regions 19 of a peripheral transistor PT. After that, the resistance of the silicide layers 11 is decreased (to 5 to 20 Ω/□) by performing annealing for the second time.

An interlayer dielectric 12 such as a BPSG film or PSG film then covers the entire surface of the gate electrode structure formed as described above. Subsequently, the pattern of a contact portion for extracting the electrode is transferred to a photoresist by photolithography, anisotropic etching is performed by RIE, and the photoresist is removed.

Next, as shown in FIGS. 1A, 1B, 2A, and 2B, contact holes and, e.g., an elliptic through hole (opening) 22 are formed in the interlayer dielectric 12, and tungsten (W) is deposited by CVD. Contact plugs 13 are formed by removing extra tungsten (W) on the interlayer dielectric 12 by CMP. Since the through hole 22 on the first polysilicon layer 4 of the select gate transistor ST covers the silicide layer 11, the contact plug 13 can electrically connect the first polysilicon layer 4 and second polysilicon layer 8 (silicide layer 11) as shown in FIG. 1A.

Then, Al is deposited on the entire surface by sputtering, and an interconnection pattern is transferred to a photoresist by lithography. Subsequently, Al is patterned by anisotropic etching performed by RIE using the photoresist as a mask, and the photoresist is removed to form first Al interconnections 14 (100 to 200 mΩ/□).

In this step, the parasitic resistance can be decreased by backing the gate electrode 4 (100 to 200 Ω/□) made of the first polysilicon layer 4 of the select gate transistor ST with a silicide layer having a low resistance value (5 to 20 Ω/□) for every few cells of memory cells arranged in the form of an array.

To protect the Al interconnections 14, a silicon oxide film 15 is deposited by CVD. After that, a pattern is transferred to a photoresist by lithography, and the photoresist is used as a mask to perform anisotropic etching by RIE and then removed, thereby forming a via hole. After the via hole is formed, Al is deposited by sputtering, a second interconnection pattern is transferred to a photoresist by lithography, and the photoresist is used as a mask to perform anisotropic etching by RIE or the like, thereby forming a second Al interconnection 17. The photoresist is then removed.

Next, although not shown, PSG is deposited on the entire surface, and a silicon nitride film is deposited by PE-CVD (Plasma Enhanced Chemical Vapor Deposition), in order to protect the Al interconnection 17. Subsequently, the protective films such as the PSG film and silicon nitride film are coated with a photoresist, and a pattern for forming a hole on a bonding pad is transferred by lithography. This photoresist is used as a mask to etch away the protective films on the bonding pad and then removed, thereby completing a wafer.

The above fabrication method forms the through hole (opening) 22 in the second polysilicon layer 8 and ONO film 5 of the select gate transistor ST when patterning the polysilicon layer by etching in order to form the gate electrode of the peripheral transistor PT. Also, when the contact plug for connecting the source or drain region 19 to the upper Al interconnection (interconnection layer) 14 is formed, the contact plug 13 electrically connects the lower gate electrode 4 of the select gate transistor ST and the silicide layer 11 formed on the surface of the upper gate electrode 8. This avoids the fabrication process from being complicated.

In addition, no Al interconnection connecting to the gate electrode (polysilicon layer 4) of the select gate transistor ST is necessary. This obviates the need for a space to an Al interconnection such as a source line or bit line, and makes it possible to decrease the memory cell size and reduce the cost. It is also possible to reduce the parasitic capacitance between the source line or bit line and the Al interconnection to the select gate transistor.

Accordingly, the first embodiment of the present invention can provide a semiconductor device capable of reducing the parasitic resistance of the gate electrode of the select gate transistor ST.

The first embodiment can also provide a semiconductor device fabrication method capable of shrinking a memory cell and simplifying the fabrication process.

Note that the first embodiment has explained an example which uses tungsten as the contact plug 13. However, it is also possible to use another refractory metal, for example, TiN, $TiSi_2$, $CoSi_2$, NiSi, etc. or bury a conductive material such as aluminum or copper.

Second Embodiment

Figure 24A:
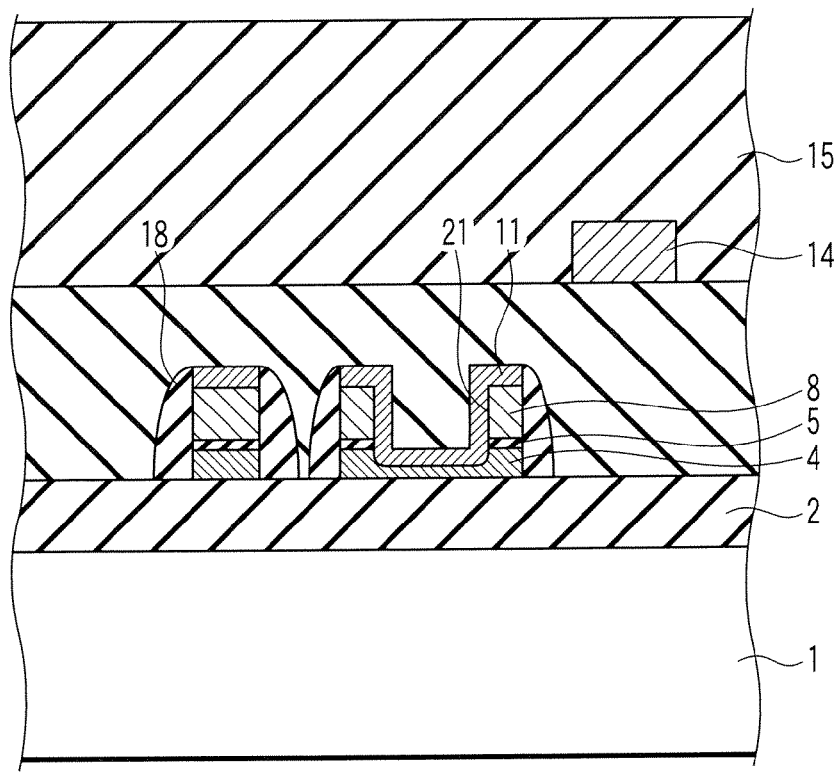
FIG. 24A is a sectional view for explaining the semiconductor device according to the second embodiment of the present invention by taking a flash EEPROM as an example, which is taken along a line 24A-24A in FIG. 23A.
Figure 24B:
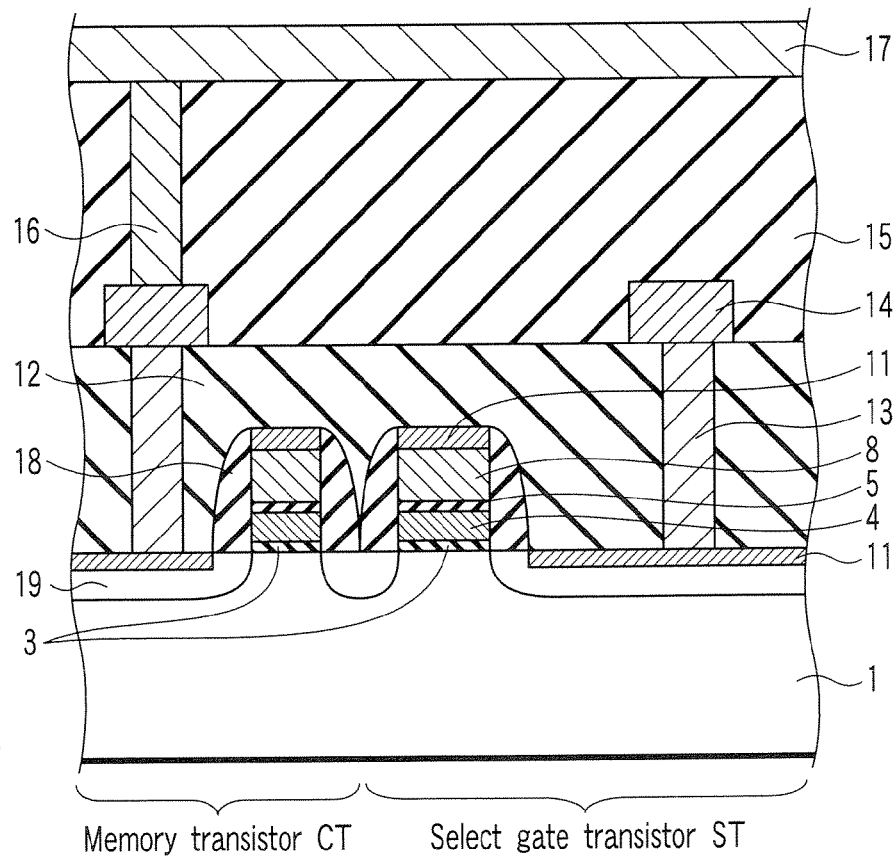
FIG. 24B is a sectional view for explaining the semiconductor device according to the second embodiment of the present invention by taking a flash EEPROM as an example, which is taken along a line 24B-24B in FIG. 23A.

A semiconductor device according to the second embodiment of the present invention will be explained below with reference to FIGS. 23A, 23B, 24A, and 24B by taking a flash EEPROM having a memory cell comprising a memory transistor and select gate transistor as an example. FIG. 23A is a plan view of the pattern of a memory cell portion. FIG. 23B is a sectional view of a peripheral transistor. FIG. 24A is a sectional view taken along a line 24A-24A in FIG. 23A. FIG. 24B is a sectional view taken along a line 24B-24B in FIG. 23A.

The memory cell portion has a memory transistor CT and select gate transistor ST. The memory transistor CT and select gate transistor ST are formed in an element region defined by an element isolation film (e.g., a silicon oxide film) 2 formed on the major surface of a silicon substrate 1. The gate electrode of each of the memory transistor CT and select gate transistor ST has a two-layer structure, i.e., a so-called stacked gate structure. A lower gate electrode 4 and upper gate electrode 8 of the memory transistor CT respectively function as a floating gate electrode and control gate electrode. Each of the floating gate electrode 4 and control gate electrode 8 is made of, e.g., a polysilicon layer. The floating gate electrode 4 is formed on a gate insulating film 3 made of a silicon oxide film or the like formed on the major surface of the silicon substrate 1. An ONO film 5 serving as a inter-poly insulating film is interposed between the floating gate electrode 4 and control gate electrode 8.

Silicide layers 11 are formed on the control gate electrode 8 of the memory transistor CT, an upper gate electrode 8 of the select gate transistor ST, and a gate electrode 8 of a peripheral transistor PT. Also, sidewall spacers 18 made of a silicon nitride film or the like are formed on the sidewalls of each stacked gate structure. In addition, a silicide layer 11 similar to that formed on the gate electrode 8 is formed on a source or drain region 19 of each of the memory transistor CT, select gate transistor ST, and peripheral transistor PT.

As shown in FIG. 24A, a through hole 21 reaching the surface of the lower gate electrode 4 is formed in the upper gate electrode 8 and ONO film 5 in a region positioned above the element isolation film 2 in the select gate transistor ST. A silicide layer 11 is formed not only on the upper surface of the gate electrode 8 but also on the inner sidewalls of the through hole 21 and on the gate electrode 4 positioned in the bottom portion of the through hole 21, thereby electrically connecting the gate electrode (polysilicon layer) 8 and gate electrode (polysilicon layer) 4.

A first interlayer dielectric 12 made of, e.g., a BPSG film or PSG film covers the stacked gate structures of the memory transistor CT and select gate transistor ST and the gate of the peripheral transistor PT. Contact holes are formed on the source region (or drain region) 19 of the memory transistor CT and on the drain region (or source region) 19 of the select gate transistor ST. Contact plugs 13 are buried in these contact holes. The contact plug 13 connects the drain or source region 19 of each transistor to an Al interconnection (interconnection layer) 14 on the interlayer dielectric 12.

A second interlayer dielectric 15 made of a silicon oxide film or the like is formed on the interlayer dielectric 12 and Al interconnections 14. An Al interconnection (interconnection layer) 17 serving as a source line (or bit line) is formed on the interlayer dielectric 15. The Al interconnection 17 connects to the Al interconnection 14 via a contact plug 16 in a via hole formed in the interlayer dielectric 15. Accordingly, the drain region of the memory transistor CT electrically connects to the source line (or bit line) via the silicide layer 11, contact plug 13, Al interconnection 14, and contact plug 16. The drain region of the select gate transistor ST electrically connects to the bit line (or source line) via the silicide layer 11, contact plug 13, and Al interconnection 14.

The gate electrode of the peripheral transistor PT has a single-layer structure. The peripheral transistor PT forms a peripheral circuit such as a decoder of the memory. In a nonvolatile memory embedded logic integrated circuit, the peripheral transistor PT forms a logic circuit or the like.

The gate electrode 8 of the peripheral transistor PT is made of, e.g., the same second polysilicon layer as the control gate electrode described above. The gate electrode 8 is formed on a gate insulating film 7 made of a silicon oxide film or the like formed on the major surface of the silicon substrate 1. The silicide layer 11 is formed on the gate electrode 8. The sidewall spacers 18 are formed on the sidewalls of this gate structure as well.

As described above, the first interlayer dielectric 12 covers the gate structure of the peripheral transistor PT, and the contact plugs 13 are buried in the contact holes formed in those positions of the interlayer dielectric 12, which correspond to the source and drain regions. The contact plugs 13 connect the source and drain regions 19 of the peripheral transistor PT to the Al interconnections 14 on the interlayer dielectric 12. The second interlayer dielectric 15 made of a silicon oxide film or the like is formed on the interlayer dielectric 12 and Al interconnections 14.

In the arrangement as described above, the silicide layer 11 connects the first polysilicon layer 4 and second polysilicon layer 8 of the select gate transistor ST. Since this makes an Al interconnection unnecessary, it is possible to shrink the memory cell and reduce the cost.

Also, there is no contact between the polysilicon layers, and the silicide layer 11 having a low resistance value connects the polysilicon layers. Therefore, the resistance value can be made lower than that when the polysilicon layers are in direct contact with each other.

Accordingly, the arrangement of the second embodiment of the present invention can reduce the parasitic resistance of the gate electrode of the select gate transistor ST.

Figure 29A:
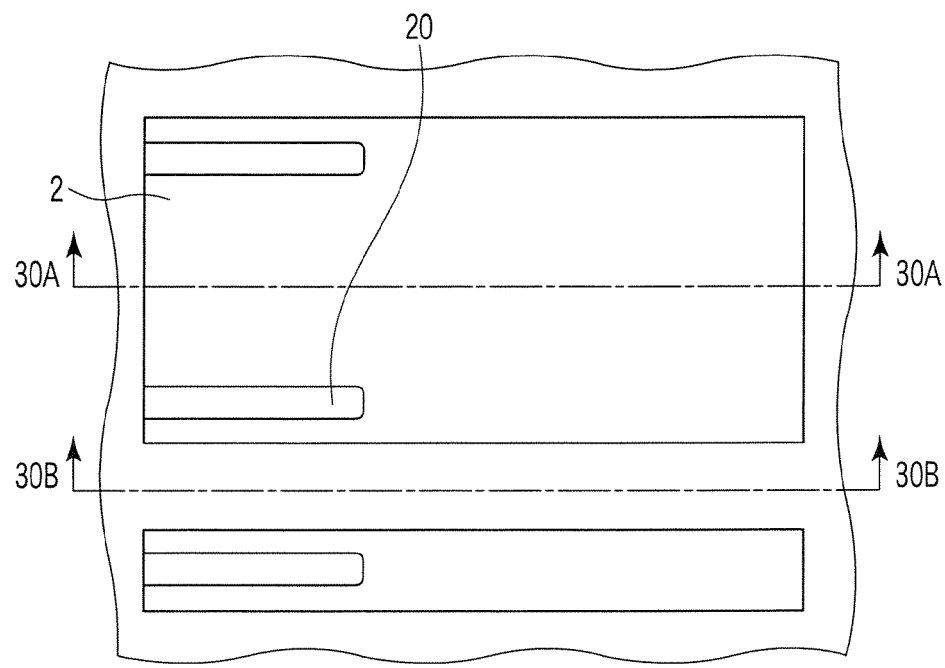
FIG. 29A is a plan view for explaining the semiconductor device fabrication method according to the second embodiment of the present invention, which shows the pattern of the memory cell portion in the third fabrication step by taking a flash EEPROM as an example.
Figure 29B:
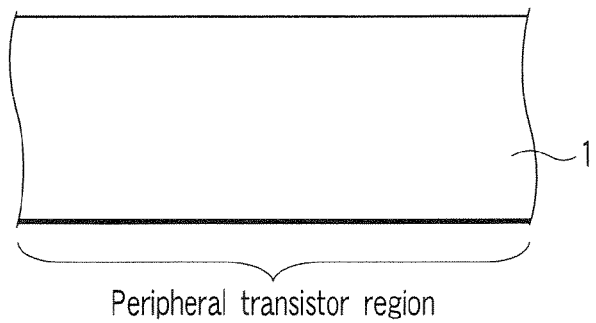
FIG. 29B is a sectional view for explaining the semiconductor device fabrication method according to the second embodiment of the present invention, which shows the peripheral transistor region in the third fabrication step by taking a flash EEPROM as an example.
Figure 30A:
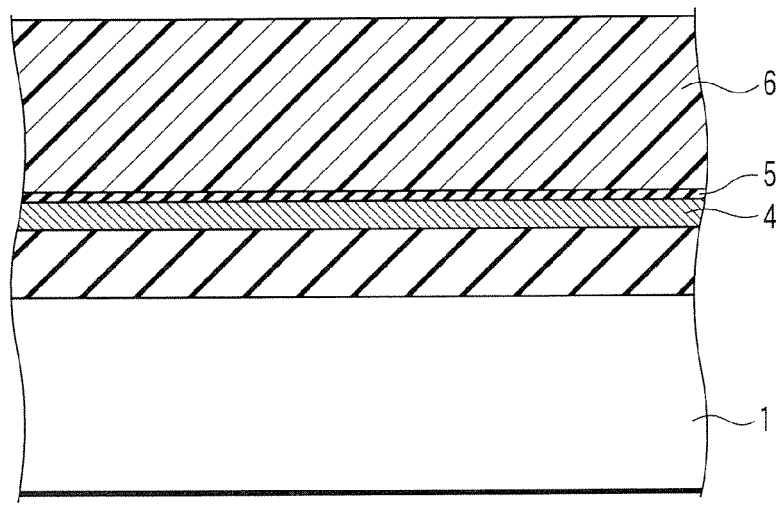
FIG. 30A is a sectional view for explaining the semiconductor device fabrication method according to the second embodiment of the present invention, which is taken along a line 30A-30A in FIG. 29A and shows the third fabrication step by taking a flash EEPROM as an example.
Figure 30B:
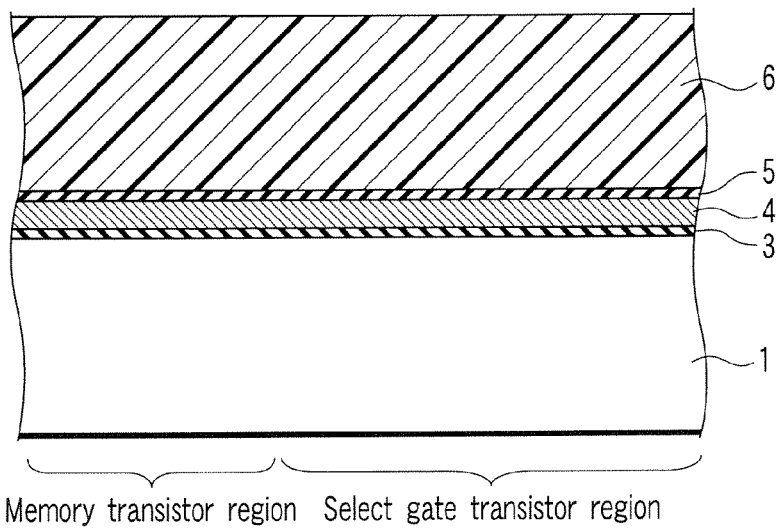
FIG. 30B is a sectional view for explaining the semiconductor device fabrication method according to the second embodiment of the present invention, which is taken along a line 30B-30B in FIG. 29A and shows the third fabrication step by taking a flash EEPROM as an example.
Figure 31A:
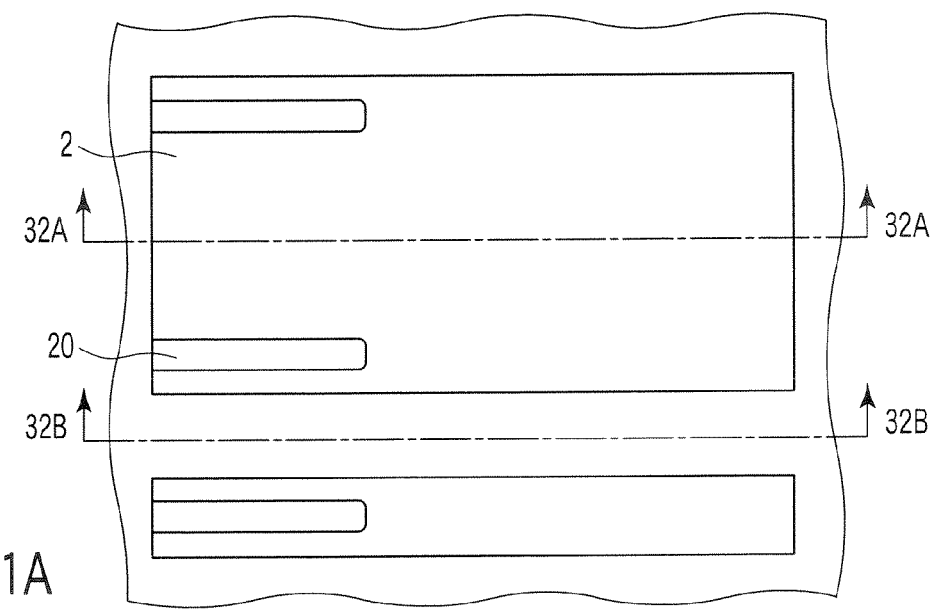
FIG. 31A is a plan view for explaining the semiconductor device fabrication method according to the second embodiment of the present invention, which shows the pattern of the memory cell portion in the fourth fabrication step by taking a flash EEPROM as an example.
Figure 31B:
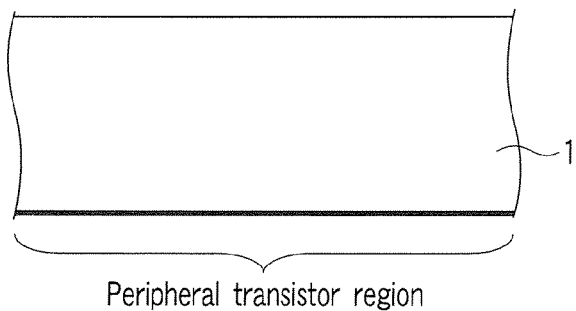
FIG. 31B is a sectional view for explaining the semiconductor device fabrication method according to the second embodiment of the present invention, which shows the peripheral transistor region in the fourth fabrication step by taking a flash EEPROM as an example.
Figure 32A:
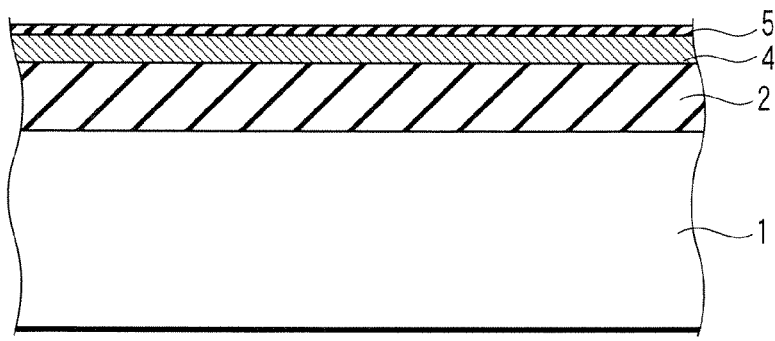
FIG. 32A is a sectional view for explaining the semiconductor device fabrication method according to the second embodiment of the present invention, which is taken along a line 32A-32A in FIG. 31A and shows the fourth fabrication step by taking a flash EEPROM as an example.
Figure 32B:
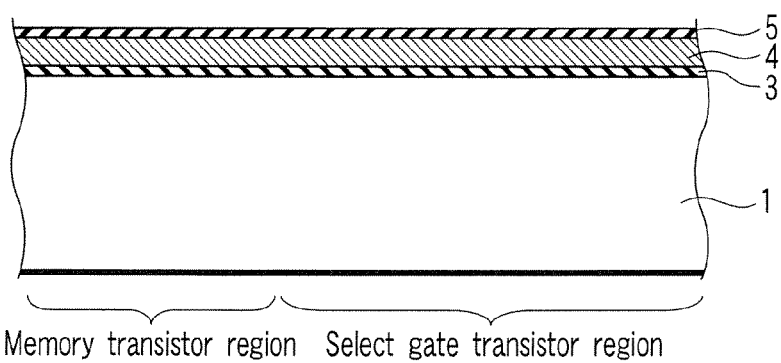
FIG. 32B is a sectional view for explaining the semiconductor device fabrication method according to the second embodiment of the present invention, which is taken along a line 32B-32B in FIG. 31A and shows the fourth fabrication step by taking a flash EEPROM as an example.
Figure 33A:
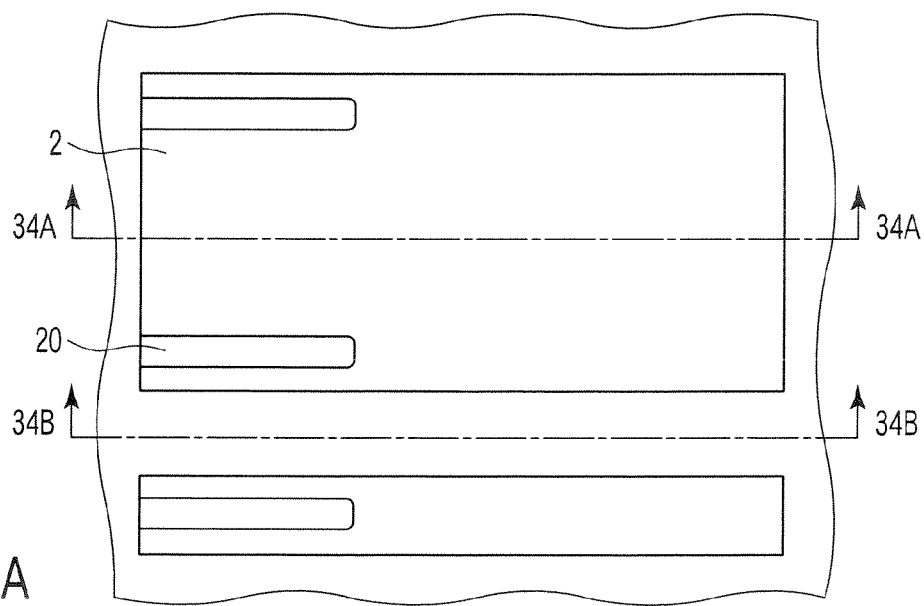
FIG. 33A is a plan view for explaining the semiconductor device fabrication method according to the second embodiment of the present invention, which shows the pattern of the memory cell portion in the fifth fabrication step by taking a flash EEPROM as an example.
Figure 33B:
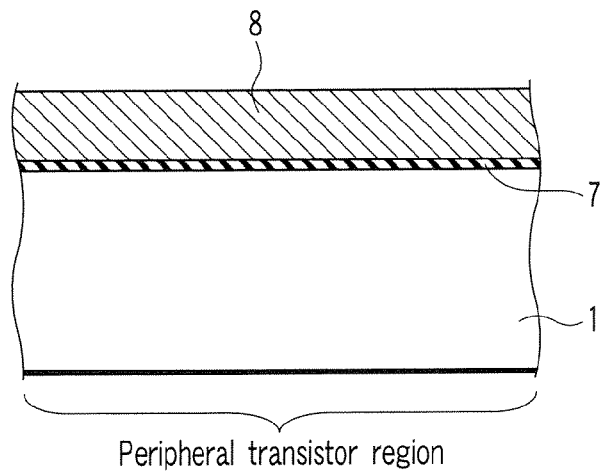
FIG. 33B is a sectional view for explaining the semiconductor device fabrication method according to the second embodiment of the present invention, which shows the peripheral transistor region in the fifth fabrication step by taking a flash EEPROM as an example.
Figure 34A:
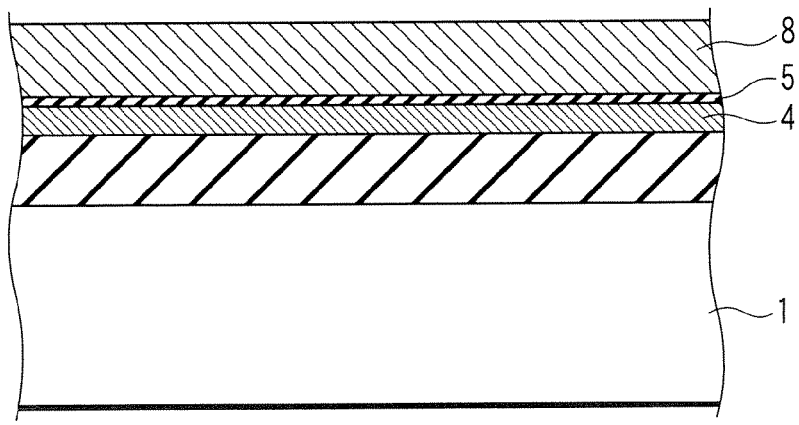
FIG. 34A is a sectional view for explaining the semiconductor device fabrication method according to the second embodiment of the present invention, which is taken along a line 34A-34A in FIG. 33A and shows the fifth fabrication step by taking a flash EEPROM as an example.
Figure 34B:
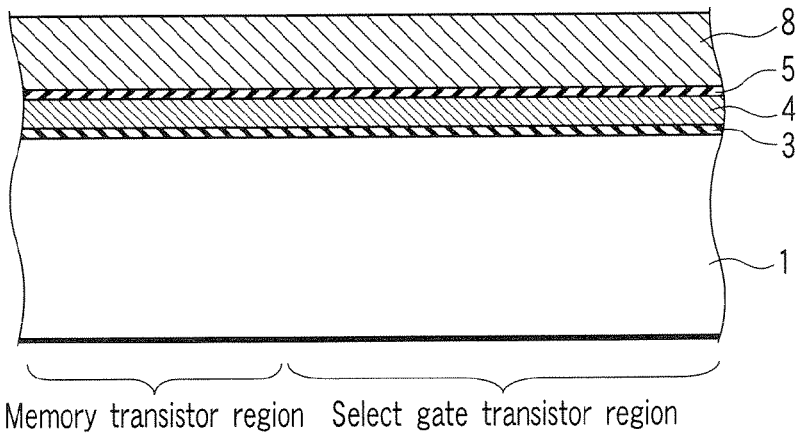
FIG. 34B is a sectional view for explaining the semiconductor device fabrication method according to the second embodiment of the present invention, which is taken along a line 34B-34B in FIG. 33A and shows the fifth fabrication step by taking a flash EEPROM as an example.
Figure 35A:
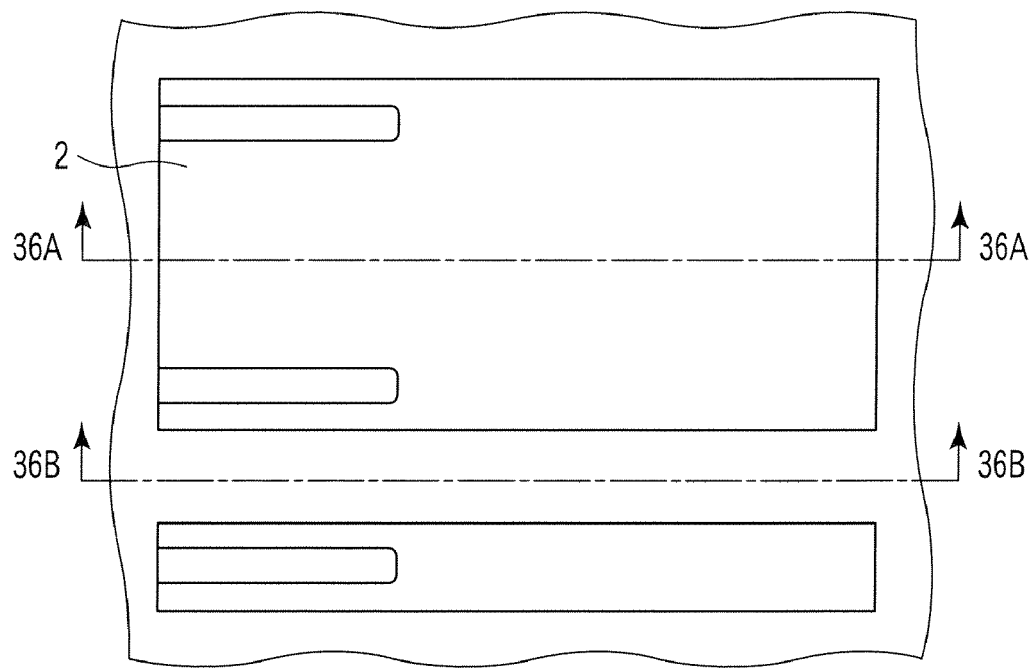
FIG. 35A is a plan view for explaining the semiconductor device fabrication method according to the second embodiment of the present invention, which shows the pattern of the memory cell portion in the sixth fabrication step by taking a flash EEPROM as an example.
Figure 35B:
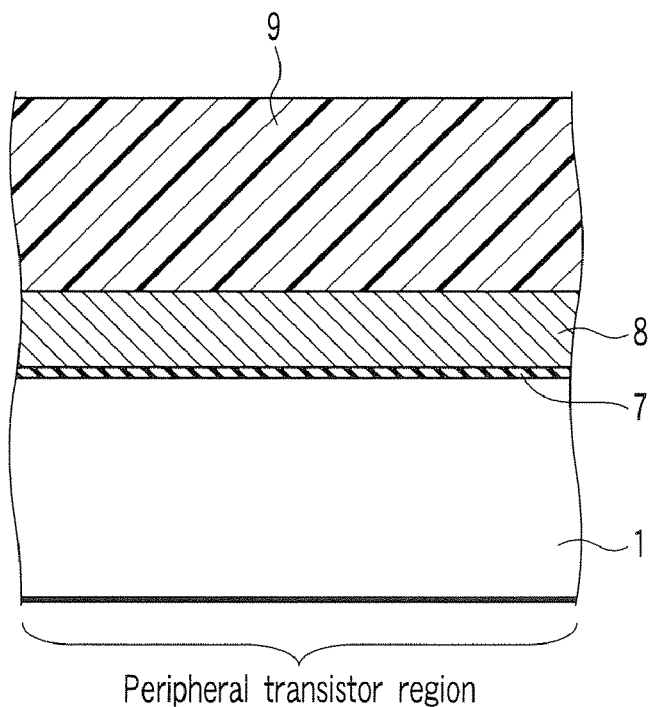
FIG. 35B is a sectional view for explaining the semiconductor device fabrication method according to the second embodiment of the present invention, which shows the peripheral transistor region in the sixth fabrication step by taking a flash EEPROM as an example.
Figure 37A:
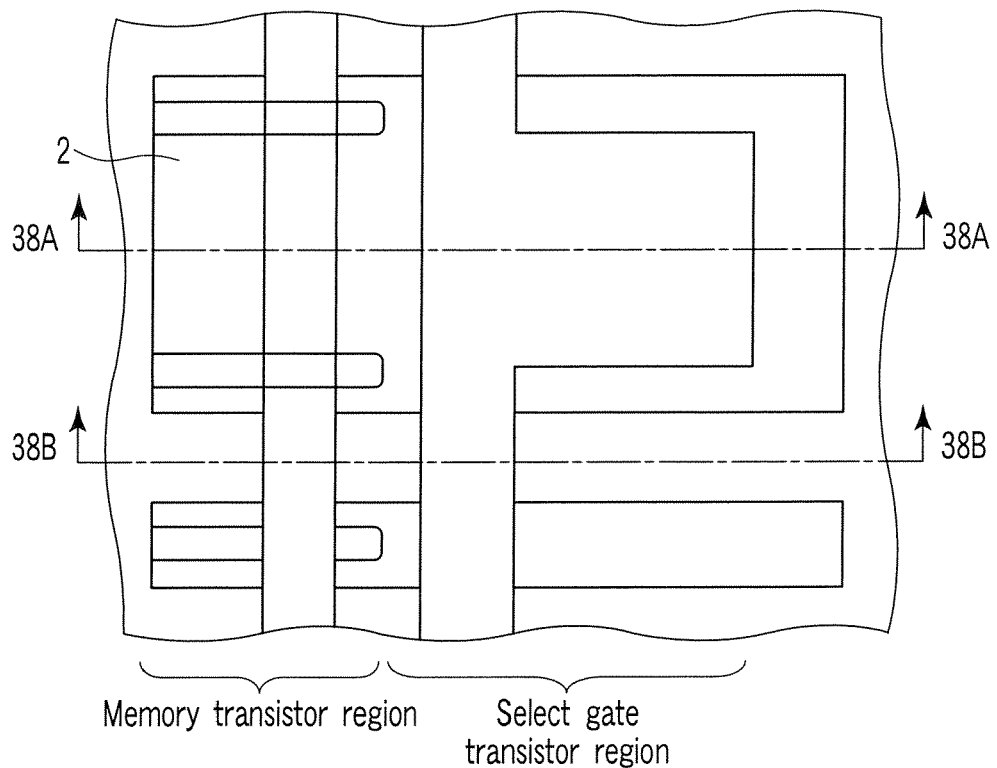
FIG. 37A is a plan view for explaining the semiconductor device fabrication method according to the second embodiment of the present invention, which shows the pattern of the memory cell portion in the seventh fabrication step by taking a flash EEPROM as an example.
Figure 37B:
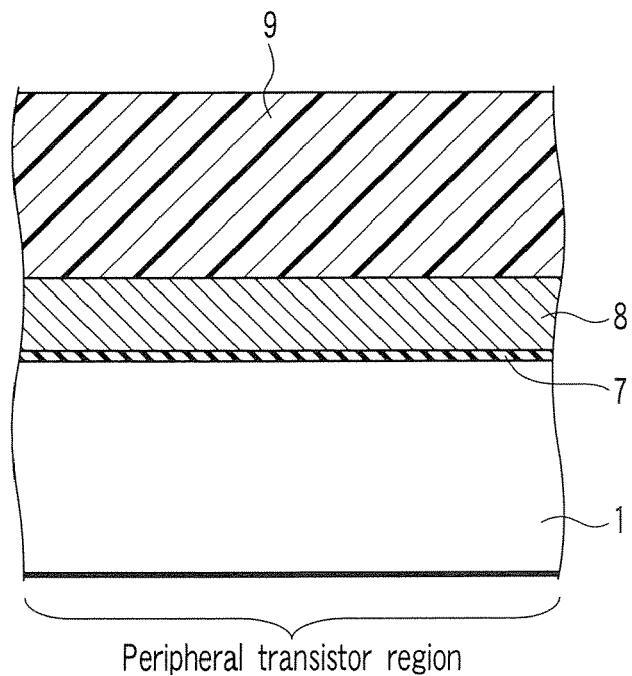
FIG. 37B is a sectional view for explaining the semiconductor device fabrication method according to the second embodiment of the present invention, which shows the peripheral transistor region in the seventh fabrication step by taking a flash EEPROM as an example.
Figure 38A:
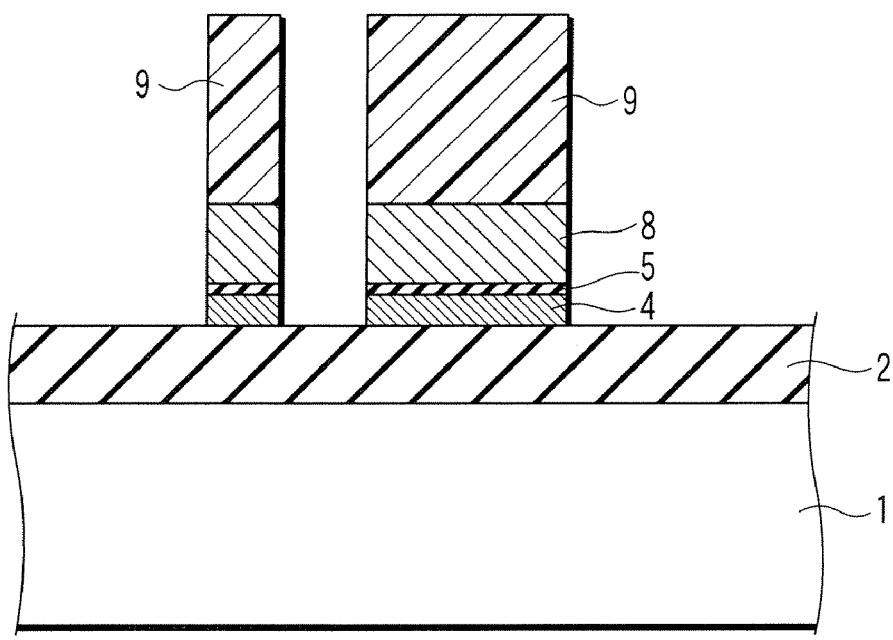
FIG. 38A is a sectional view for explaining the semiconductor device fabrication method according to the second embodiment of the present invention, which is taken along a line 38A-38A in FIG. 37A and shows the seventh fabrication step by taking a flash EEPROM as an example.
Figure 38B:
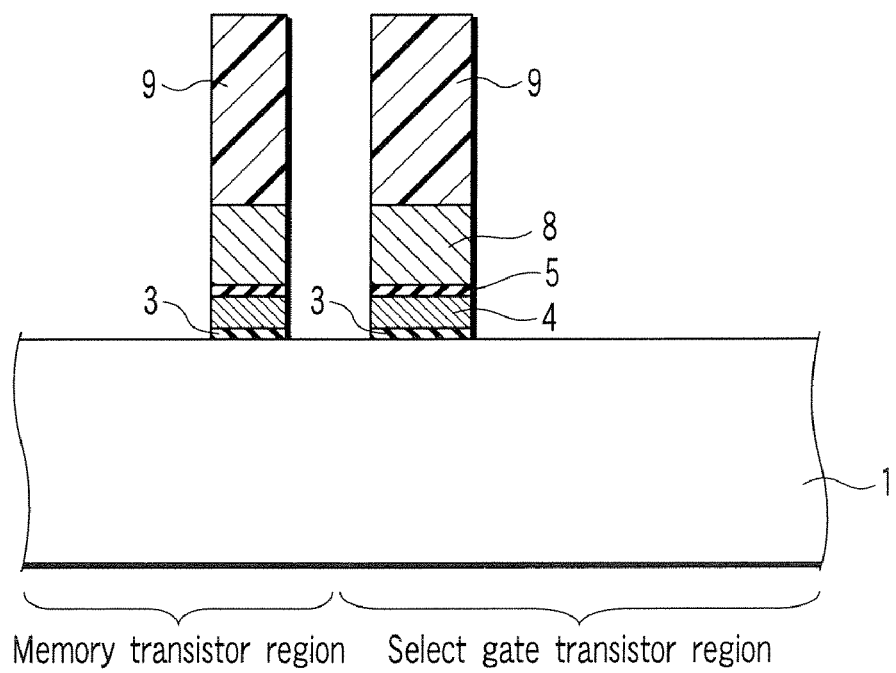
FIG. 38B is a sectional view for explaining the semiconductor device fabrication method according to the second embodiment of the present invention, which is taken along a line 38B-38B in FIG. 37A and shows the seventh fabrication step by taking a flash EEPROM as an example.
Figure 41A:
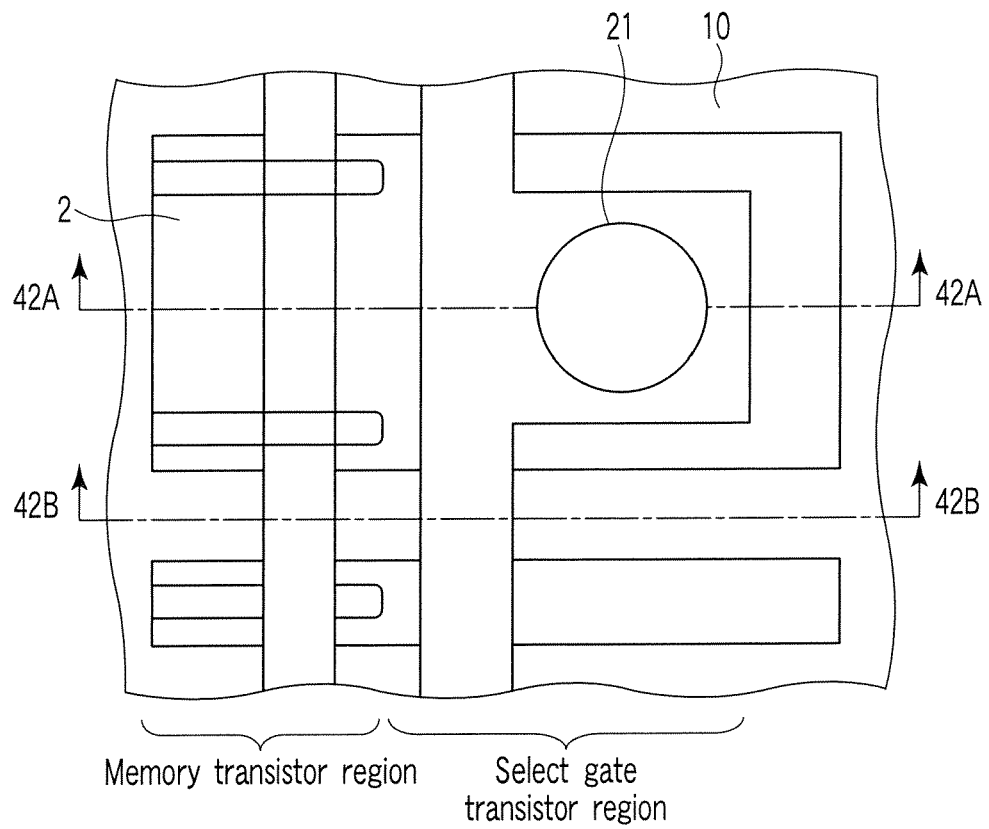
FIG. 41A is a plan view for explaining the semiconductor device fabrication method according to the second embodiment of the present invention, which shows the pattern of the memory cell portion in the ninth fabrication step by taking a flash EEPROM as an example.
Figure 41B:
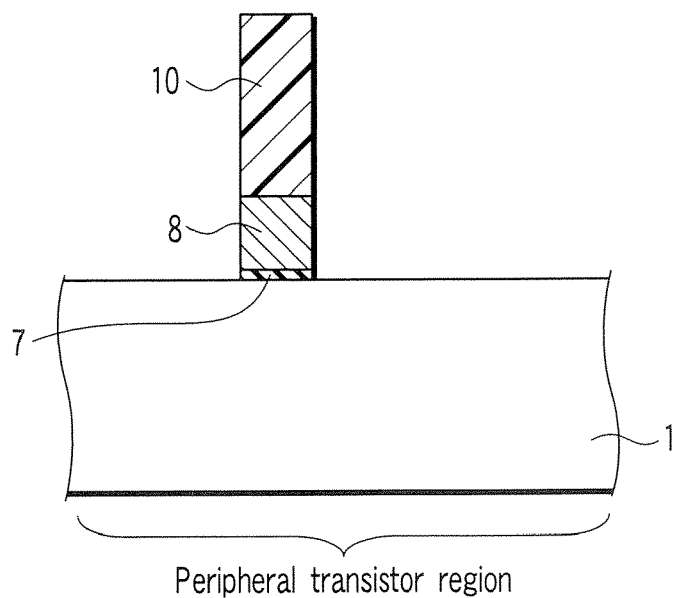
FIG. 41B is a sectional view for explaining the semiconductor device fabrication method according to the second embodiment of the present invention, which shows the peripheral transistor region in the ninth fabrication step by taking a flash EEPROM as an example.
Figure 43A:
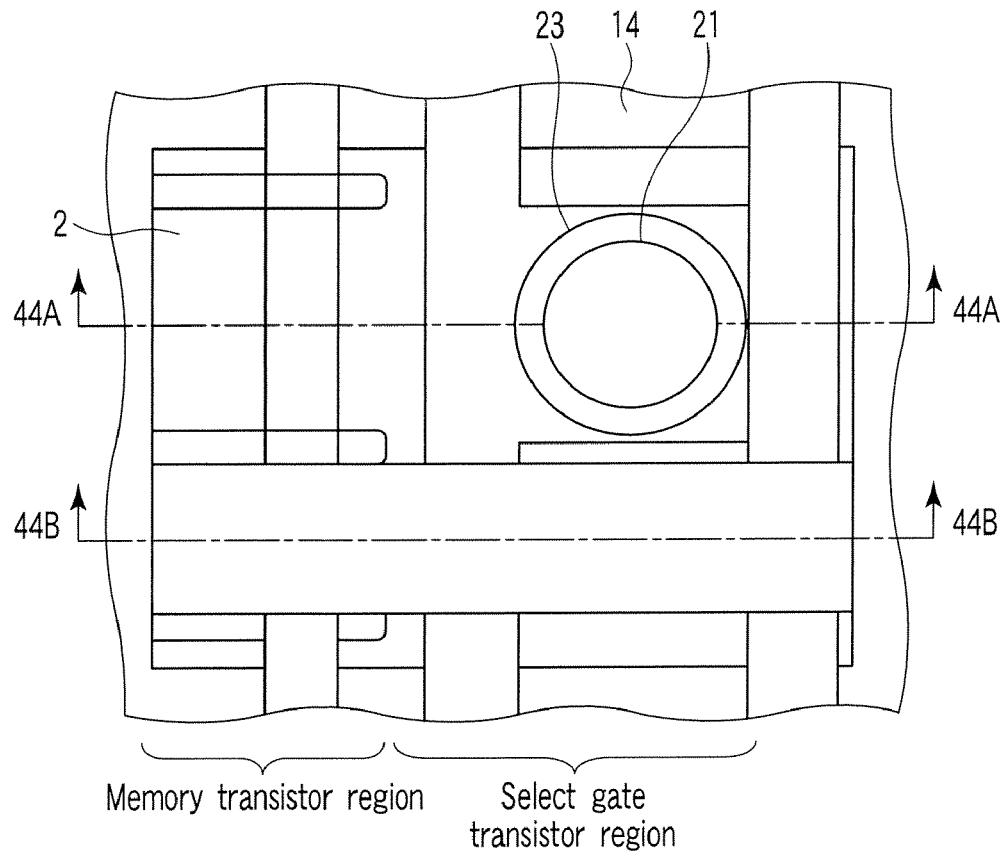
FIG. 43A is a plan view for explaining the semiconductor device fabrication method according to the second embodiment of the present invention, which shows the pattern of the memory cell portion in the 10th fabrication step by taking a flash EEPROM as an example.
Figure 43B:
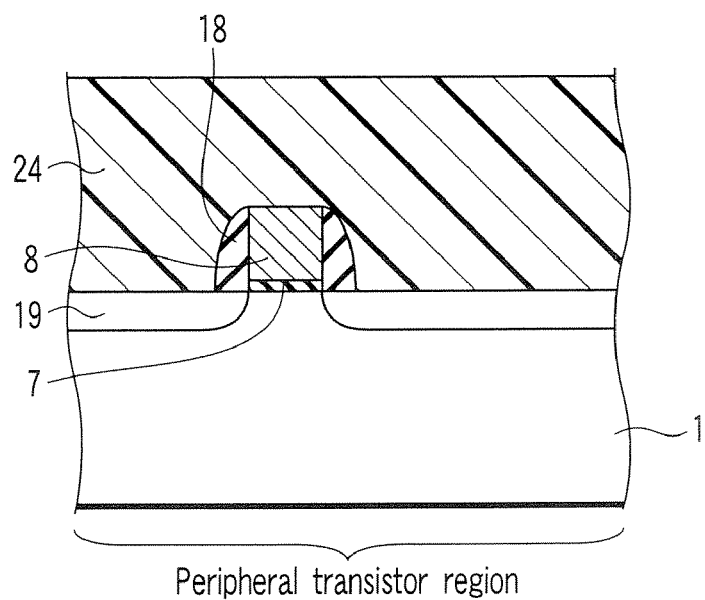
FIG. 43B is a sectional view for explaining the semiconductor device fabrication method according to the second embodiment of the present invention, which shows the peripheral transistor region in the 10th fabrication step by taking a flash EEPROM as an example.
Figure 44A:
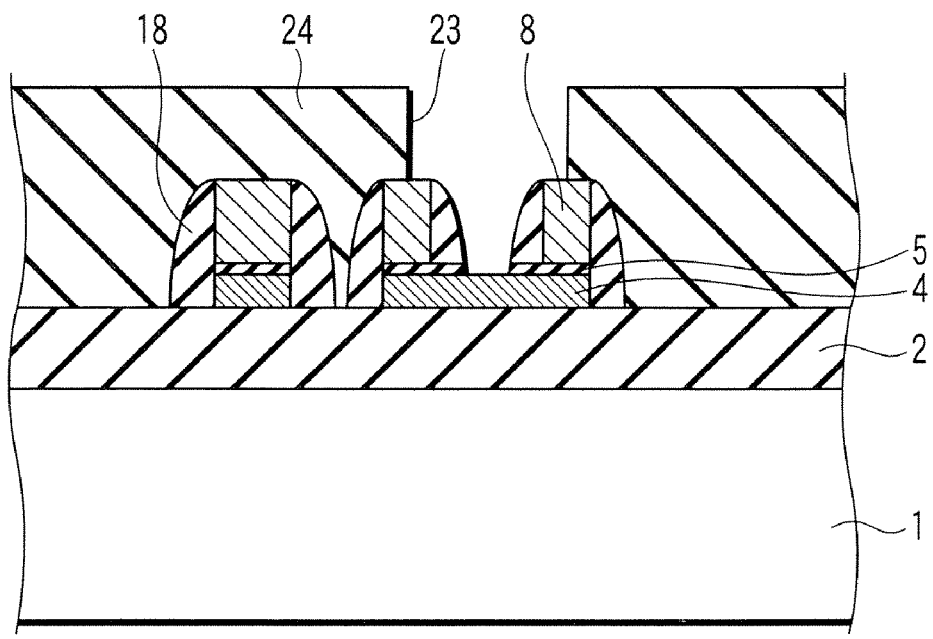
FIG. 44A is a sectional view for explaining the semiconductor device fabrication method according to the second embodiment of the present invention, which is taken along a line 44A-44A in FIG. 43A and shows the 10th fabrication step by taking a flash EEPROM as an example.
Figure 44B:
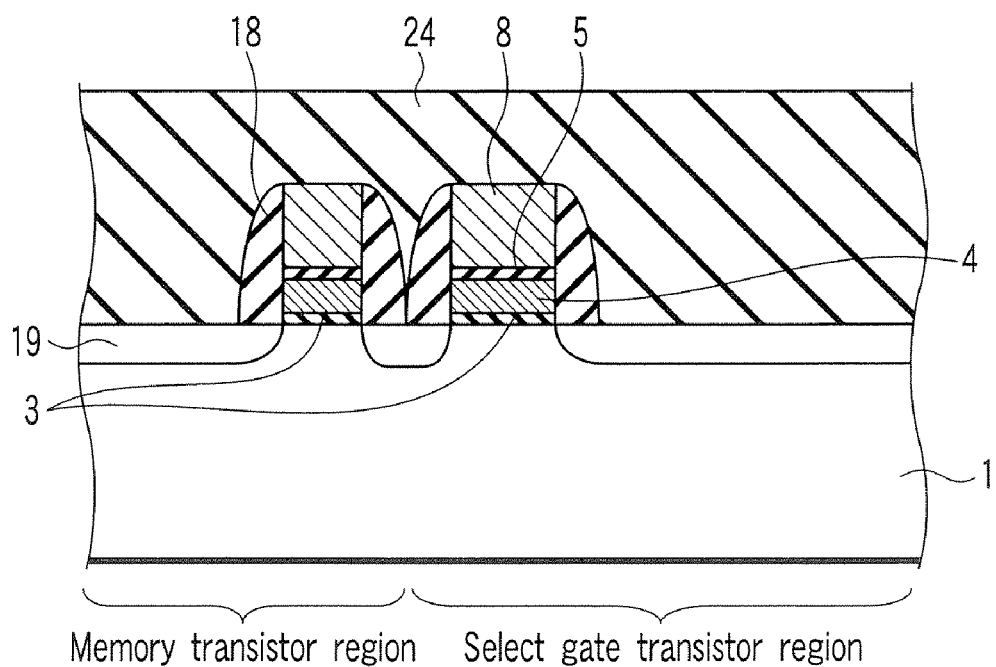
FIG. 44B is a sectional view for explaining the semiconductor device fabrication method according to the second embodiment of the present invention, which is taken along a line 44B-44B in FIG. 43A and shows the 10th fabrication step by taking a flash EEPROM as an example.
Figure 47A:
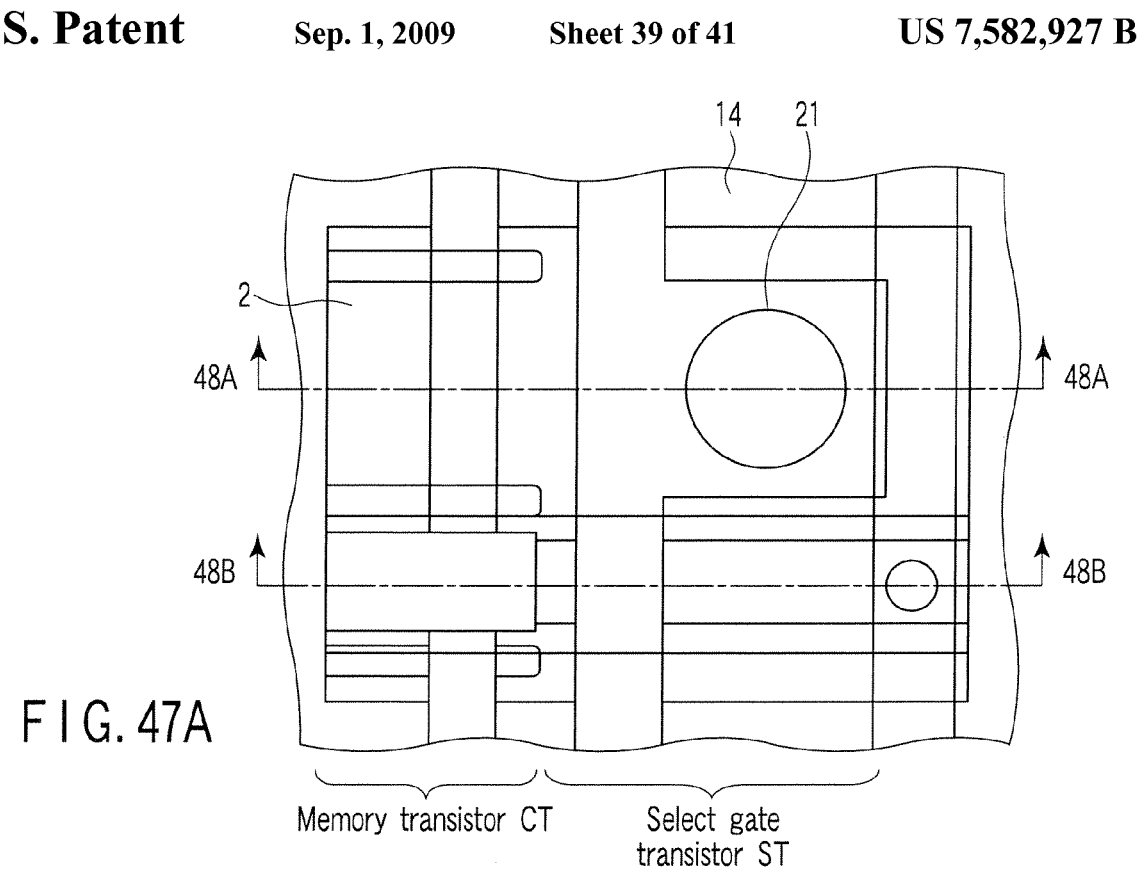
FIG. 47A is a plan view for explaining the semiconductor device fabrication method according to the second embodiment of the present invention, which shows the pattern of the memory cell portion in the 12th fabrication step by taking a flash EEPROM as an example.
Figure 47B:
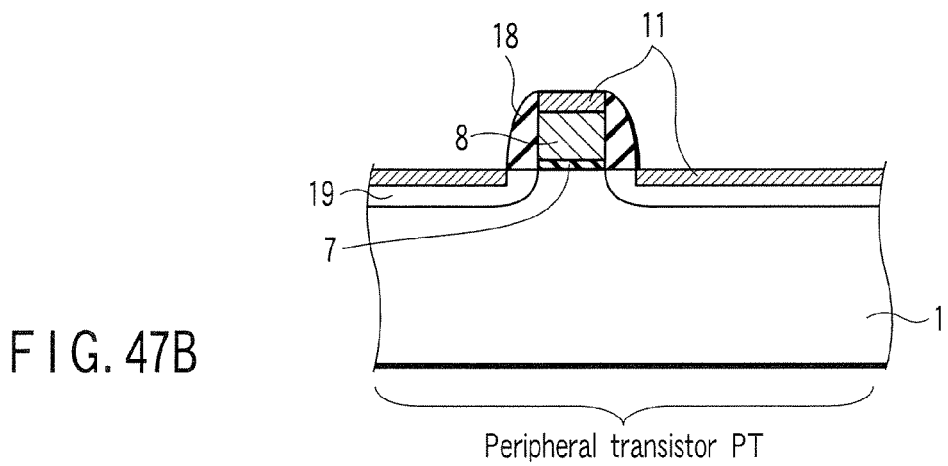
FIG. 47B is a sectional view for explaining the semiconductor device fabrication method according to the second embodiment of the present invention, which shows the peripheral transistor region in the 12th fabrication step by taking a flash EEPROM as an example.
Figure 48A:
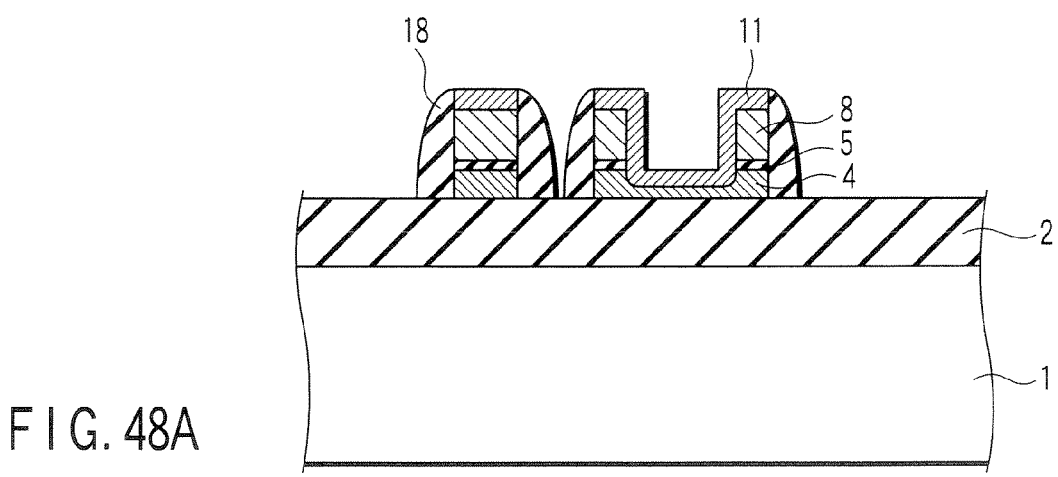
FIG. 48A is a sectional view for explaining the semiconductor device fabrication method according to the second embodiment of the present invention, which is taken along a line 48A-48A in FIG. 47A and shows the 12th fabrication step by taking a flash EEPROM as an example.
Figure 48B:
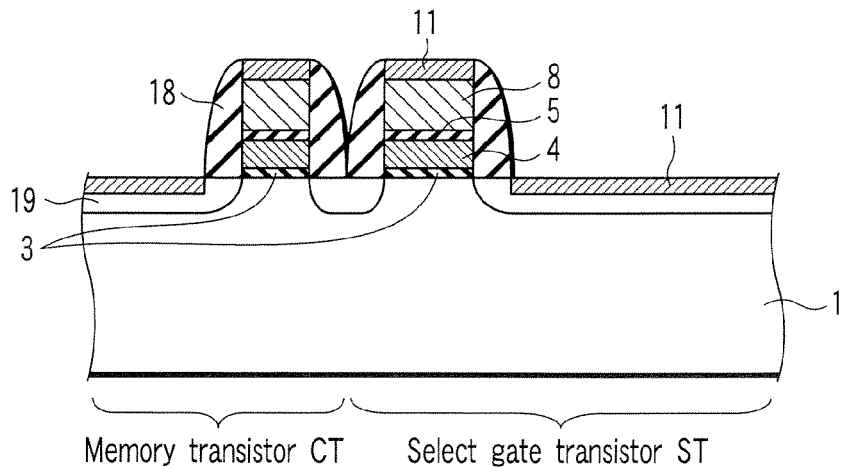
FIG. 48B is a sectional view for explaining the semiconductor device fabrication method according to the second embodiment of the present invention, which is taken along a line 48B-48B in FIG. 47A and shows the 12th fabrication step by taking a flash EEPROM as an example.
Figure 49A:
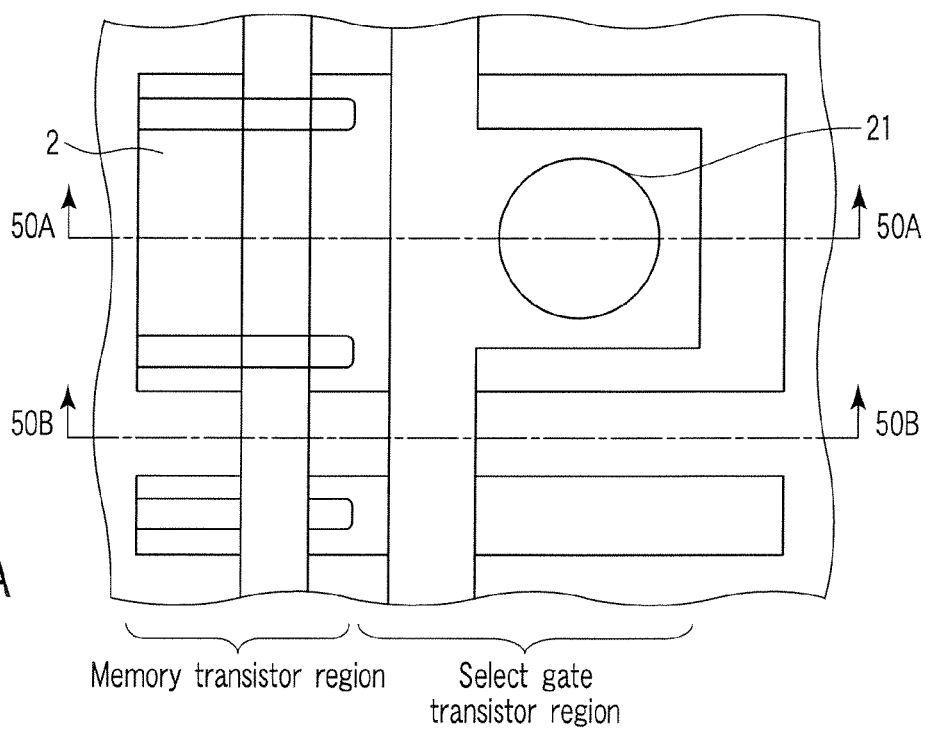
FIG. 49A is a plan view for explaining the semiconductor device fabrication method according to the second embodiment of the present invention, which shows the pattern of the memory cell portion in the 13th fabrication step by taking a flash EEPROM as an example.
Figure 49B:
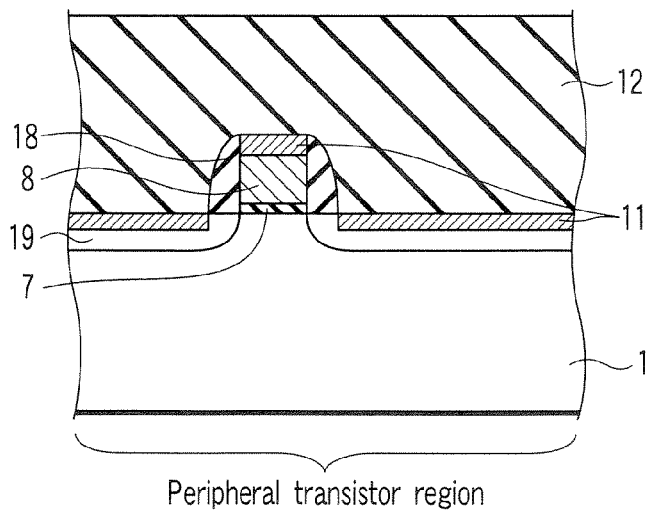
FIG. 49B is a sectional view for explaining the semiconductor device fabrication method according to the second embodiment of the present invention, which shows the peripheral transistor region in the 13th fabrication step by taking a flash EEPROM as an example.

A method of fabricating the flash EEPROM shown in FIGS. 23A, 23B, 24A, and 24B will be explained below with reference to FIGS. 25A and 25B to 50A and 50B. FIGS. 25A, 27A, 29A, 31A, 33A, 35A, 37A, 39A, 41A, 43A, 45A, 47A, and 49A are plan views sequentially showing the fabrication steps of the flash EEPROM, each of which shows the pattern of a memory cell portion. These fabrication steps correspond to FIG. 23A. FIGS. 25B, 27B, 29B, 31B, 33B, 35B, 37B, 39B, 41B, 43B, 45B, 47B, and 49B are sectional views sequentially showing the fabrication steps of a peripheral transistor. These fabrication steps correspond to FIG. 23B. Also, FIGS. 26A, 28A, 30A, 32A, 34A, 36A, 38A, 40A, 42A, 44A, 46A, 48A, and 50A are sectional views sequentially showing the fabrication steps of the memory cell portion, and respectively taken along a line 26A-26A in FIG. 25A, a line 28A-28A in FIG. 27A, a line 30A-30A in FIG. 29A, a line 32A-32A in FIG. 31A, a line 34A-34A in FIG. 33A, a line 36A-36A in FIG. 35A, a line 38A-38A in FIG. 37A, a line 40A-40A in FIG. 39A, a line 42A-42A in FIG. 41A, a line 44A-44A in FIG. 43A, a line 46A-46A in FIG. 45A, a line 48A-48A in FIG. 47A, and a line 50A-50A in FIG. 49A. These fabrication steps correspond to FIG. 24A. In addition, FIGS. 26B, 28B, 30B, 32B, 34B, 36B, 38B, 40B, 42B, 44B, 46B, 48B, and 50B are sectional views sequentially showing the fabrication steps of the memory cell portion, and respectively taken along a line 26B-26B in FIG. 25A, a line 28B-28B in FIG. 27A, a line 30B-30B in FIG. 29A, a line 32B-32B in FIG. 31A, a line 34B-34B in FIG. 33A, a line 36B-36B in FIG. 35A, a line 38B-38B in FIG. 37A, a line 40B-40B in FIG. 39A, a line 42B-42B in FIG. 41A, a line 44B-44B in FIG. 43A, a line 46B-46B in FIG. 45A, a line 48B-48B in FIG. 47A, and a line 50B-50B in FIG. 49A. These fabrication steps correspond to FIG. 24B.

Figure 25A:
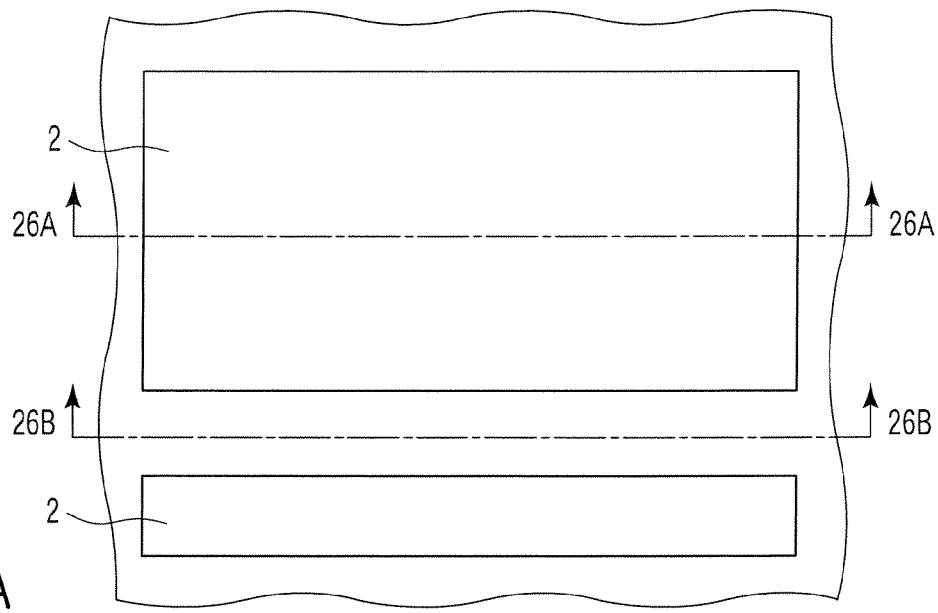
FIG. 25A is a plan view for explaining a semiconductor device fabrication method according to the second embodiment of the present invention, which shows the pattern of a memory cell portion in the first fabrication step by taking a flash EEPROM as an example.
Figure 25B:
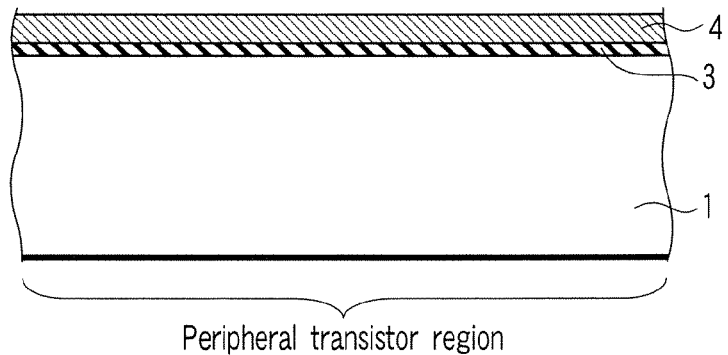
FIG. 25B is a sectional view for explaining the semiconductor device fabrication method according to the second embodiment of the present invention, which shows a peripheral transistor region in the first fabrication step by taking a flash EEPROM as an example.
Figure 26A:
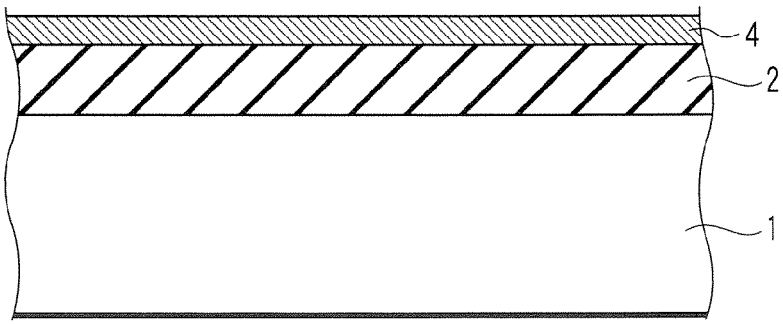
FIG. 26A is a sectional view for explaining the semiconductor device fabrication method according to the second embodiment of the present invention, which is taken along a line 26A-26A in FIG. 25A and shows the first fabrication step by taking a flash EEPROM as an example.
Figure 26B:
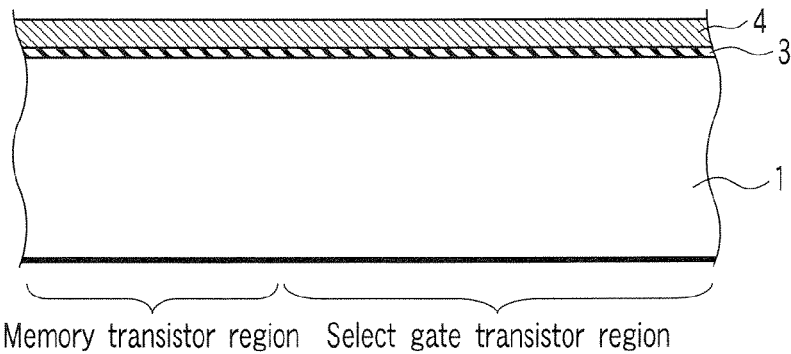
FIG. 26B is a sectional view for explaining the semiconductor device fabrication method according to the second embodiment of the present invention, which is taken along a line 26B-26B in FIG. 25A and shows the first fabrication step by taking a flash EEPROM as an example.
Figure 28B:
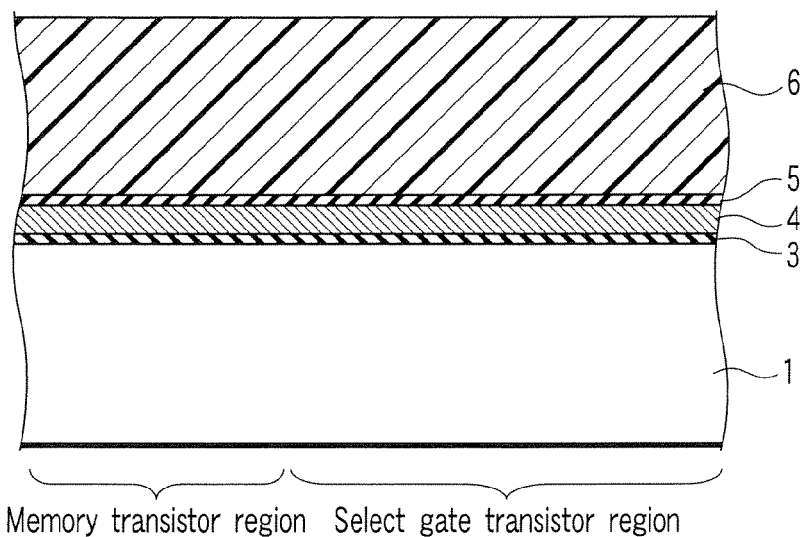
FIG. 28B is a sectional view for explaining the semiconductor device fabrication method according to the second embodiment of the present invention, which is taken along a line 28B-28B in FIG. 27A and shows the second fabrication step by taking a flash EEPROM as an example.

First, as shown in FIGS. 25A and 26A, element isolation films 2 are selectively formed on the major surface of a silicon substrate 1. An impurity is ion-implanted (channel ion implantation) into an element region electrically isolated by the element isolation films 2 such that each transistor has a desired threshold voltage. After that, as shown in FIGS. 25B and 26B, a silicon oxide film (gate insulating film) 3 is formed by thermal oxidation on the major surface of the substrate 1 in the element region, and a polysilicon layer 4 is formed on the silicon oxide film 3 by CVD. The polysilicon layer 4 is also formed on the element isolation films 2. In this step, an impurity such as phosphorus (P) is doped into the polysilicon layer 4 to decrease the sheet resistance of polysilicon to 100 to 200 $\Omega/\Box$, thereby reducing the parasitic resistance.

Then, to separate a first gate electrode (floating gate electrode) of a memory transistor CT into cells, a pattern is transferred to a photoresist (not shown) by lithography, and anisotropic etching is performed by RIE (Reactive Ion Etching). Consequently, as shown in FIG. 27A, holes or slit-like openings 20 for separating the polysilicon layer 4 are transferred to the polysilicon layer 4. After that, the photoresist is removed.

Next, as shown in FIGS. 27A, 27B, 28A, and 28B, an insulating film (ONO film) 5 is formed on the polysilicon layer 4 by sequentially stacking a silicon oxide film, silicon nitride film, and silicon oxide film by CVD or the like. The ONO film 5 functions as an insulating film between polysilicon layers, i.e., as a so-called inter-poly insulating film. Subsequently, a photoresist 6 is formed by coating to perform selective etching for removing the silicon oxide film 3, polysilicon layer 4, and ONO film 5 formed in a peripheral transistor region (a region where the gate electrode has a single-layer structure), and a pattern is transferred by lithography. In this state, the photoresist 6 covers the memory cell portion, and the ONO film 5 in the peripheral transistor region is exposed.

Then, as shown in FIGS. 29A, 29B, 30A, and 30B, the photoresist 6 is used as a mask to remove the ONO film 5 in the peripheral transistor region by RIE, remove the polysilicon layer 4 by isotropic etching performed by CDE, and remove the silicon oxide film 3 by wet etching using, e.g., $NH_4F$. This exposes the major surface of the silicon substrate 1 in the peripheral transistor region. Removing the photoresist 6 after that forms a structure as shown in FIGS. 31A, 31B, 32A, and 32B.

After that, as shown in FIGS. 33A, 33B, 34A, and 34B, a silicon oxide film (third gate insulating film) 7 is formed on the major surface of the silicon substrate 1 in the peripheral transistor region, and a polysilicon layer 8 is formed on the silicon oxide film 7 and ONO film 5 by CVD.

The fabrication steps up to this point form a region (memory cell portion) having a two-layer polysilicon structure and a region (peripheral transistor region) having a single-layer polysilicon structure on the silicon substrate 1.

Next, as shown in FIGS. 35A, 35B, 36A, and 36B, the pattern of the gate electrodes of a memory transistor CT and select gate transistor ST each having a two-layer polysilicon structure is transferred to a photoresist 9 by lithography. In this step, the photoresist 9 masks the entire surface of the peripheral transistor region having a single-layer polysilicon structure.

Subsequently, as shown in FIGS. 37A, 37B, 38A, and 38B, the photoresist 9 is used as a mask to sequentially anisotropically etch the polysilicon layer 8, ONO film 5, polysilicon layer 4, and gate insulating film 3 by RIE, thereby forming the gate electrodes of the memory transistor CT and select gate transistor ST.

After that, as shown in FIGS. 39A, 39B, 40A, and 40B, the pattern of the gate electrode of the peripheral transistor region having a single-layer polysilicon structure is transferred to a photoresist 10 by lithography. In this step, the photoresist 10 masks the regions having a two-layer polysilicon structure. However, to form a contact portion for extracting the first gate electrode 4 of the select gate transistor, a hole is formed in a prospective contact region of the photoresist 10 as shown in FIGS. 39A and 40A. Subsequently, the photoresist 10 is used as a mask to anisotropically etch the polysilicon layer 8, pattern the gate electrode of the peripheral transistor region, and simultaneously form a through hole 21 for forming the contact portion for extracting the first gate electrode 4 of the select gate transistor (FIGS. 41A, 41B, 42A, and 42B).

Then, the photoresist 10 is removed. As shown in FIGS. 43A, 43B, 44A, and 44B, a diffusion layer is formed by selectively doping an impurity into the major surface region of the silicon substrate 1, in order to form a source or drain region 19 of each transistor in the memory cell portion and peripheral transistor region. After that, a silicon nitride film or the like is formed by CVD and etched back by anisotropic etching such as RIE, thereby forming sidewall spacers 18 on the side surfaces of each gate electrode structure. At the same time, a contact portion for extracting the gate electrode 4 is formed by removing the ONO film 5 in the through hole 21 of the select gate transistor by anisotropic etching such as RIE. Subsequently, the entire surface is coated with a photoresist 24, the pattern of a contact portion for extracting the electrode is transferred to the photoresist 24, and anisotropic etching is performed by RIE through a through hole (opening) 23, thereby simultaneously removing the sidewall spacers 18 formed on the inner walls of the through hole 21 and the ONO film 5 (FIGS. 45A, 45B, 46A, and 46B).

After that, the photoresist 24 is removed, and a metal film (e.g., Co) is formed on the silicon substrate 1 by sputtering. The silicon substrate 1 is then annealed to cause a silicidation reaction in a portion where silicon and the metal film are in contact with each other as shown in FIGS. 47A, 47B, 48A, and 48B. Normally, the silicide layer formed in this stage is left behind, and the unreacted metal film is removed by etching. This step forms silicide layers 11 on the control gate electrode 8 and the source or drain region 19 of the memory transistor CT, on the exposed surface of the gate electrode and the source or drain region 19 of the select gate transistor ST, and on the gate electrode and the source and drain regions 19 of a peripheral transistor PT. Since the sidewall spacers 18 on the inner walls of the through hole 21 serving as a contact extracting portion for the first polysilicon layer 4 of the select gate transistor ST have been removed, the side surfaces of the second polysilicon layer 8 and the surface of the first polysilicon layer 4 are also exposed, so the silicide layer 11 is also formed in the through hole 21. Accordingly, the silicide layer 11 is formed on the upper surface of the gate electrode 8 of the select gate transistor ST, on the inner sidewalls of the through hole 21, and on the first gate electrode 4 positioned in the bottom portion of the through hole 21, and electrically connects the first polysilicon layer 4 and second polysilicon layer 8. After that, the resistance of the silicide layers 11 is decreased (to 5 to 20 $\Omega/\square$) by performing annealing for the second time.

As shown in FIGS. 49A, 49B, 50A, and 50B, an interlayer dielectric 12 such as a BPSG film or PSG film then covers the entire surface of the gate electrode structure formed as described above. Subsequently, the pattern of a contact portion for extracting the electrode is transferred to a photoresist by photolithography, anisotropic etching is performed by RIE, and the photoresist is removed.

Next, as shown in FIGS. 23A, 23B, 24A, and 24B, contact holes are formed in the interlayer dielectric 12, and tungsten (W) is deposited by CVD. Contact plugs 13 are formed by removing extra tungsten (W) on the interlayer dielectric 12 by CMP.

Then, Al is deposited on the entire surface by sputtering, and an interconnection pattern is transferred to a photoresist by lithography. Subsequently, Al is patterned by anisotropic etching performed by RIE using the photoresist as a mask, and the photoresist is removed to form first Al interconnections 14 (100 to 200 m$\Omega/\square$).

In this step, the parasitic resistance can be decreased by backing the gate electrode 4 (100 to 200 $\Omega/\square$) made of the first polysilicon layer 4 of the select gate transistor ST with a silicide layer having a low resistance value (5 to 20 $\Omega/\square$) for every few cells of memory cells arranged in the form of an array.

To protect the Al interconnections 14, a silicon oxide film 15 is deposited by CVD. After that, a pattern is transferred to a photoresist by lithography, and the photoresist is used as a mask to perform anisotropic etching by RIE and then removed, thereby forming a via hole. After the via hole is formed, Al is deposited by sputtering, a second interconnection pattern is transferred to a photoresist by lithography, and the photoresist is used as a mask to perform anisotropic etching by RIE or the like, thereby forming a second Al interconnection 17. The photoresist is then removed.

Next, although not shown, PSG is deposited on the entire surface, and a silicon nitride film is deposited by PE-CVD, in order to protect the Al interconnection 17. Subsequently, the protective films such as the PSG film and silicon nitride film are coated with a photoresist, and a pattern for forming a hole on a bonding pad is transferred by lithography. This photoresist is used as a mask to etch away the protective films on the bonding pad and then removed, thereby completing a wafer.

The above fabrication method forms the through hole (opening) 22 in the second polysilicon layer 8 and ONO film 5 of the select gate transistor ST when patterning the polysilicon layer by etching in order to form the gate electrode of the peripheral transistor PT. Also, when the silicide layer 11 for reducing the wiring resistance is formed, the silicide layer 11 electrically connects the lower gate electrode 4 and upper gate electrode 8 of the select gate transistor ST. This avoids the fabrication process from being complicated.

In addition, no Al interconnection connecting to the gate electrode (polysilicon layer 4) of the select gate transistor ST is necessary. This obviates the need for a space to an Al interconnection such as a source line or bit line, and makes it possible to decrease the memory cell size and reduce the cost. It is also possible to reduce the parasitic capacitance between the source line or bit line and the Al interconnection to the select gate transistor.

Accordingly, the second embodiment of the present invention can provide a semiconductor device capable of reducing the parasitic resistance of the gate electrode of the select gate transistor ST.

The second embodiment can also provide a semiconductor device fabrication method capable of shrinking a memory cell and simplifying the fabrication process while increasing the degree of freedom of the layout of Al interconnections.

As described above, according to one aspect of this invention, there is provided a semiconductor device capable of reducing the parasitic resistance of the gate electrode of a transistor.

There is also provided a semiconductor device fabrication method capable of shrinking a memory cell and simplifying the fabrication process while increasing the degree of freedom of the layout of Al interconnections.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a memory transistor having a stacked gate structure formed by sequentially stacking a gate insulating film, a first gate electrode, a inter-poly insulating film, and a second gate electrode on a semiconductor substrate;
a select gate transistor which has a stacked gate structure identical to the memory transistor, and selects the memory transistor;
a first contact plug buried in a through hole and electrically connecting the second gate electrode and the first gate electrode, the through hole is formed in the second gate electrode and the inter-poly insulating film positioned on an element isolation film in the select gate transistor, and reaching the first gate electrode; and
a peripheral transistor which forms a peripheral circuit of a memory cell including the memory transistor and the select gate transistor, and includes a gate electrode with a single-layer structure.

2. A device according to claim 1, which further comprises a first interlayer dielectric formed on the memory transistor, the select gate transistor, and the peripheral transistor, and in which the first contact plug is buried in a first hole formed in a position of the first interlayer dielectric, which corresponds to the through hole.

3. A device according to claim 2, further comprising a first interconnection layer formed on the first interlayer dielectric, and second contact plugs buried in second holes formed in the first interlayer dielectric on a source region and drain region of the peripheral transistor, and electrically connecting the source region and the drain region to the first interconnection layer.

4. A device according to claim 3, wherein a width in a short-side direction of the first hole is the same as a width of the second hole, and a planar shape of the first hole is an ellipse.

5. A device according to claim 3, wherein the first contact plug and the second contact plug contain a refractory metal.

6. A device according to claim 3, further comprising a second interlayer dielectric formed on the first contact plug, the first interconnection layer, and the first interlayer dielectric, and a second interconnection layer formed on the second interlayer dielectric and electrically connected to at least a portion of the first interconnection layer.

7. A device according to claim 1, further comprising silicide layers formed on the second gate electrode of the memory transistor, on a source region and drain region of the memory transistor, on the second gate electrode of the select gate transistor, on a source region and drain region of the select gate transistor, on the gate electrode of the peripheral transistor, and on a source region and drain region of the peripheral transistor.

8. A device according to claim 1, further comprising sidewall spacers formed on sidewalls of the stacked gate structure of the memory transistor, on sidewalls of the stacked gate structure of the select gate transistor, on sidewalls of the gate electrode of the peripheral transistor, and on sidewalls of the through hole.

9. A semiconductor device comprising:
a memory transistor having a stacked gate structure formed by sequentially stacking a gate insulating film, a first gate electrode, a inter-poly insulating film, and a second gate electrode on a semiconductor substrate;
a select gate transistor which has a stacked gate structure identical to the memory transistor, and selects the memory transistor;
a first silicide layer formed on an upper surface of the second gate electrode, on sidewalls of a through hole, and on the first gate electrode positioned in a bottom portion of the through hole, and electrically connecting the second gate electrode and the first gate electrode, the through hole is formed in the second gate electrode and the inter-poly insulating film positioned on an element isolation film in the select gate transistor, and reaching the first gate electrode; and
a peripheral transistor which forms a peripheral circuit of a memory cell comprising the memory transistor and the select gate transistor, and includes a gate electrode with a single-layer structure.

10. A device according to claim 9, further comprising a first interlayer dielectric formed on the memory transistor, the select gate transistor, the peripheral transistor, and the first silicide layer in the through hole.

11. A device according to claim 10, further comprising a second interlayer dielectric formed on a first interconnection layer and the first interlayer dielectric, and a second interconnection formed on the second interlayer dielectric and electrically connected to at least a portions of the first interconnection layer.

12. A device according to claim 9, further comprising second silicide layers formed on the second gate electrode of the memory transistor, on a source region and drain region of the memory transistor, on a source region and drain region of the select gate transistor, on the gate electrode of the peripheral transistor, and on a source region and drain region of the peripheral transistor.

13. A device according to claim 9, further comprising sidewall spacers formed on sidewalls of the stacked gate structure of the memory transistor, on the stacked gate structure of the select gate transistor, and on sidewalls of the gate electrode of the peripheral transistor.

* * * * *